(12) United States Patent
Song et al.

(10) Patent No.: US 12,040,324 B2
(45) Date of Patent: Jul. 16, 2024

(54) SEMICONDUCTOR DEVICE WITH ACTIVE PATTERN INCLUDING A TRANSITION PATTERN AND METHOD FOR FABRICATING THE SAME

(71) Applicant: Samsung Electronics Co., Ltd., Suwon-si (KR)

(72) Inventors: Seong-Ho Song, Yongin-si (KR); Jong Han Lee, Yangsan-si (KR); Jong Ha Park, Suwon-si (KR); Jae Hyun Lee, Hwaseong-si (KR); Jong Hoon Baek, Ansan-si (KR); Da Bok Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 17/405,606

(22) Filed: Aug. 18, 2021

(65) Prior Publication Data
US 2022/0059530 A1    Feb. 24, 2022

(30) Foreign Application Priority Data
Aug. 19, 2020 (KR) .......................... 10-2020-0103693

(51) Int. Cl.
H01L 27/088 (2006.01)
H01L 21/8234 (2006.01)

(52) U.S. Cl.
CPC .... H01L 27/088 (2013.01); H01L 21/823412 (2013.01); H01L 21/823418 (2013.01);
(Continued)

(58) Field of Classification Search
CPC ........... H01L 27/088; H01L 21/823412; H01L 21/823418; H01L 21/823431;
(Continued)

(56) References Cited

U.S. PATENT DOCUMENTS 9,634,092 B2    4/2017    Bhuwalka et al.
10,269,790 B2   4/2019    Cheng et al.
(Continued)

FOREIGN PATENT DOCUMENTS

KR    101709395 B1    2/2017

OTHER PUBLICATIONS

Pavan Vora, Ronak Lad, "A Review Paper on Cmos, Soi and FinFET Technology", Mar. 30, 2019,(https://web.archive.org/web/20190330100442/https://www.design-reuse.com/articles/41330/cmos-soi-finfet-technology-review-paper.html). (Year: 2019).*

*Primary Examiner* — Benjamin P Sandvik
*Assistant Examiner* — John Patrick Cornely
(74) *Attorney, Agent, or Firm* — Harness, Dickey & Pierce, P.L.C.

(57) ABSTRACT

A semiconductor device including a substrate including first and second regions along a first direction, and a third region between the first region and the second region, an active pattern extending in the first direction, on the substrate, and first to third gate electrodes spaced apart from each other and extending in a second direction, on the active pattern, the active pattern of the first region including first semiconductor patterns spaced apart from each other and penetrating the first gate electrode, the active pattern of the second region including second semiconductor patterns spaced apart from each other and penetrating the second gate electrode, the active pattern of the third region including a transition pattern protruding from the substrate and intersecting the third gate electrode and including a sacrificial pattern and a third semiconductor pattern alternately stacked on the third region and including different materials from each other.

20 Claims, 47 Drawing Sheets

(52) U.S. Cl.
CPC ........... *H01L 21/823431* (2013.01); *H01L 21/823456* (2013.01); *H01L 27/0886* (2013.01)

(58) Field of Classification Search
CPC ......... H01L 21/823456; H01L 27/0886; H01L 29/42392; H01L 29/78696; H01L 21/823437; H01L 29/0673
See application file for complete search history.

(56) References Cited

U.S. PATENT DOCUMENTS

| | | |
|---|---|---|
| 10,304,964 B2 | 5/2019 | Liang et al. |
| 10,332,803 B1 | 6/2019 | Xie et al. |
| 10,332,881 B1 * | 6/2019 | Badaroglu .......... H01L 29/0649 |
| 10,431,663 B2 | 10/2019 | Xie et al. |
| 10,439,039 B2 | 10/2019 | Song et al. |
| 10,490,559 B1 | 11/2019 | Ando et al. |
| 10,707,331 B2 * | 7/2020 | Fung ................... H01L 29/7851 |
| 2020/0035563 A1 | 1/2020 | Zhang et al. |
| 2020/0066839 A1 | 2/2020 | Zhang et al. |
| 2020/0135849 A1 * | 4/2020 | Chiang ............. H01L 29/78696 |
| 2020/0295002 A1 * | 9/2020 | Snyder ............. H01L 29/78696 |

\* cited by examiner

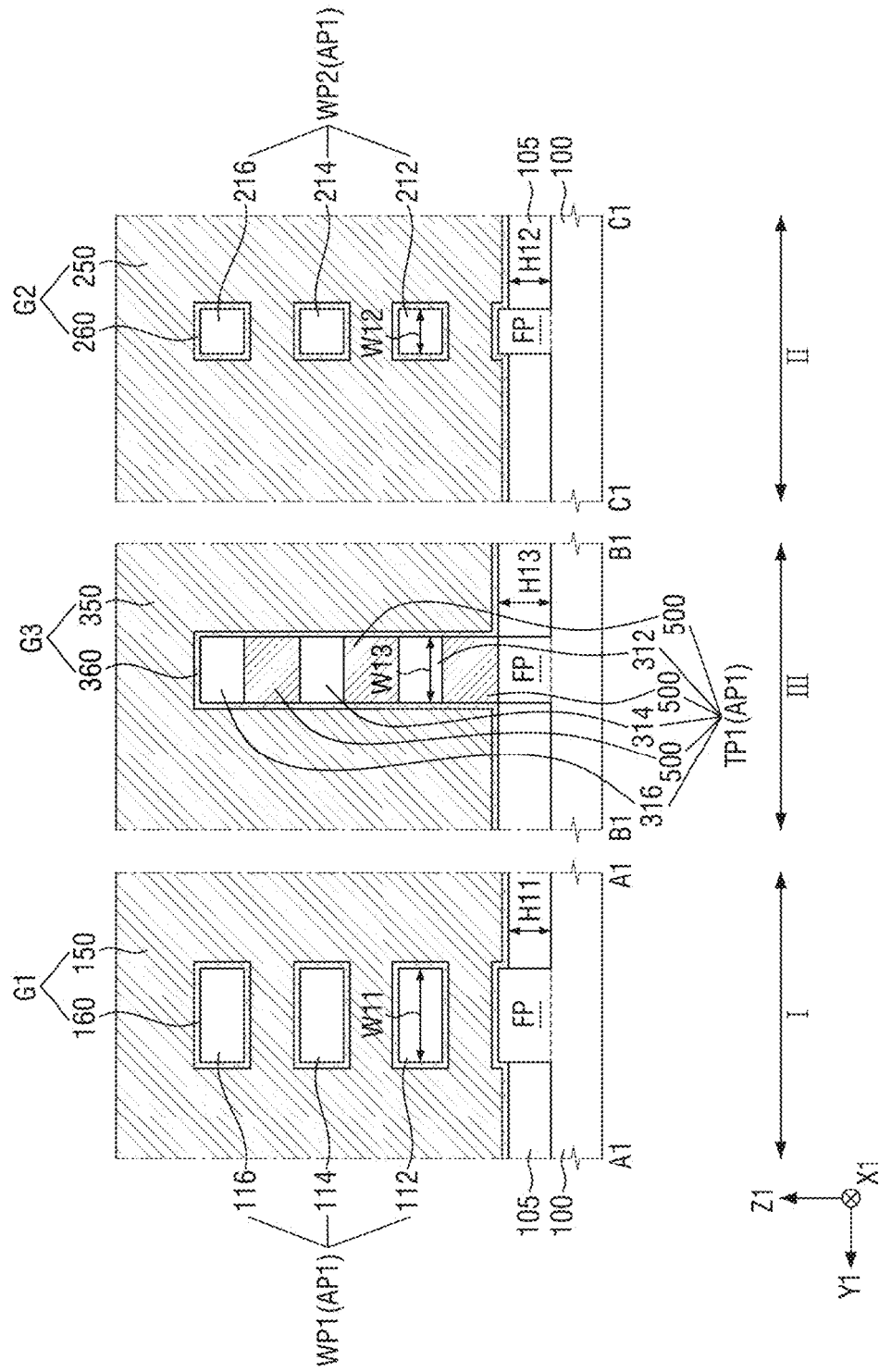

FIG. 39
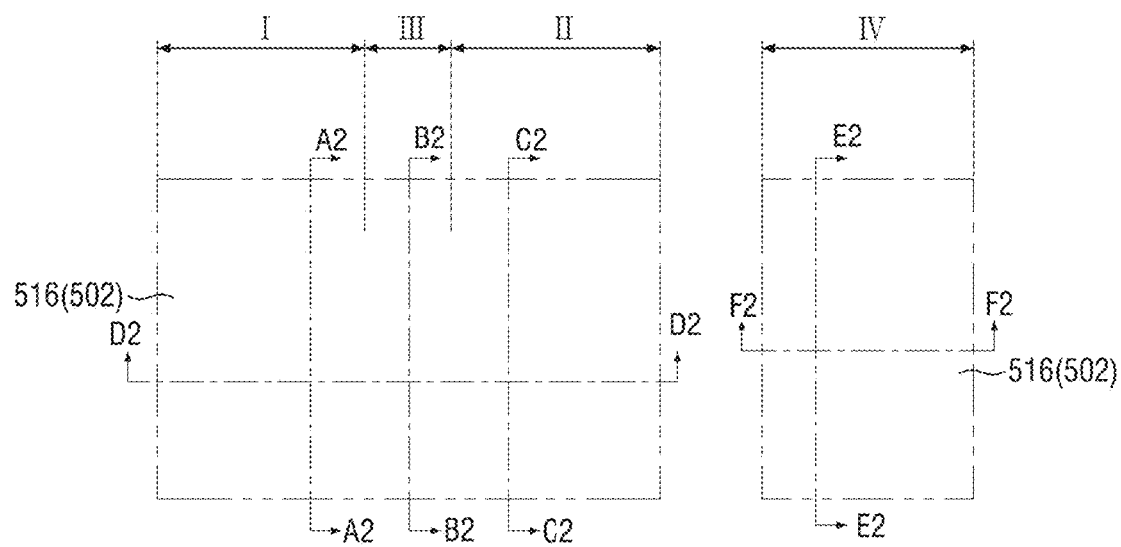
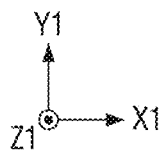
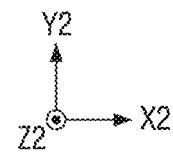

SEMICONDUCTOR DEVICE WITH ACTIVE PATTERN INCLUDING A TRANSITION PATTERN AND METHOD FOR FABRICATING THE SAME

CROSS-REFERENCE TO RELATED APPLICATION

This application claims priority to Korean Patent Application No. 10-2020-0103693, filed on Aug. 19, 2020, and all the benefits accruing therefrom under 35 U.S.C. § 119, the disclosure of which is incorporated herein by reference in its entirety.

BACKGROUND

The present inventive concepts relate to semiconductor devices and methods for fabricating the same. More specifically, the inventive concepts relates to semiconductor devices including wire patterns and methods for fabricating the same.

A proposed scaling technique for increasing a density of an integrated circuit device includes a multi-gate transistor in which a fin-type or nanowire-type silicon body is formed on a substrate and a gate is formed on a surface of the silicon body.

Because such a multi-gate transistor utilizes three-dimensional channels, it may be easily scaled. Further, even if a gate length of the multi-gate transistor is not increased, the current control capability may be improved. Furthermore, it is possible to effectively suppress an SCE (short channel effect) in which the potential of a channel region is influenced by a drain voltage.

SUMMARY

Aspects of the inventive concepts provide a semiconductor device which has improved performance, reliability, and yield by preventing defects of a source and drain region, and a method for fabricating the same.

Aspects of the inventive concepts also provide a semiconductor device which includes an active pattern in which a wire pattern and a fin-type pattern are mixed in a narrow region and has improved design diversity, and a method for fabricating the same.

However, aspects of the inventive concepts are not restricted to the one set forth herein. The above and other aspects of the inventive concepts will become more apparent to one of ordinary skill in the art to which the inventive concepts pertains by referencing the detailed explanation of the inventive concepts given below.

According to an aspect of the present disclosure, there is provided a semiconductor device comprising, a substrate including a first region and a second region arranged along a first direction, and a third region between the first region and the second region, an active pattern extending in the first direction, on the substrate and first to third gate electrodes spaced apart from each other and each extending in a second direction intersecting the first direction, on the active pattern, wherein the active pattern of the first region includes a plurality of first semiconductor patterns spaced apart from each other and penetrating the first gate electrode, the active pattern of the second region includes a plurality of second semiconductor patterns spaced apart from each other and penetrating the second gate electrode, the active pattern of the third region includes a transition pattern protruding from the substrate and intersecting the third gate electrode and the transition pattern includes a sacrificial pattern and a third semiconductor pattern alternately stacked on the third region and including different materials from each other.

According to another aspect of the present disclosure, there is provided a semiconductor device comprising, a substrate including a first region and a second region arranged along a first direction, and a third region between the first region and the second region, an active pattern extending in the first direction on the substrate and first to third gate structures spaced apart from each other and extending in a second direction intersecting the first direction, on the active pattern, wherein the active pattern of the first region includes a first wire pattern spaced apart from the substrate and penetrating the first gate structure, the active pattern of the second region includes a second wire pattern spaced apart from the substrate and penetrating the second gate structure, the active pattern of the third region includes a transition pattern including an inclined surface which forms an acute angle with side surfaces of the third gate structure and protrudes from the substrate and the third gate structure surrounds side surfaces and an upper surface of the transition pattern.

According to another aspect of the present disclosure, there is provided a semiconductor device comprising, a substrate including a first region and a second region arranged along a first direction, and a third region between the first region and the second region, a field insulating film covering a part of side surfaces of the first active pattern, on the substrate, and first to third gate electrodes spaced apart from each other and extend in a second direction intersecting the first direction, on the first active pattern and the field insulating film, wherein the first active pattern of the first region includes a first wire pattern spaced from the substrate, penetrating the first gate electrode, and having a first width in the second direction, the first active pattern of the second region includes a second wire pattern spaced apart from the substrate, penetrating the second gate electrode, and having a second width smaller than the first width in the second direction, the first active pattern of the third region includes a transition pattern protruding from the substrate, intersecting the third gate electrode, and having a third width smaller than the first width and greater than the second width in the second direction, the transition pattern includes a sacrificial pattern and a third wire pattern sequentially stacked on the third region and including different materials from each other, and a height of an upper surface of the field insulating film of the third region is greater than a height of an upper surface of the field insulating film of the first region and the second region.

According to another aspect of the present disclosure, there is provided a semiconductor device comprising, a substrate including a first region and a second region arranged along a first direction, and a third region between the first region and the second region, a first wire pattern spaced apart from the substrate and extending in the first direction, on the first region, a second wire pattern spaced apart from the substrate and extending in the first direction, on the second region, a transition pattern protruding from the substrate and extending in the first direction, on the third region, a first epitaxial pattern connecting side surfaces of the first wire pattern and side surfaces of the transition pattern, between the first wire pattern and the transition pattern; and a second epitaxial pattern connecting side surfaces of the second wire pattern and the side surfaces of the transition pattern, between the second wire pattern and the transition pattern.

BRIEF DESCRIPTION OF THE DRAWINGS

The above and other embodiments and features of the present disclosure will become more apparent by describing in detail embodiments thereof with reference to the attached drawings, in which:

FIGS. 4 and 5 are various cross-sectional views for explaining a semiconductor device according to some example embodiments.

FIGS. 39 to 46 are intermediate step diagrams for explaining a method for fabricating a semiconductor device according to some example embodiments.

DETAILED EXPLANATION OF THE EMBODIMENTS

Hereinafter, semiconductor devices according to some example embodiments will be explained referring to FIGS. 1 to 23.

Although terms such as first and second are used herein to describe various elements or components, it goes without saying that these elements or components are not limited by these terms. These terms are used to merely distinguish a single element or component from other elements or components. Therefore, it goes without saying that a first element or component explained below may be a second element or component within the technical idea of the inventive concepts.

Figure 1:
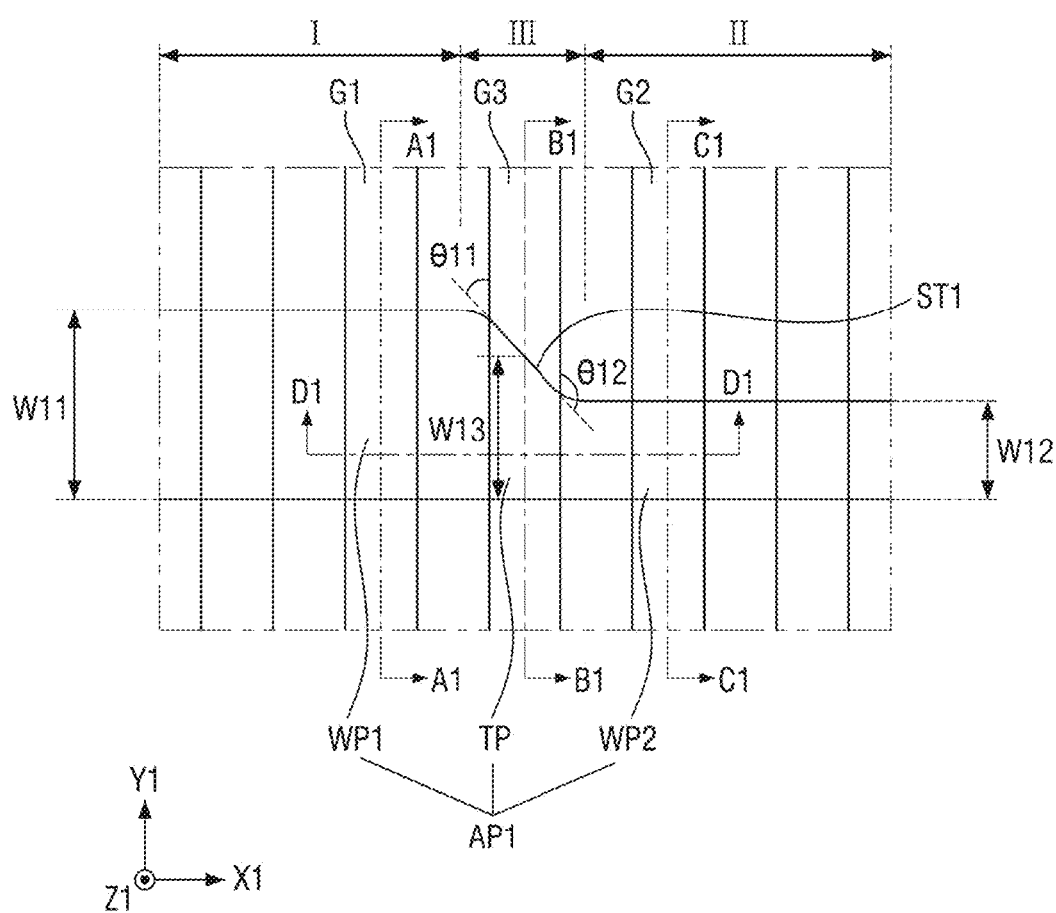
FIG. 1 is a layout view for explaining a semiconductor device according to some example embodiments.
Figure 2:
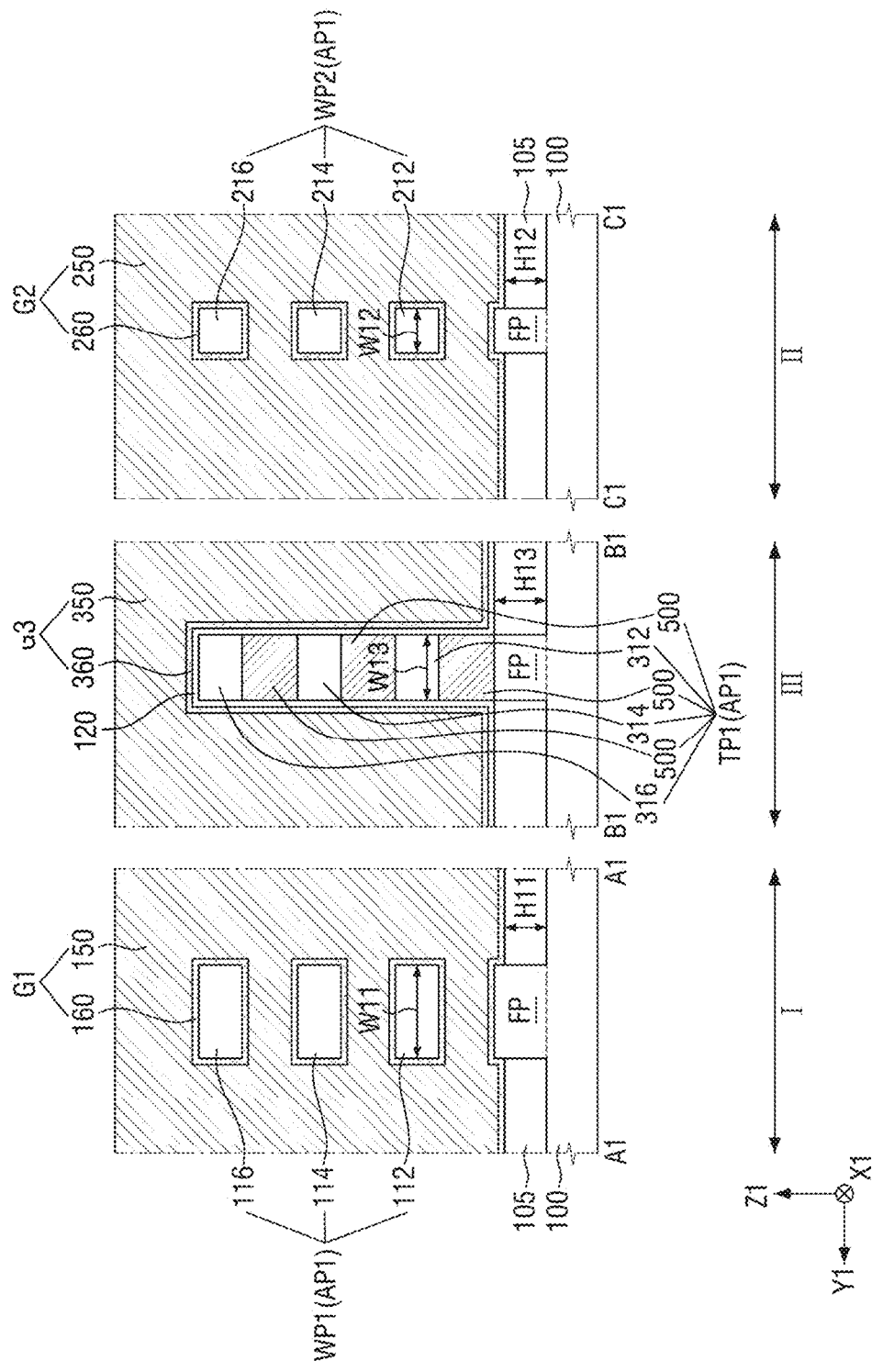
FIG. 2 is a cross-sectional view taken along A1-A1, B1-B1 and C1-C1 of FIG. 1.
Figure 3A:
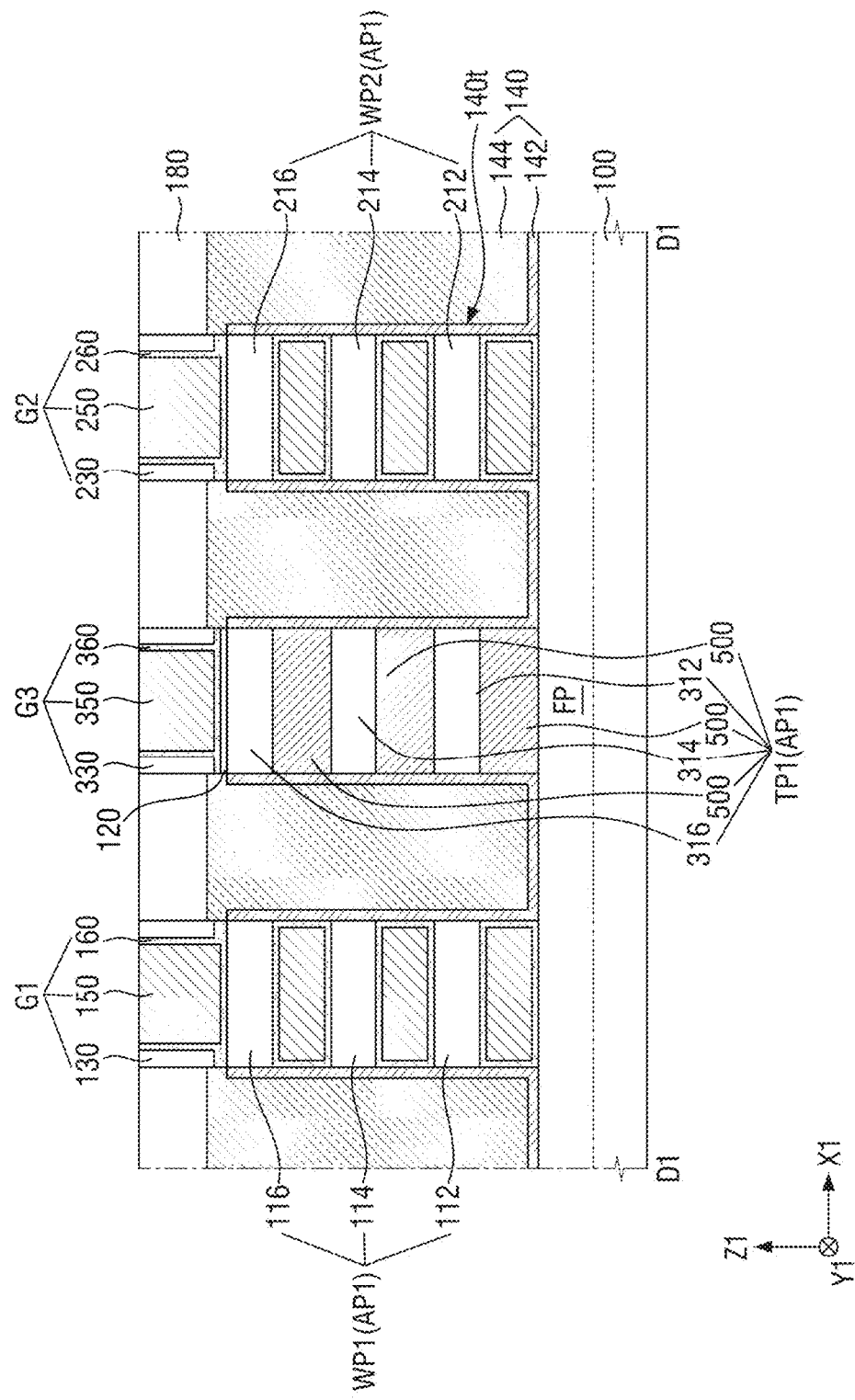
FIGS. 3A and 3B are various cross-sectional views taken along D1-D1 of FIG. 1.
Figure 3B:
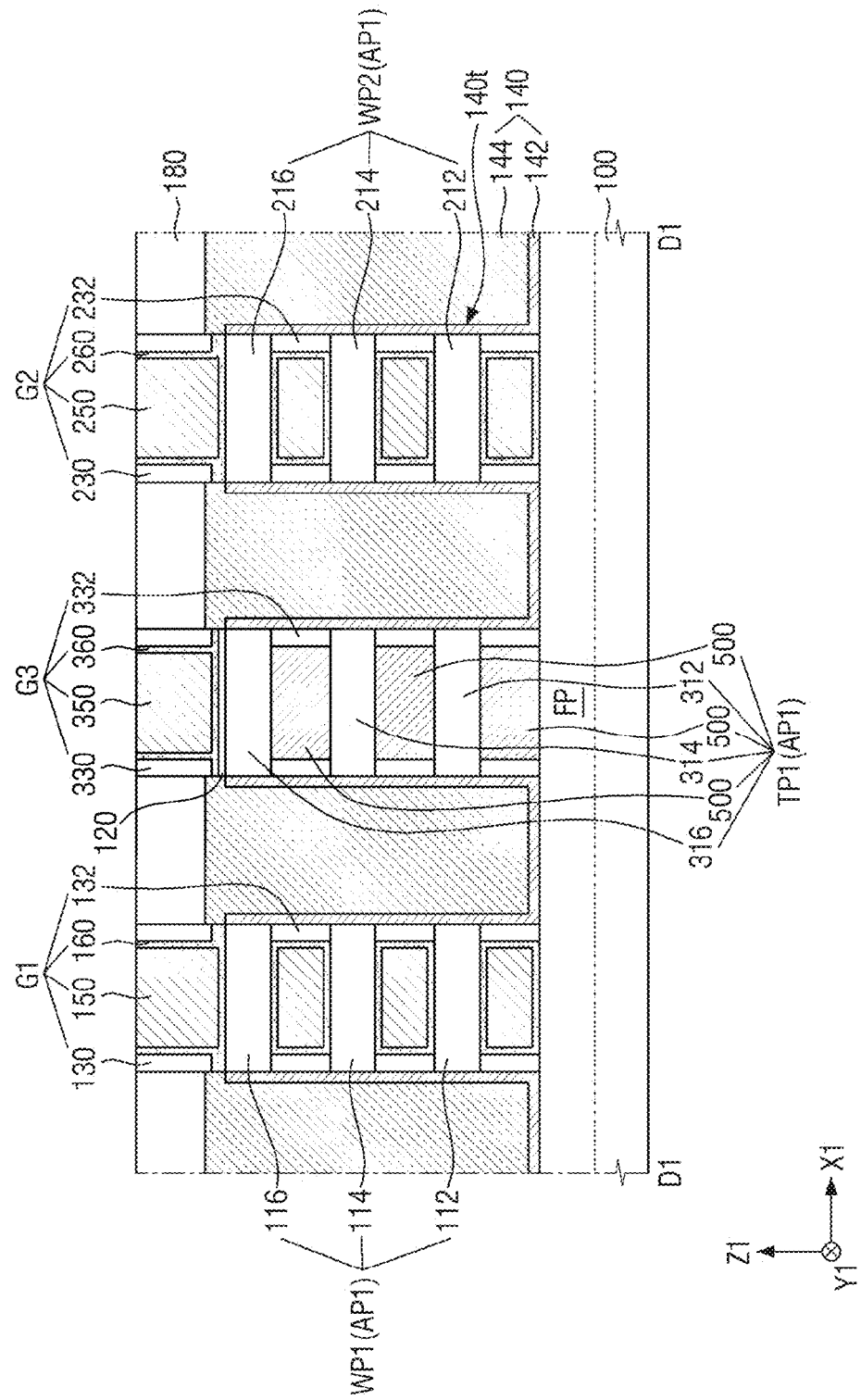

FIG. 1 is a layout view for explaining a semiconductor device according to some example embodiments. FIG. 2 is a cross-sectional view taken along A1-A1, B1-B1 and C1-C1 of FIG. 1. FIGS. 3A and 3B are various cross-sectional views taken along D1-D1 of FIG. 1.

Referring to FIGS. 1 to 3A, the semiconductor device according to some example embodiments includes a substrate 100, a field insulating film 105, a first active pattern AP1, first to third gate structures G1, G2 and G3, a first epitaxial pattern 140 and an interlayer insulating film 180.

The substrate 100 may be bulk silicon or SOI (silicon-on-insulator). In some example embodiments, the substrate 100 may be a silicon substrate or may include other materials, for example, silicon germanium, SGOI (silicon germanium on insulator), indium antimonide, lead tellurium compounds, indium arsenide, indium phosphide, gallium arsenide and/or gallium antimonide. In some example embodiments, the substrate 100 may have an epitaxial layer formed on a base substrate. For convenience of explanation, the substrate 100 will be explained as a silicon substrate below.

The substrate 100 may include first to third regions I, II and III. The first region I and the second region II may be arranged along a first direction X1 parallel to an upper surface of the substrate 100. The third region III may be interposed between the first region I and the second region II. In some example embodiments, the first to third regions I, II and III may be regions that are adjacent to each other.

The first active pattern AP1 may be formed on the substrate 100. The first active pattern AP1 may extend in the first direction X1 over the first to third regions I, II and III. The first active pattern AP1 may intersect first to third gate structures G1, G2 and G3 to be explained below. In some example embodiments, the first active pattern AP1 of the third region III may connect the first active pattern AP1 of the first region I and the first active pattern AP1 of the second region II. For example, a fin-type protrusion FP of the third region III may connect the fin-type protrusion FP of the first region I and the fin-type protrusion FP of the second region II.

The first active pattern AP1 may include silicon (Si) and/or germanium (Ge), which are elemental semiconductor materials. In some example embodiments, the first active pattern AP1 may also include compound semiconductors, for example, a group compound IV-IV semiconductor and/or a group III-V compound semiconductor.

The group IV-IV compound semiconductor may be, for example, a binary compound or a ternary compound including at least two or more of carbon (C), silicon (Si), germanium (Ge), and tin (Sn), and/or a compound obtained by doping these elements with a group IV element.

The group III-V compound semiconductor may be, for example, one of a binary compound, a ternary compound and/or a quaternary compound formed by combining at least one of aluminum (Al), gallium (Ga) and indium (In) as a group III element, and at least one of phosphorus (P), arsenic (As) and antimony (Sb) as a group V element.

In some example embodiments, the first active pattern AP1 may include a fin-type protrusion FP. The fin-type protrusion FP may protrude from the upper surface of the substrate 100 and extend in the first direction X1. The fin-type protrusion FP may be formed by etching a part of the substrate 100, or may be an epitaxial layer that is grown from the substrate 100.

The field insulating film 105 may be formed on the substrate 100. The field insulating film 105 may cover a part of the side surfaces of the first active pattern AP1. For example, the field insulating film 105 may cover at least a part of the side surfaces of the fin-type protrusion FP. That is, the fin-type protrusion FP may be defined by the field insulating film 105. Additionally, the fin-type protrusion FP may have a top and/or bottom surface that is coplanar with a respective top or bottom surface of the field insulating film 105.

The field insulating film 105 may include, but is not limited to, for example, at least one of an oxide film, a nitride film, an oxynitride film, and a combination thereof.

The first to third gate structures G1, G2 and G3 may be formed on the first active pattern AP1 and the field insulating film 105. The first to third gate structures G1, G2 and G3 may be spaced apart from each other and intersect the first active pattern AP1. For example, each of the first to third gate structures G1, G2 and G3 may extend in a second direction Y1 which is parallel to the upper surface of the substrate 100 and intersects the first direction X1. In some example embodiments, the first gate structure G1 may be placed on the first region I, the second gate structure G2 may be placed on the second region II, and the third gate structure G3 may be placed on the third region III.

In some example embodiments, the first and second gate structures G1 and G2 may be active gate structures, and the third gate structure G3 may be a dummy gate structure. However, the inventive concepts are not limited thereto, and all the first to third gate structures G1, G2 and G3 may be the active gate structures.

The first to third gate structures G1, G2 and G3 may include first to third gate electrodes 150, 250 and 350, the first to third gate dielectric films 160, 260 and 360, and first to third gate spacers 130, 230 and 330, respectively.

The first to third gate electrodes 150, 250 and 350 may be spaced apart from each other and intersect the first active pattern AP1 on the first active pattern AP1. For example, the first to third gate electrodes 150, 250 and 350 may each extend in the second direction Y1.

The first to third gate electrodes 150, 250 and 350 may include, for example, but is not limited to, at least one of TiN, WN, TaN, Ru, TiC, TaC, Ti, Ag, Al, TiAl, TiAlN, TiAlC, TaCN, TaSiN, Mn, Zr, W, Al and combinations thereof. The first to third gate electrodes 150, 250 and 350 may be formed, for example, through, but are not limited to, a replacement process.

Although each of the first to third gate electrodes 150, 250 and 350 is only shown as a single film, this is merely an example, and each of the first to third gate electrodes 150, 250 and 350 may, of course, be formed by stacking a plurality of conductive materials. For example, each of the first to third gate electrodes 150, 250 and 350 may include a work function adjusting film that regulates the work function, and a filling conductive film that fills a space formed by the work function adjusting film. The work function adjusting film may include, for example, at least one of TiN, TaN, TiC, TaC, TiAlC and a combination thereof. The filling conductive film may include, for example, W or Al.

The first to third gate dielectric films 160, 260 and 360 may be interposed between the first active pattern AP1 and the first to third gate electrodes 150, 250 and 350, respectively. For example, the first gate dielectric film 160 may be interposed between the first active pattern AP1 and the first gate electrode 150, the second gate dielectric film 260 may be interposed between the first active pattern AP1 and the second gate electrode 250, and the third gate dielectric film 360 may be interposed between the first active pattern AP1 and the third gate electrode 350. The first to third gate dielectric films 160, 260 and 360 may extend along the upper surface of the field insulating film 105 and the upper surface of the fin-type protrusion FP.

The first to third gate dielectric films 160, 260 and 360 may include, for example, at least one of silicon oxide, silicon oxynitride, silicon nitride, and/or a high dielectric constant material having a higher dielectric constant than silicon oxide. The high dielectric constant material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

Although not shown, an interfacial film may also be formed between the first active pattern AP1 and the first to third gate dielectric films 160, 260 and 360. The interfacial film may include, for example, but is not limited to, an oxide.

The first to third gate spacers 130, 230 and 330 may be formed on the substrate 100 and the field insulating film 105. The first to third gate spacers 130, 230 and 330 may extend along the side surfaces of the first to third gate electrodes 150, 250 and 350, respectively. For example, the first gate spacer 130 may extend along the side surfaces of the first gate electrode 150, the second gate spacer 230 may extend along the side surfaces of the second gate electrode 250, and the third gate spacer 330 may extend along the side surfaces of the first gate electrode 150.

In some example embodiments, the first to third gate dielectric films 160, 260 and 360 may extend along the inner surfaces of the first to third gate spacers 130, 230 and 330. For example, the first gate dielectric film 160 may be interposed between the first gate electrode 150 and the first gate spacer 130, the second gate dielectric film 260 may be interposed between the second gate electrode 250 and the second gate spacer 230, and the third gate dielectric film 360 may be interposed between the third gate electrode 350 and the third gate spacer 330.

The first to third gate spacers 130, 230 and 330 may include, for example, but is not limited to, at least one of silicon nitride, silicon oxynitride, silicon oxycarbide, silicon boronitride, silicon carbonitride boron, silicon oxycarbonitride or a combination thereof.

The first epitaxial pattern 140 may be formed in the first active pattern AP1. Further, the first epitaxial pattern 140 may be formed on the side surfaces of each of the first to third gate structures G1, G2 and G3. In some example embodiments, the first epitaxial pattern 140 may be interposed between the first to third gate structures G1, G2 and G3. The first epitaxial pattern 140 may be electrically spaced apart from the first to third gate electrodes 150, 250 and 350 by the first to third gate spacers 130, 230 and 330. The first epitaxial pattern 140 may be used as the source/drain regions of the transistors including the first to third gate structures G1, G2 and G3.

In some example embodiments, a first source/drain trench 140t may be formed in the first active pattern AP1 on the side surfaces of each of the first to third gate structures G1, G2 and G3. The first epitaxial pattern 140 may be formed in the first source/drain trench 140t.

The first epitaxial pattern 140 may include an epitaxial layer formed on the substrate 100. For example, the first epitaxial pattern 140 may be formed by an epitaxial growth method. Although not shown, the cross section of the first epitaxial pattern 140 intersecting the first direction X1 may have a diamond shape (or a pentagonal or hexagonal shape). However, the inventive concepts are not limited thereto, and the cross section of the first epitaxial pattern 140 may, of course, have various other shapes.

In some example embodiments, the first epitaxial pattern 140 may be an elevated source/drain region. For example, as shown in FIG. 3A, the uppermost part of the first epitaxial pattern 140 may protrude upward from the uppermost face of the first active pattern AP1.

In some example embodiments, the first epitaxial pattern 140 may include a first epitaxial layer 142 and a second epitaxial layer 144 stacked sequentially on the substrate 100. The first epitaxial layer 142 may extend, for example, along a profile of the first source/drain trench 140t. The second epitaxial layer 144 may be formed to fill the first source/drain trench 140t. The first epitaxial layer 142 may function as a seed layer for growing the second epitaxial layer 144. Further, the first epitaxial layer 142 may prevent the second epitaxial layer 144 from being damaged in the process of forming first semiconductor patterns 112, 114 and 116 and second semiconductor patterns 212, 214 and 216 to be explained later. This will be explained more specifically in the explanation of FIGS. 24 to 38.

When the semiconductor device formed on the first to third regions I, II and III is a PMOS transistor, the first epitaxial pattern 140 may include p-type impurities or impurities for preventing diffusion of the p-type impurities. For example, the first epitaxial pattern 140 may include at least one of B, C, In, Ga, Al and combinations thereof.

Further, when the semiconductor device according to some example embodiments is a PMOS transistor, the first epitaxial pattern 140 may include a compressive stress material. For example, when the first active pattern AP1 is silicon (Si), the first epitaxial pattern 140 may include a material having a lattice constant greater than silicon (Si). For example, the first epitaxial pattern 140 may include silicon germanium (SiGe). The compressive stress material may apply a compressive stress to the first active pattern AP1 to improve the mobility of carriers of the channel region.

In contrast, when the semiconductor device formed on the first to third regions I, II and III is an NMOS transistor, the first epitaxial pattern 140 may include n-type impurities or impurities for preventing diffusion of the n-type impurities. For example, the first epitaxial pattern 140 may include at least one of P, Sb, As, and combinations thereof.

Further, when the semiconductor device according to some example embodiments is an NMOS transistor, the first epitaxial pattern 140 may include a tensile stress material. For example, when the first active pattern AP1 is silicon (Si), the first epitaxial pattern 140 may include a material having a lattice constant smaller than silicon (Si), for example, SiC. The tensile stress material may apply a tensile stress to the first active pattern AP1 to improve mobility of carriers of the channel region.

In some example embodiments, the first to third regions I, II and III may be PMOS regions. For example, the first epitaxial pattern 140 may include p-type impurities.

In some example embodiments, the first epitaxial layer 142 and the second epitaxial layer 144 may include different concentrations of semiconductor material. For example, when the semiconductor device according to some example embodiments is a PMOS transistor, the second epitaxial layer 144 may include silicon germanium (SiGe). At this time, the concentration of germanium (Ge) of the first epitaxial layer 142 may be lower than the concentration of germanium (Ge) of the second epitaxial layer 144.

The interlayer insulating film 180 may be formed on the substrate 100 and the field insulating film 105. The interlayer insulating film 180 may be formed to fill the space on the first to third gate structures G1, G2 and G3 and the first epitaxial pattern 140.

The interlayer insulating film 180 may include, for example, at least one of silicon oxide, silicon nitride, silicon oxynitride and/or a low dielectric constant material. The low dielectric constant materials may include, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Airgel, Amorphous Fluorinated Carbon, OSG (Organo Silicate Glass), Parylene, BCB (bis-benzocyclobutenes), SiLK, polyimide, porous polymeric material and combinations thereof.

The first active pattern AP1 may include a first wire pattern WP1 placed in the first region I, a second wire pattern WP2 placed in the second region II, and a transition pattern TP1 placed in the third region III.

The first wire pattern WP1 may include a plurality of first semiconductor patterns 112, 114 and 116. The first semiconductor patterns 112, 114 and 116 may be sequentially placed on the substrate 100 of the first region I. For example, the first semiconductor patterns 112, 114 and 116 may be sequentially arranged along a third direction Z1 that intersects the upper surface of the substrate 100 in the first region I. The first semiconductor patterns 112, 114 and 116 may be spaced apart from the substrate 100 or the fin-type protrusion FP. Further, the first semiconductor patterns 112, 114 and 116 may be spaced apart from each other and extend in the first direction X1, respectively.

Each of the first semiconductor patterns 112, 114 and 116 may penetrate the first gate structure G1. Therefore, as shown in FIG. 2, the first gate structure G1 may be formed to surround the periphery of the first semiconductor patterns 112, 114 and 116. The first semiconductor patterns 112, 114 and 116 may be used as the channel region of the transistor including the first gate structure G1.

In some example embodiments, a part of the first gate dielectric film 160 may be interposed between the first semiconductor patterns 112, 114 and 116 and the first gate spacer 130.

The second wire pattern WP2 may include a plurality of second semiconductor patterns 212, 214 and 216. The second semiconductor patterns 212, 214 and 216 may be sequentially placed on the substrate 100 of the second region II. For example, the second semiconductor patterns 212, 214 and 216 may be sequentially arranged in the second region II along the third direction Z1. The second semiconductor patterns 212, 214 and 216 may be spaced apart from the substrate 100 or the fin-type protrusion FP. Also, the second semiconductor patterns 212, 214 and 216 may be spaced apart from each other and extend in the first direction X1, respectively.

The second semiconductor patterns 212, 214 and 216 may each penetrate the second gate structure G2. As a result, as shown in FIG. 2, the second gate structure G2 may be formed to surround the periphery of the second semiconductor patterns 212, 214 and 216. The second semiconductor patterns 212, 214 and 216 may be used as a channel region of the transistor including the second gate structure G2.

In some example embodiments, the first wire pattern WP1 and the second wire pattern WP2 may be placed at the same level. As used herein, the expression "placed at the same level" means that the wire patterns are placed at the same height from the upper surface of the substrate 100. For example, the first semiconductor patterns 112, 114 and 116 and the second semiconductor patterns 212, 214 and 216 may overlap each other in the first direction X1.

In some example embodiments, a first width W11 of the first wire pattern WP1 may be greater than a second width W12 of the second wire pattern WP2. Here, the width of the semiconductor pattern means the width in the second direction Y1. As an example, the first width W11 may be about 25 nm to about 45 nm, for example, about 25 nm or 45 nm, and the second width W12 may be about 10 nm to about 25 nm, for example, about 10 nm or 25 nm.

In some example embodiments, a part of the second gate dielectric film 260 may be interposed between the second semiconductor patterns 212, 214 and 216 and the second gate spacer 230.

In FIGS. 2 and 3A, although each of the first wire pattern WP1 and the second wire pattern WP2 is shown as including only three semiconductor patterns, this is merely an example, and the number of semiconductor patterns may, of course, be various.

The transition pattern TP1 may be placed on the substrate 100 of the third region III. The transition pattern TP1 may be interposed between the first wire pattern WP1 and the second wire pattern WP2. The transition pattern TP1 may protrude from the upper surface of the substrate 100 and extend in the first direction X1.

The transition pattern TP1 may intersect the third gate structure G3. The transition pattern TP1 may have a fin-type pattern shape as a whole. In some example embodiments, the third gate structure G3 may surround the three faces of the transition pattern TP1. For example, as shown in FIG. 2, the third gate structure G3 may cover both side surfaces and the upper surface of the transition pattern TP1.

The height of the upper surface of the transition pattern TP1 may be equal to or higher than the height of the upper surface of the first semiconductor patterns 112, 114 and 116 and the height of the upper surface of the second semiconductor patterns 212, 214 and 216. In some example embodiments, the upper surface of the transition pattern TP1 may be placed on the same plane as the upper surface of the first wire pattern 116 of the uppermost part of the first wire pattern WP1 and the upper surface of the second wire pattern 216 of the uppermost part of the second wire pattern WP2. As used herein, the meaning of the term "same" includes not only the exact same thing, but also minute differences that may occur due to process margins and the like.

In some example embodiments, the transition pattern TP1 and the first wire pattern WP1 may share the first epitaxial pattern 140. For example, as shown in FIG. 3A, the first epitaxial pattern 140 between the first gate structure G1 and the third gate structure G3 may connect the transition pattern TP1 and the first semiconductor patterns 112, 114 and 116.

In some example embodiments, the transition pattern TP1 and the second wire pattern WP2 may share the first epitaxial pattern 140. For example, as shown in FIG. 3A, the first epitaxial pattern 140 between the second gate structure G2 and the third gate structure G3 may connect the transition pattern TP1 and the second semiconductor patterns 212, 214 and 216.

In some example embodiments, the transition pattern TP1 may include a first inclined surface ST1 having an inclination with the side surfaces of the third gate structure G3 from a planar viewpoint. For example, as shown in FIG. 1, the first inclined surface ST1 may extend in a direction different from the first direction X1 and the second direction Y1. As an example, the first inclined surface ST1 of the transition pattern TP1 may form a first angle θ11 which is an acute angle with one side face of the third gate structure G3. Also, the first inclined surface ST1 of the transition pattern TP1 may form a second angle θ12 which is an obtuse angle with the other side face of the third gate structure G3.

Although the sum of the first angle θ11 and each of the second angle θ12 may be 180° or about 180°, this is merely an example. For example, the sum of the first angle θ11 and the second angle θ12 may, of course, be greater than or smaller than 180°, depending on the position at which the third gate structure G3 is placed, due to a misalignment or the like.

In some example embodiments, the third width W13 of the transition pattern TP1 may be smaller than the first width W11 of the first wire pattern WP1, and may be greater than the second width W12 of the second wire pattern WP2. Here, the width of the transition pattern TP1 means the width in the second direction Y1. In some example embodiments, the third width W13 of the transition pattern TP1 may gradually decrease from the first wire pattern WP1 to the second wire pattern WP2.

In some example embodiments, the transition pattern TP1 may include sacrificial patterns 500 and third semiconductor patterns 312, 314 and 316 alternately stacked on the third region III.

The third semiconductor patterns 312, 314 and 316 may be sequentially placed on the substrate 100 of the third region III. For example, the third semiconductor patterns 312, 314 and 316 may be sequentially arranged along the third direction Z1 in the third region III. The third semiconductor patterns 312, 314 and 316 may be spaced apart from the substrate 100 or the fin-type protrusion FP. Further, the third semiconductor patterns 312, 314 and 316 may be spaced apart from each other and extend in the first direction X1, respectively.

In some example embodiments, the third semiconductor patterns 312, 314 and 316 may be placed at the same level as the first semiconductor patterns 112, 114 and 116 and the second semiconductor patterns 212, 214 and 216. For example, the third semiconductor patterns 312, 314 and 316 may overlap the first semiconductor patterns 112, 114 and 116 and the second semiconductor patterns 212, 214 and 216 in the first direction X1.

Sacrificial patterns 500 may be interposed between the third semiconductor patterns 312, 314 and 316. For example, the sacrificial patterns 500 may be interposed between two third semiconductor patterns (e.g., 312 and 314, or 314 and 316), respectively. In some example embodiments, some of the sacrificial patterns 500 may also be interposed between the fin-type protrusion FP and the third semiconductor patterns 312, 314 and 316.

In some example embodiments, the sacrificial patterns 500 and the third semiconductor patterns 312, 314 and 316 may have the same width as each other in the second direction Y1. For example, the sacrificial patterns 500 and the third semiconductor patterns 312, 314 and 316 may each have a third width W13.

The sacrificial patterns 500 and the third semiconductor patterns 312, 314 and 316 may include materials different from each other. For example, the third semiconductor patterns 312, 314 and 316 may include a first semiconductor material, and the sacrificial patterns 500 may include a second semiconductor material different from the first semiconductor material. In some example embodiments, the first semiconductor material may include silicon (Si), and the second semiconductor material may include silicon germanium (SiGe). Accordingly, the sacrificial patterns 500 may have an etching selectivity for the third semiconductor patterns 312, 314 and 316.

In some example embodiments, the first semiconductor patterns 112, 114 and 116, the second semiconductor patterns 212, 214 and 216, and the third semiconductor patterns 312, 314 and 316 may be formed at the same level. As used herein, the expression "formed at the same level" means that the semiconductor patterns are formed by the same fabricating process. For example, the first semiconductor patterns 112, 114 and 116, the second semiconductor patterns 212, 214 and 216, and the third semiconductor patterns 312, 314 and 316 may all include the first semiconductor material.

In some example embodiments, a part of the third gate dielectric film 360 may be interposed between the transition pattern TP1 and the third gate spacer 330.

In some example embodiments, a first protective film 120 may be formed on the third region III. The first protective film 120 may be interposed between the transition pattern TP1 and the third gate structure G3. The first protective film 120 may extend along both side surfaces and the upper surface of the transition pattern TP1 in a conformal manner. For example, the first protective film 120 may extend along the upper surface of the field insulating film 105, the side surfaces of the sacrificial patterns 500, and the side surfaces and upper surfaces of the third semiconductor patterns 312, 314 and 316 in a conformal manner.

The first protective film 120 may not be formed on the first region I and the second region II. For example, the first protective film 120 may not be interposed between the first wire pattern WP1 and the first gate structure G1, and may not be interposed between the second wire pattern WP2 and the second gate structure G2.

The first protective film 120 may include, for example, but is not limited to, at least one of silicon oxide, silicon oxynitride, silicon nitride, or a high dielectric constant material having a higher dielectric constant than silicon oxide.

In some example embodiments, a part of the third gate dielectric film 360 may be interposed between the first protective film 120 and the third gate spacer 330.

In some example embodiments, the height of the field insulating film 105 may be higher in the third region III than in the first region I and the second region II. For example, a height H13 of the upper surface of the field insulating film 105 of the third region III may be higher than a height H11 of the upper surface of the field insulating film 105 of the first region I and a height H12 of the upper surface of the field insulating film 105 of the second region II, on the basis of the upper surface of the substrate 100. Although not shown, the field insulating film 105 may have a step between the first gate structure G1 and the third gate structure G3, and between the second gate structure G2 and the third gate structure G3.

Although the height H11 of the upper surface of the field insulating film 105 of the first region I is shown as only being the same as the height H12 of the upper surface of the field insulating film 105 of the second region II, this is merely an example. The height H11 of the upper surface of the field insulating film 105 of the first region I may, of course, be different from the height H12 of the upper surface of the field insulating film 105 of the second region II.

Referring to FIGS. 1, 2 and 3B, in the semiconductor device according to some example embodiments, each of the first to third gate structures G1, G2 and G3 further includes first to third internal spacers 132, 232 and 332.

A first internal spacer 132 may be formed on the side surfaces of the first gate electrode 150. The first internal spacer 132 may be interposed between the first gate electrode 150 and the first epitaxial pattern 140. Further, the first internal spacer 132 may be interposed between the first semiconductor patterns 112, 114 and 116 penetrating the first gate electrode 150.

A second internal spacer 232 may be formed on the side surfaces of the second gate electrode 250. The second internal spacer 232 may be interposed between the second gate electrode 250 and the first epitaxial pattern 140. Further, the second internal spacer 232 may be interposed between the second semiconductor patterns 212, 214 and 216 penetrating the second gate electrode 250.

A third internal spacer 332 may be formed on the side surfaces of the sacrificial patterns 500. The third internal spacer 332 may be interposed between the sacrificial patterns 500 and the first epitaxial pattern 140. Also, the third internal spacer 332 may be interposed between the third semiconductor patterns 312, 314 and 316.

Although the thicknesses of the first to third internal spacers 132, 232 and 332 are shown as only being the same as the thicknesses of the first to third gate spacers 130, 230 and 330, this is merely an example. For example, the thicknesses of the first to third internal spacers 132, 232 and 332 may, of course, be greater or smaller than the thicknesses of the first to third gate spacers 130, 230 and 330, respectively.

The first to third internal spacers 132, 232 and 332 may include, for example, but are not limited to, at least one of silicon nitride, silicon oxynitride, silicon oxycarbide, silicon boronitride, silicon carbonitride boron, silicon oxycarbonitride, and combinations thereof. The first to third internal spacers 132, 232 and 332 may include the same material as or different materials from the first to third gate spacers 130, 230 and 330.

Figure 5:
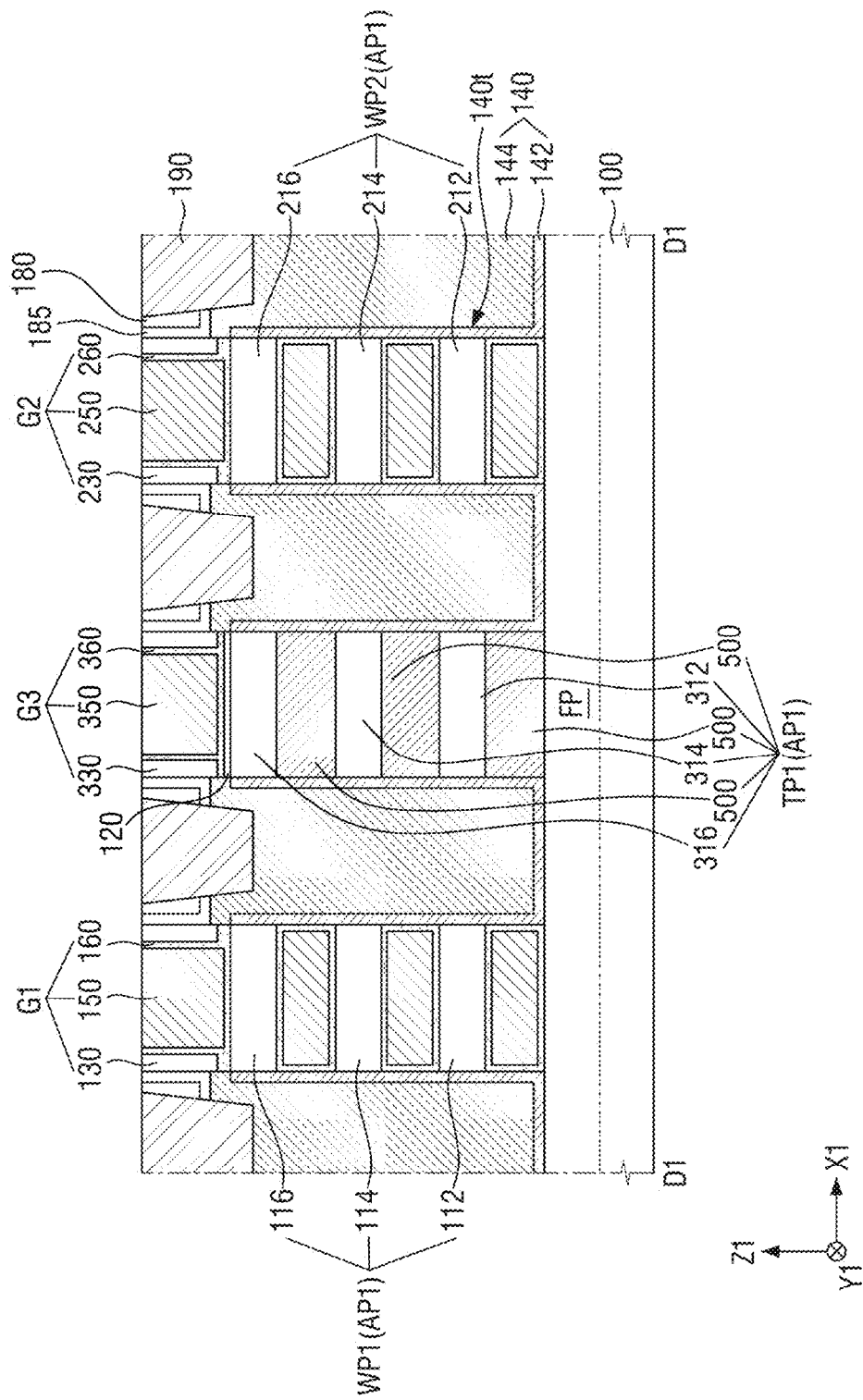

In some example embodiments, the first to third regions I, II and III may be NMOS regions. For example, the first epitaxial pattern 140 may include n-type impurities. FIGS. 4 and 5 are various cross-sectional views for explaining a semiconductor device according to some example embodiments. For convenience of explanation, repeated parts of contents explained above using FIGS. 1 to 3B will be briefly explained or omitted. For reference, FIG. 4 is another cross-sectional view taken along A1-A1, B1-B1 and C1-C1 of FIG. 1, and FIG. 5 is another cross-sectional view taken along D1-D1 of FIG. 1.

Referring to FIGS. 1 and 4, the semiconductor device according to some example embodiments does not include the first protective film 120.

For example, the first protective film 120 may not be interposed between the transition pattern TP1 and the third gate structure G3.

Referring to FIGS. 1 and 5, the semiconductor device according to some example embodiments further include a source/drain contact 190.

The source/drain contact 190 may be formed to be electrically connected to the first epitaxial pattern 140. For example, the source/drain contact 190 may penetrate the interlayer insulating film 180, and be connected to the first epitaxial pattern 140. The source/drain contacts 190 may include, but is not limited to, for example, tungsten (W), aluminum (Al), copper (Cu) and/or the like.

Although the source/drain contact 190 is shown only as a single film, this is merely an example, and the source/drain contact 190 may, of course, be formed by a stack of plurality of conductive materials. For example, the source/drain contact 190 may include a silicide film being in contact with the first epitaxial pattern 140, and a penetrating conductive film formed on the silicide film and penetrating the interlayer insulating film 180. The silicide film may include, for example, platinum (Pt), nickel (Ni), cobalt (Co), and/or the like. The penetrating conductive film may include, for example, titanium (Ti), titanium nitride (TiN), tungsten (W), aluminum (Al), copper (Cu) and/or the like.

In some example embodiments, an etching blocking film 185, which extends along the side surfaces of the first to third gate spacers 130, 230 and 330 and an outer peripheral face (e.g., an upper surface) of the first epitaxial pattern 140, may be further formed. The source/drain contact 190 may penetrate the interlayer insulating film 180 and the etching blocking film 185, and be connected to the first epitaxial pattern 140. The etching blocking film 185 may include, for example, but is not limited to, silicon nitride.

Figure 6:
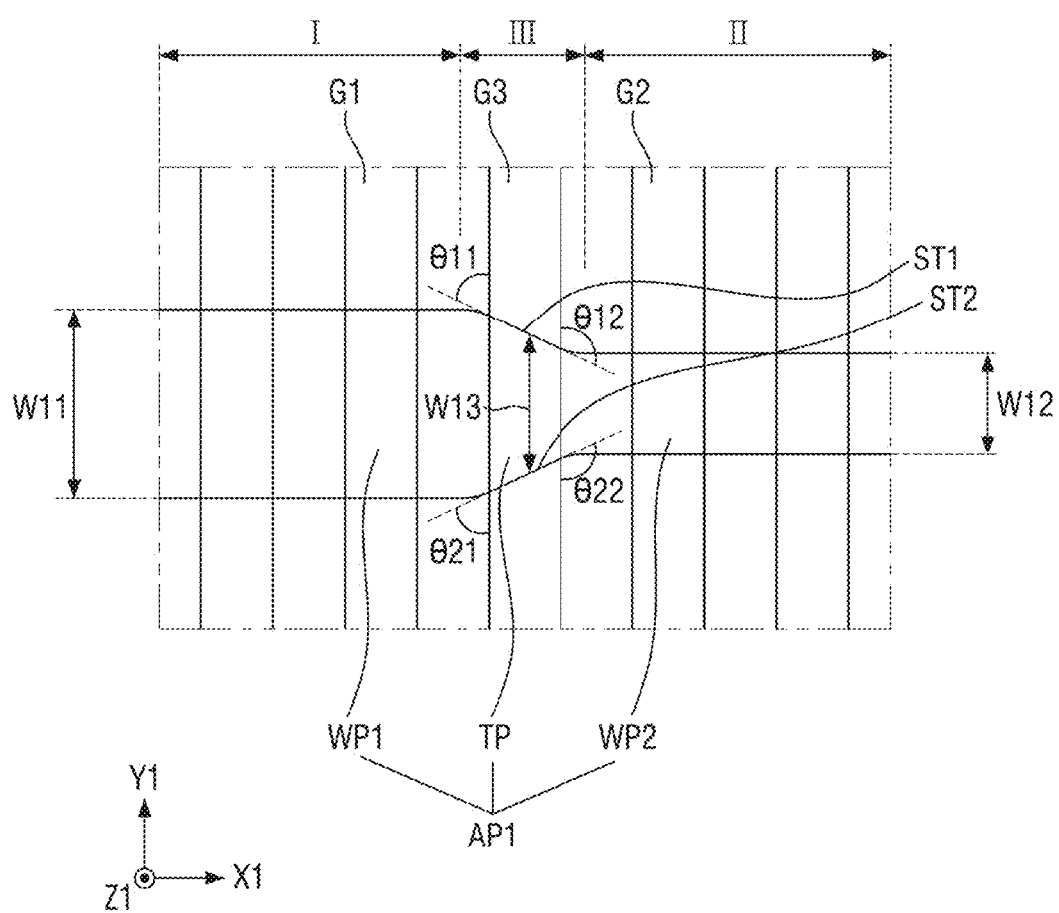
FIGS. 6 and 7 are various layout views for explaining a semiconductor device according to some example embodiments.
Figure 7:
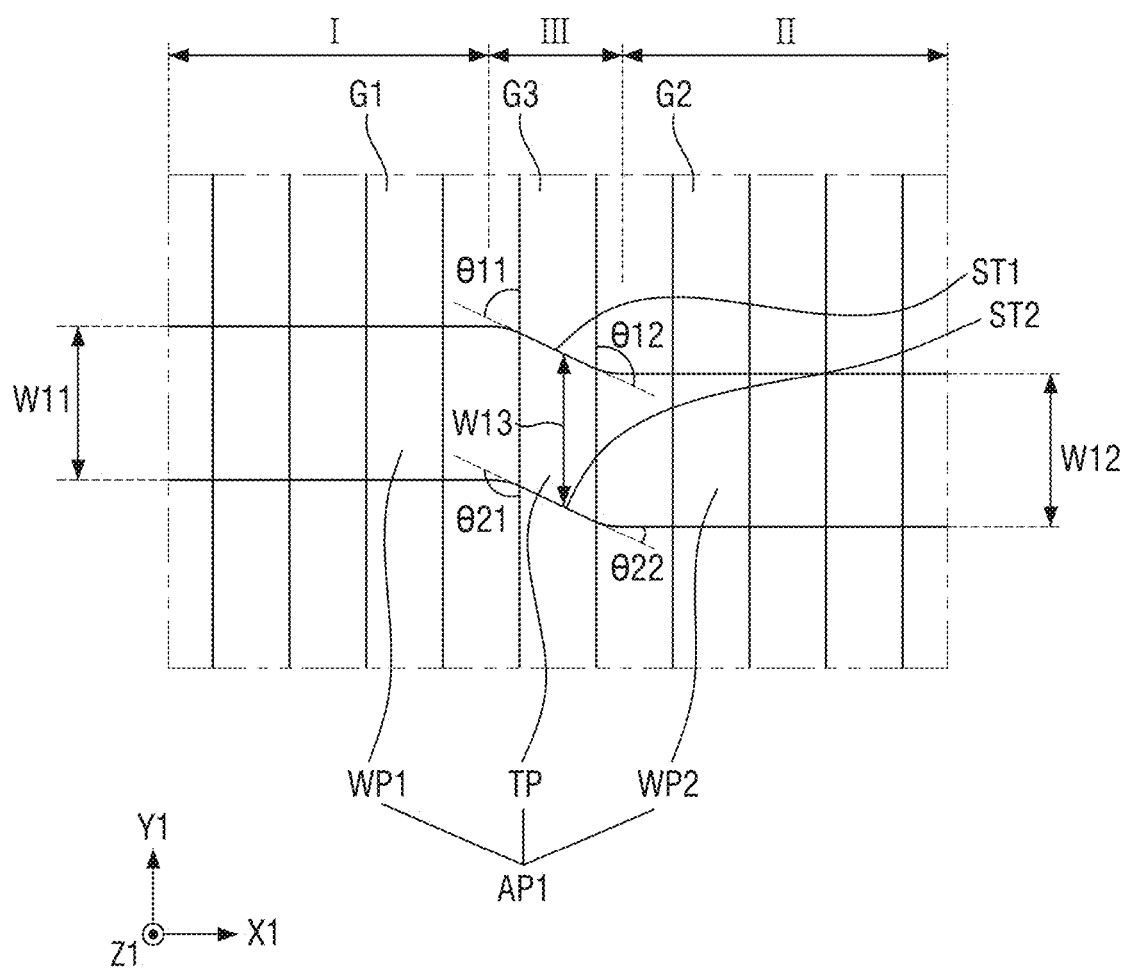

FIGS. 6 and 7 are various layout views for explaining a semiconductor device according to some example embodiments. For convenience of explanation, repeated parts of contents explained above using FIGS. 1 to 3B will be briefly explained or omitted.

Referring to FIG. 6, in the semiconductor device according to some example embodiments, the transition pattern TP1 further includes a second inclined surface ST2.

The second inclined surface ST2 may be the side face of the transition pattern TP1 opposite to the first inclined surface ST1. The second inclined surface ST2 may have an inclination with the side face of the third gate structure G3 from a planar viewpoint. For example, the second inclined surface ST2 may extend in a direction different from the first direction X1 and the second direction Y1. As an example, the second inclined surface ST2 of the transition pattern TP1 may form a third angle θ21 which is an acute angle with one side of the third gate structure G3. Also, the second inclined surface ST2 of the transition pattern TP1 may form a fourth angle θ22 which is an obtuse angle with the other side face of the third gate structure G3.

Although the sum of each of the third angle θ21 and each of the fourth angle θ22 may be 180°, or about 180°, this is merely an example. For example, the sum of each of the third angle θ21 and fourth angle θ22 may, of course, be greater than or smaller than 180° depending on the position at which the third gate structure G3 is placed, due to a misalignment or the like.

In some example embodiments, a third width W13 of the transition pattern TP1 may gradually decrease from the first wire pattern WP1 to the second wire pattern WP2.

Referring to FIG. 7, in the semiconductor device according to some example embodiments, the second inclined surface ST2 forms an obtuse angle with one side face of the third gate structure G3, and forms an acute angle with the other side face of the third gate structure G3.

For example, the third angle θ21 may be an obtuse angle and the fourth angle θ22 may be an acute angle. In some example embodiments, the first inclined surface ST1 and the second inclined surface ST2 may be parallel to each other.

In some example embodiments, the first width W11 of the first wire pattern WP1 may be the same as the second width W12 of the second wire pattern WP2.

In some example embodiments, the third width W13 of the transition pattern TP1 may be the same as the first width W11 of the first wire pattern WP1 and the second width W12 of the second wire pattern WP2. In some example embodiments, the third width W13 of the transition pattern TP1 may be constant from the first wire pattern WP1 to the second wire pattern WP2.

Figure 8:
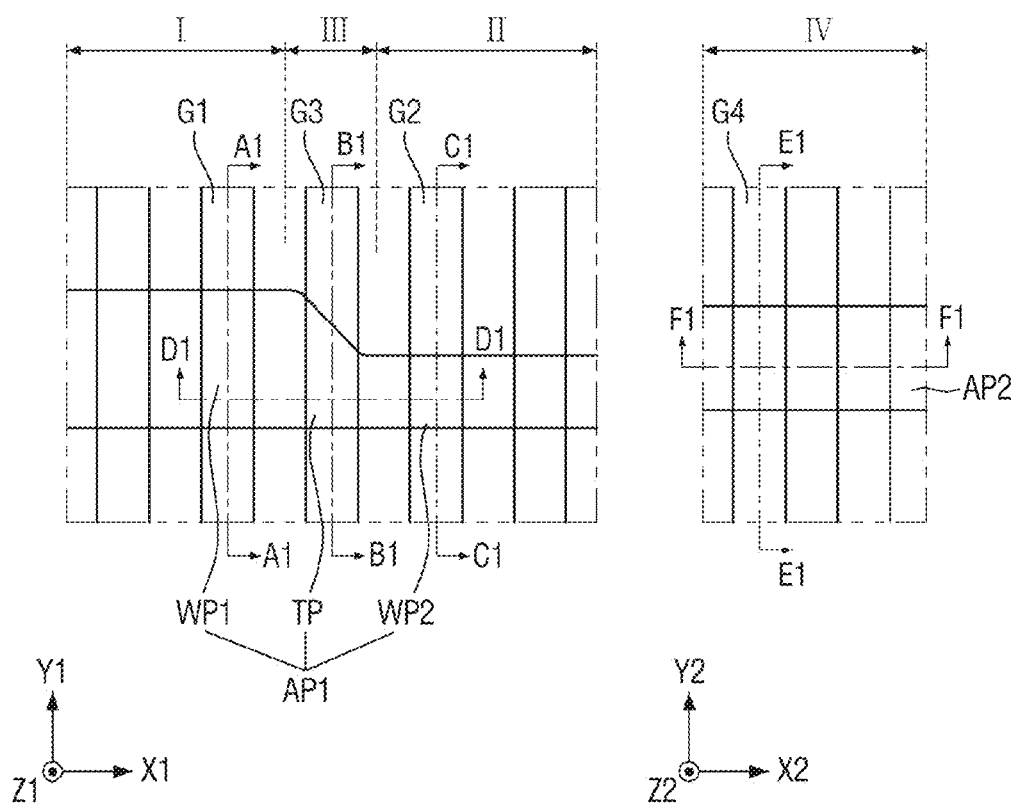
FIG. 8 is a layout view for explaining the semiconductor device according to some example embodiments.
Figure 9:
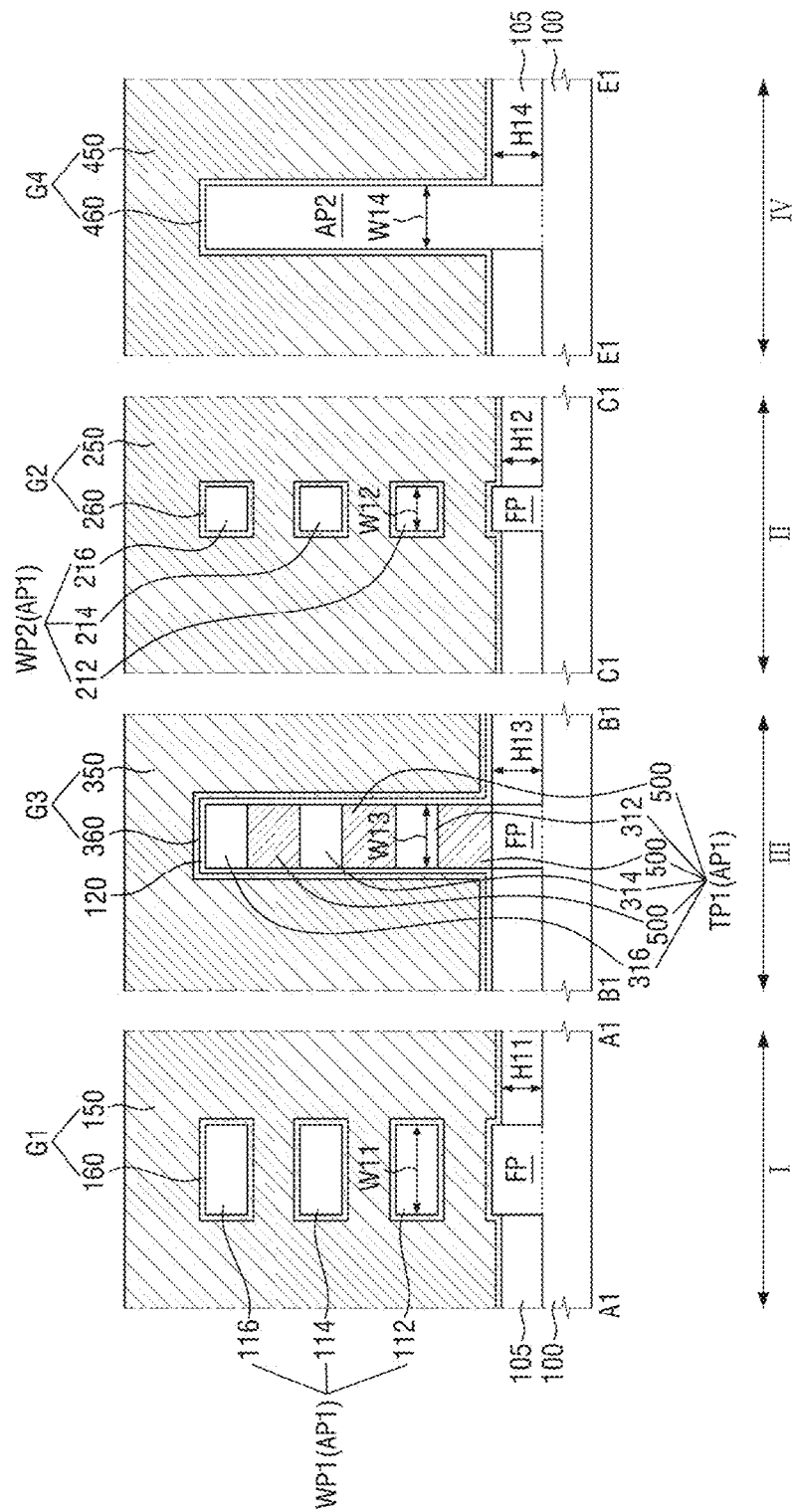
FIG. 9 is a cross-sectional view taken along A1-A1, B1-B1, C1-C1 and E1-E1 of FIG. 8.
Figure 10:
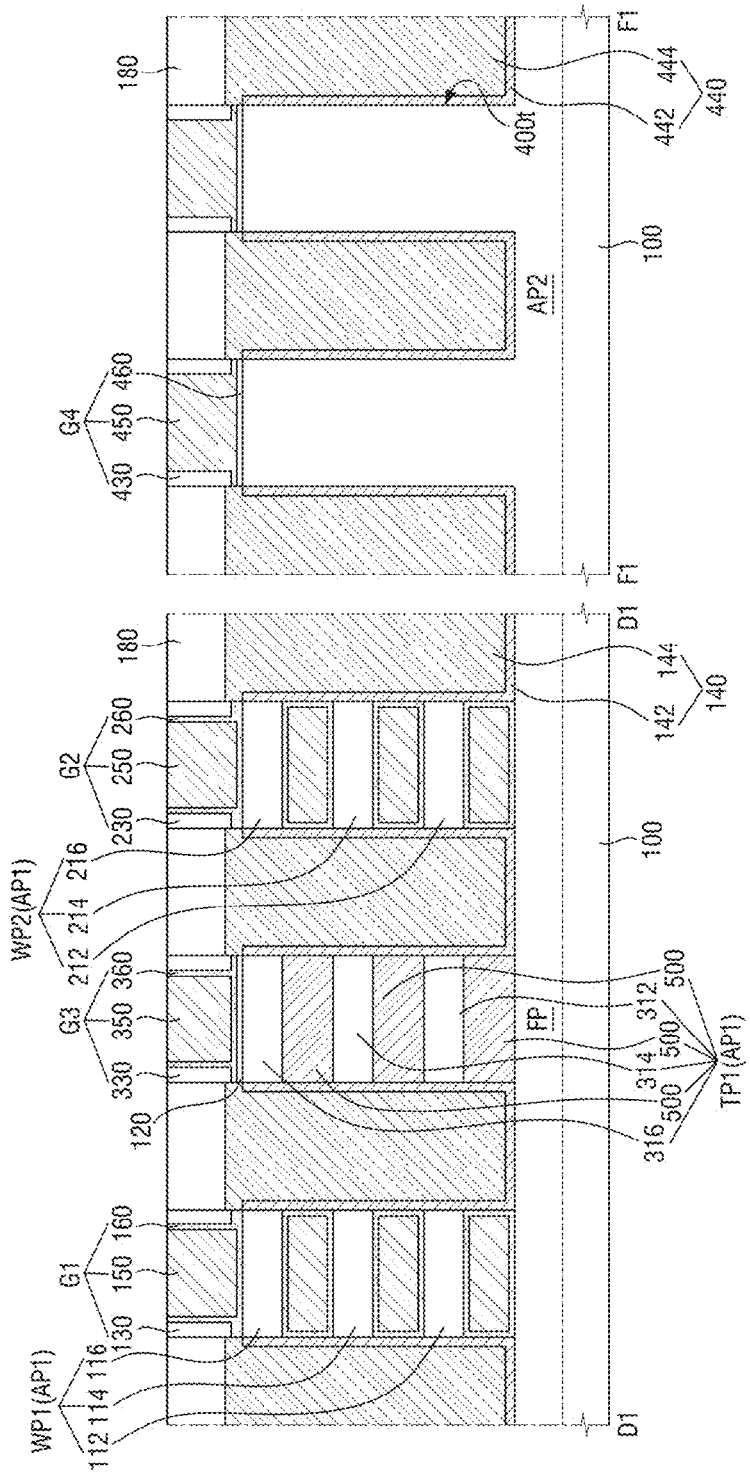
FIG. 10 is a cross-sectional view taken along D1-D1 and F1-F1 of FIG. 8.

FIG. 8 is a layout view for explaining the semiconductor device according to some example embodiments. FIG. 9 is a cross-sectional view taken along A1-A1, B1-B1, C1-C1 and E1-E1 of FIG. 8. FIG. 10 is a cross-sectional view taken along D1-D1 and F1-F1 of FIG. 8. For convenience of explanation, repeated parts of contents explained above using FIGS. 1 to 7 will be briefly explained or omitted.

Referring to FIGS. 8 to 10, in the semiconductor device according to some example embodiments, the substrate 100 further includes a fourth region IV.

The fourth region IV may be a region spaced apart from the first to third regions I, II and III. Each of the first to third regions I, II and III and the fourth region IV may be, for example, one of a logic region, an SRAM region, and an input/output I/O region. The first to third regions I, II and III and the fourth region IV may be regions having the same function as each other, or may be regions having different functions from each other. As an example, although the first to third regions I, II and III may be an SRAM region and the fourth region IV may be an input/output regions, the example embodiments are not limited thereto.

A second active pattern AP2 may be formed on the fourth region IV of the substrate 100. The second active pattern AP2 may extend in a fourth direction X2 parallel to the upper surface of the substrate 100. Although the fourth direction X2 is shown as only being the same as the first direction X1, this is merely an example and the fourth direction X2 may of course be different from the first direction X1. The second active pattern AP2 may protrude from the upper surface of the substrate 100 and extend in the fourth direction X2. The second active pattern AP2 may be formed by etching a part of the substrate 100, or may be an epitaxial layer that is grown from the substrate 100. The second active pattern AP2 may intersect a fourth gate structure G4 to be explained below. The second active pattern AP2 may be used as the channel region of the transistor including the fourth gate structure G4.

The second active pattern AP2 may be formed by etching a part of the substrate 100, or may be an epitaxial layer that is grown from the substrate 100.

Although the fourth width W14 of the second active pattern AP2 is shown as only being smaller than the first width W11 of the first wire pattern WP1 and greater than the second width W12 of the second wire pattern WP2, this is merely an example. Here, the width of the second active pattern AP2 means the width in a fifth direction Y2.

A fourth gate structure G4 may be formed on the second active pattern AP2 and the field insulating film 105. The fourth gate structure G4 may intersect the second active pattern AP2. For example, the fourth gate structure G4 may extend in a fifth direction Y2 parallel to the upper surface of the substrate 100 and intersecting the fourth direction X2.

The fourth gate structure G4 may include a fourth gate electrode 450, a fourth gate dielectric film 460 and a fourth gate spacer 430. Since each of the fourth gate electrode 450, the fourth gate dielectric film 460 and the fourth gate spacer 430 may be similar to the first to third gate electrodes 150, 250 and 350, the first to third gate dielectric films 160, 260 and 360, and the first to third gate spacers 130, 230 and 330, detailed explanation thereof will not be provided below.

In some example embodiments, the fourth gate dielectric film 460 may be formed at the same level as the first protective film 120. For example, the fourth gate dielectric film 460 may have the same material composition as the first protective film 120.

In some example embodiments, the fourth gate dielectric film 460 may not extend along the inner surface of the fourth gate spacer 430.

In some example embodiments, a part of the fourth gate electrode 450 may be interposed between the fourth gate dielectric film 460 and the fourth gate spacer 430.

A second epitaxial pattern 440 may be formed on the fourth region IV of the substrate 100. The second epitaxial pattern 440 may be formed in the second active pattern AP2. Also, the second epitaxial pattern 440 may be formed on the side face of the fourth gate structure G4. The second epitaxial pattern 440 may be electrically spaced apart from the fourth gate electrode 450 by the fourth gate spacer 430. The second epitaxial pattern 440 may be used as the source/drain region of the transistor including the fourth gate structure G4.

In some example embodiments, a second source/drain trench 240*t* may be formed in the second active pattern AP2 on the side face of the fourth gate structure G4. The second epitaxial pattern 440 may be formed in the second source/drain trench 240*t*.

In some example embodiments, the second epitaxial pattern 440 may include a third epitaxial layer 442 and a fourth epitaxial layer 444 stacked sequentially on the substrate 100. The third epitaxial layer 442 may extend, for example, along the profile of the second source/drain trench 240*t*. The fourth epitaxial layer 444 may be formed to fill the second source/drain trench 240*t*. The third epitaxial layer 442 may function as a seed layer for growing the fourth epitaxial layer 444.

When the semiconductor device formed on the fourth region IV is a PMOS transistor, the second epitaxial pattern 240 may include p-type impurities or impurities for preventing the diffusion of p-type impurities. When the semiconductor device formed on the fourth region IV is an NMOS transistor, the second epitaxial pattern 240 may include n-type impurities or impurities for preventing the diffusion of n-type impurities.

In some example embodiments, the height of the field insulating film 105 may be higher in the fourth region IV than in the first region I and second region II. For example, a height H14 of the upper surface of the field insulating film 105 of the fourth region IV may be higher than the height H11 of the upper surface of the field insulating film 105 of the first region I and the height H12 of the upper surface of the field insulating film 105 of the second region II, on the basis of the upper surface of the substrate 100. In some example embodiments, the height H14 of the upper surface of the field insulating film 105 of the fourth region IV may be the same as the height H13 of the upper surface of the field insulating film 105 of the third region III, on the basis of the upper surface of the substrate 100.

In some example embodiments, the second active pattern AP2 may have an overall fin-type pattern shape. In some example embodiments, the fourth gate structure G4 may surround the three faces of the second active pattern AP2. For example, as shown in FIG. 9, the fourth gate structure G4 may cover both side surfaces and the upper surface of the second active pattern AP2.

Although the height of the upper surface of the second active pattern AP2 is shown as only being the same as the height of the upper surface of the transition pattern TP1, this is merely an example. For example, the upper surface of the second active pattern AP2 may not be placed on the same plane as the upper surface of the transition pattern TP1.

Figure 11:
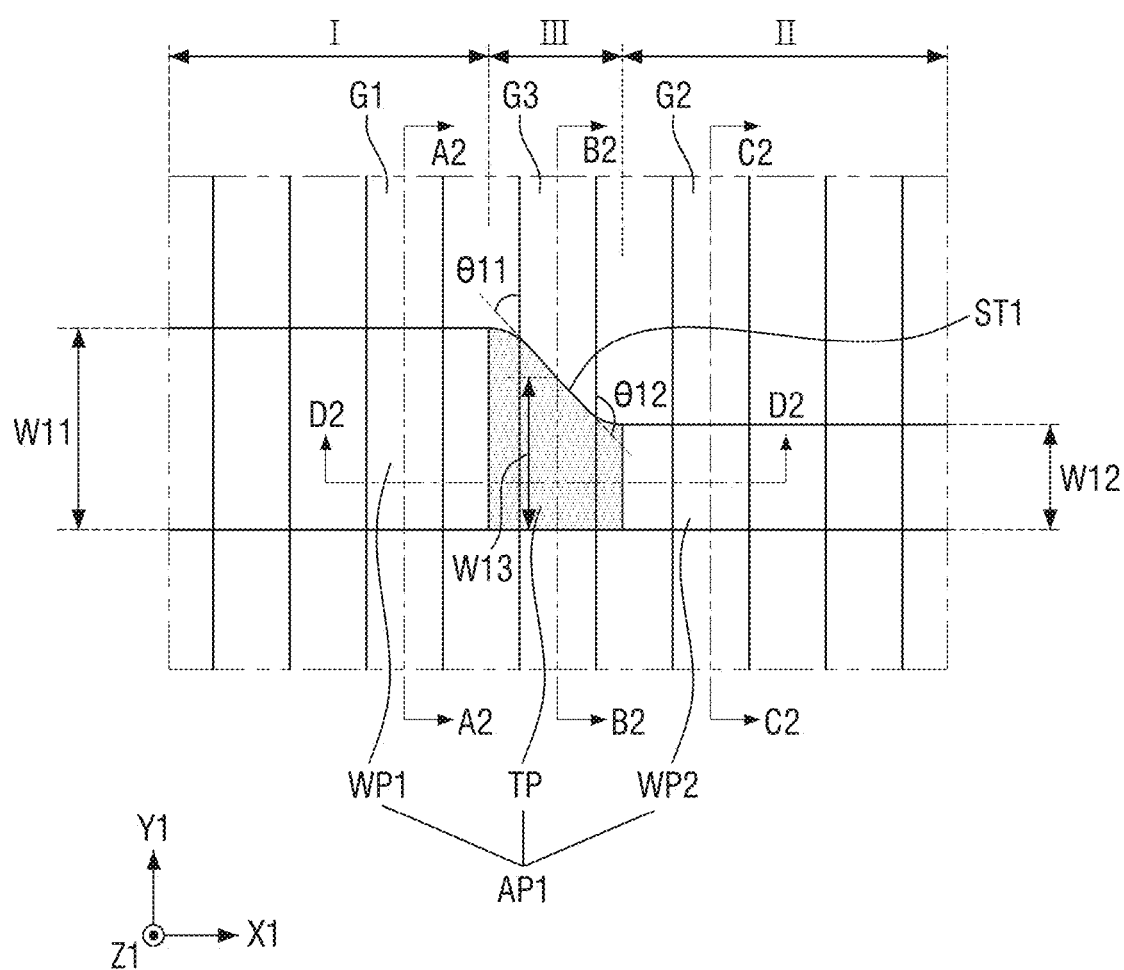
FIG. 11 is a layout view for explaining the semiconductor device according to some example embodiments.
Figure 12:
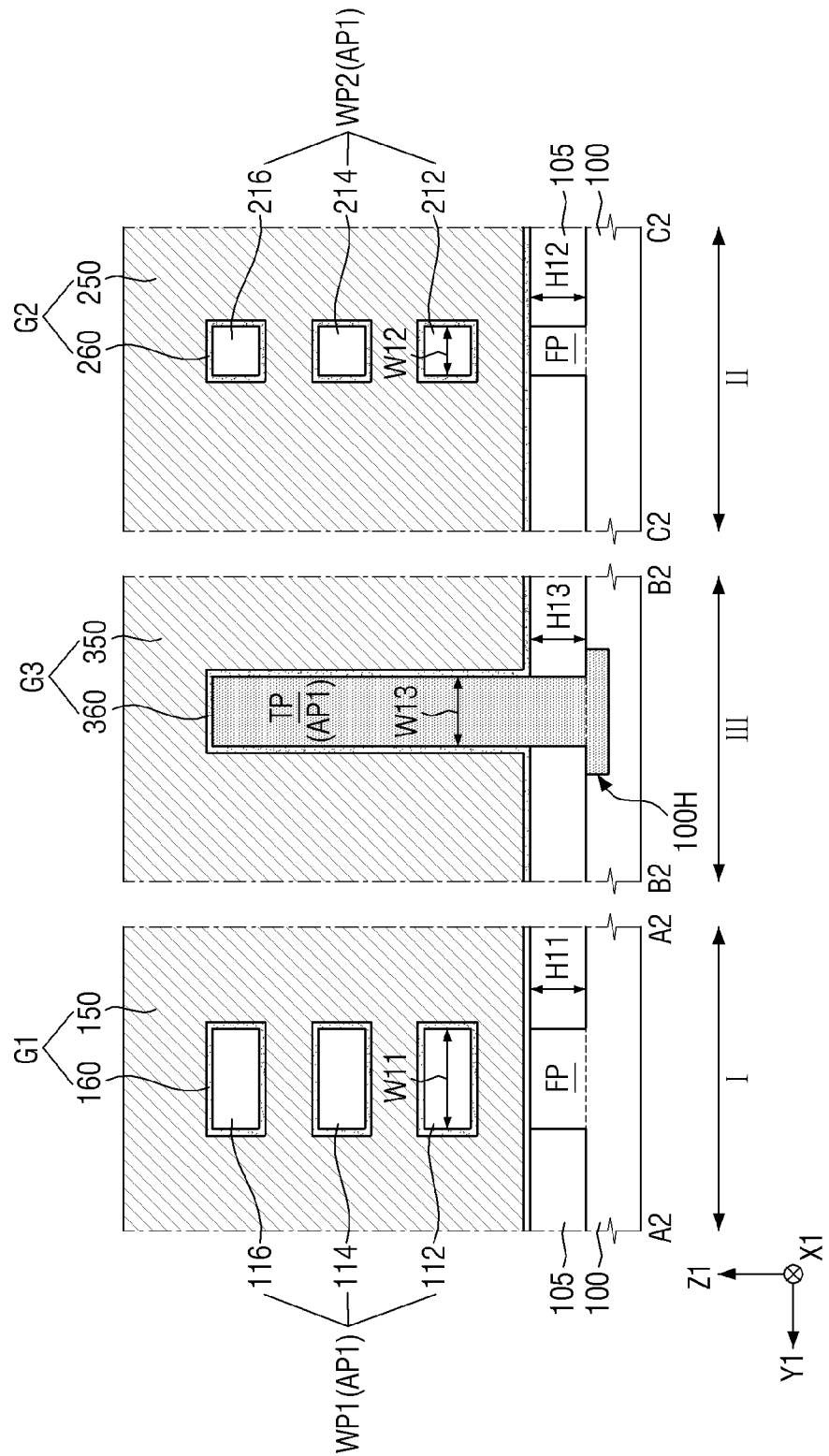
FIG. 12 is a cross-sectional view taken along A2-A2, B2-B2 and C2-C2 of FIG. 11.
Figure 13:
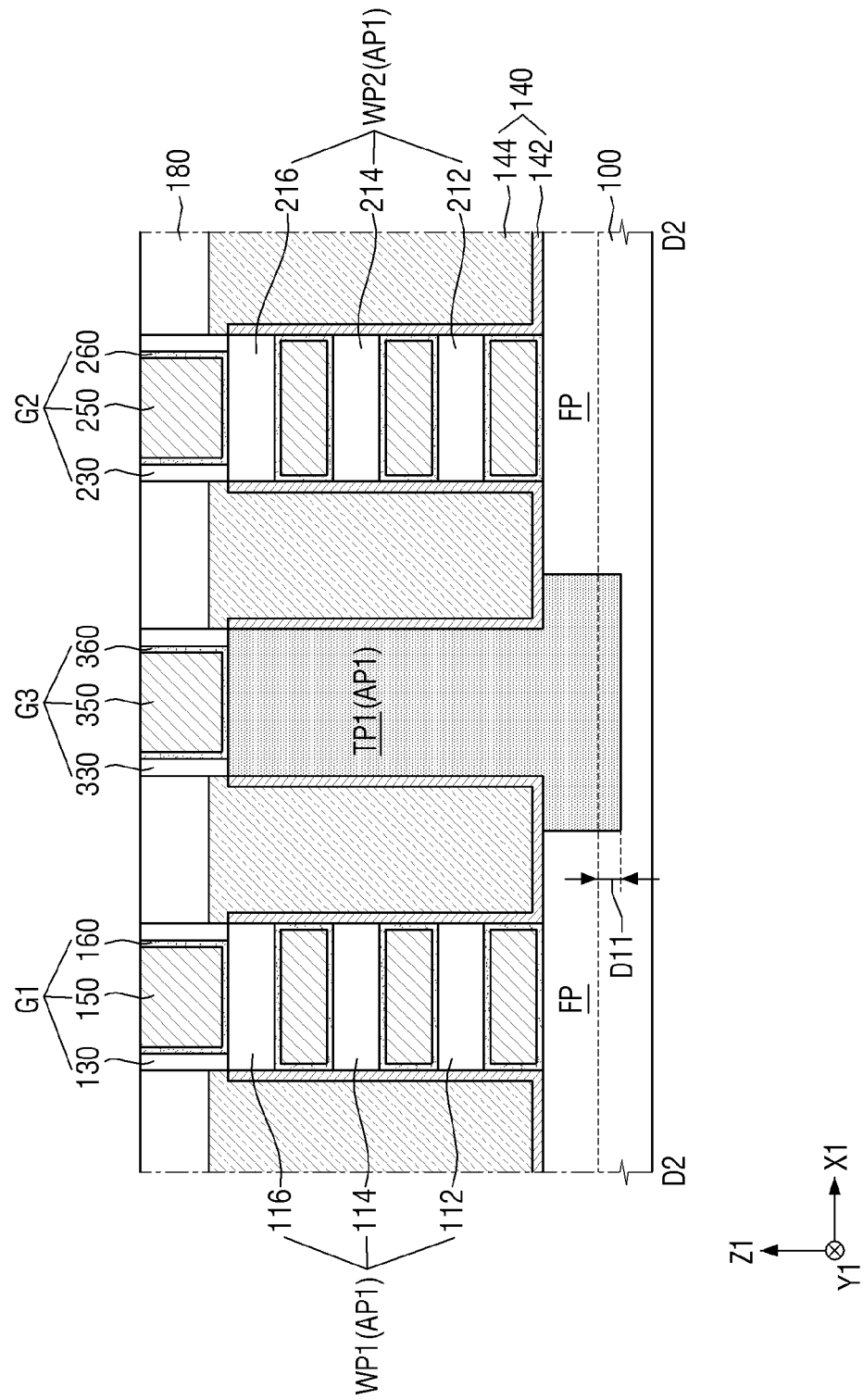
FIG. 13 is a cross-sectional view taken along D2-D2 of FIG. 11.

FIG. 11 is a layout view for explaining the semiconductor device according to some example embodiments. FIG. 12 is a cross-sectional view taken along A2-A2, B2-B2 and C2-C2 of FIG. 11. FIG. 13 is a cross-sectional view taken along D2-D2 of FIG. 11. For convenience of explanation, repeated parts of contents explained above using FIGS. 1 to 10 will be briefly explained or omitted.

Referring to FIGS. 11 to 13, in the semiconductor device according to some example embodiments, the transition pattern TP1 is a single material layer.

For example, the transition pattern TP1 may be a single material layer that protrudes from the upper surface of the substrate 100 and extends in the first direction X1. The transition pattern TP1 may be a single material layer having an overall fin-type pattern shape. In some example embodiments, the third gate structure G3 may surround three sides of the transition pattern TP1 which is a single material layer.

The transition pattern TP1 may include a materials different from the sacrificial patterns (e.g., 500 of FIGS. 1 to 3A). For example, the transition pattern TP1 may include a third semiconductor material, and the sacrificial patterns 500 may include the second semiconductor material that is different from the third semiconductor material. In some example embodiments, the third semiconductor material may include silicon (Si), and the second semiconductor material may include silicon germanium (SiGe). Thus, the sacrificial patterns 500 may have an etching selectivity for the transition pattern TP1.

In some example embodiments, the transition pattern TP1 may include a first base and a first fin. The first base of the transition pattern TP1 may be buried in the substrate 100. For example, a transition trench 100H may be formed in the substrate 100. The first base of the transition pattern TP1 may fill the transition trench 100H. Accordingly, the lower surface of the transition pattern TP1 may be formed to be lower than the upper surface of the substrate 100. For example, the lower surface of the transition pattern TP1 may be formed at a first depth D11 downward from the upper surface of the substrate 100. The first fin of the transition pattern TP1 may protrude from the upper surface of the first base and extend in the first direction X1.

In some example embodiments, the width of the transition pattern TP1 may be greater than the width of the third gate structure G3. Here, the width of the transition pattern TP1 means the width in the first direction X1. For example, as shown in FIGS. 11 and 13, the width of the transition pattern TP1 buried in the substrate 100 in the first direction X1 may be greater than the width of the third gate structure G3 in the first direction X1.

In some example embodiments, the width of the transition trench 100H in the second direction Y1 may be greater than the third width W13 of the transition pattern TP1. Here, the width of the transition trench 100H means the width in the second direction Y1. For example, as shown in FIG. 12, the width of the transition pattern TP1 buried in the substrate 100 in the second direction Y1 may be greater than the width (e.g., the third width W13) of the transition pattern TP1 in the second direction Y1 that protrudes from the field insulating film 105.

Figure 14:
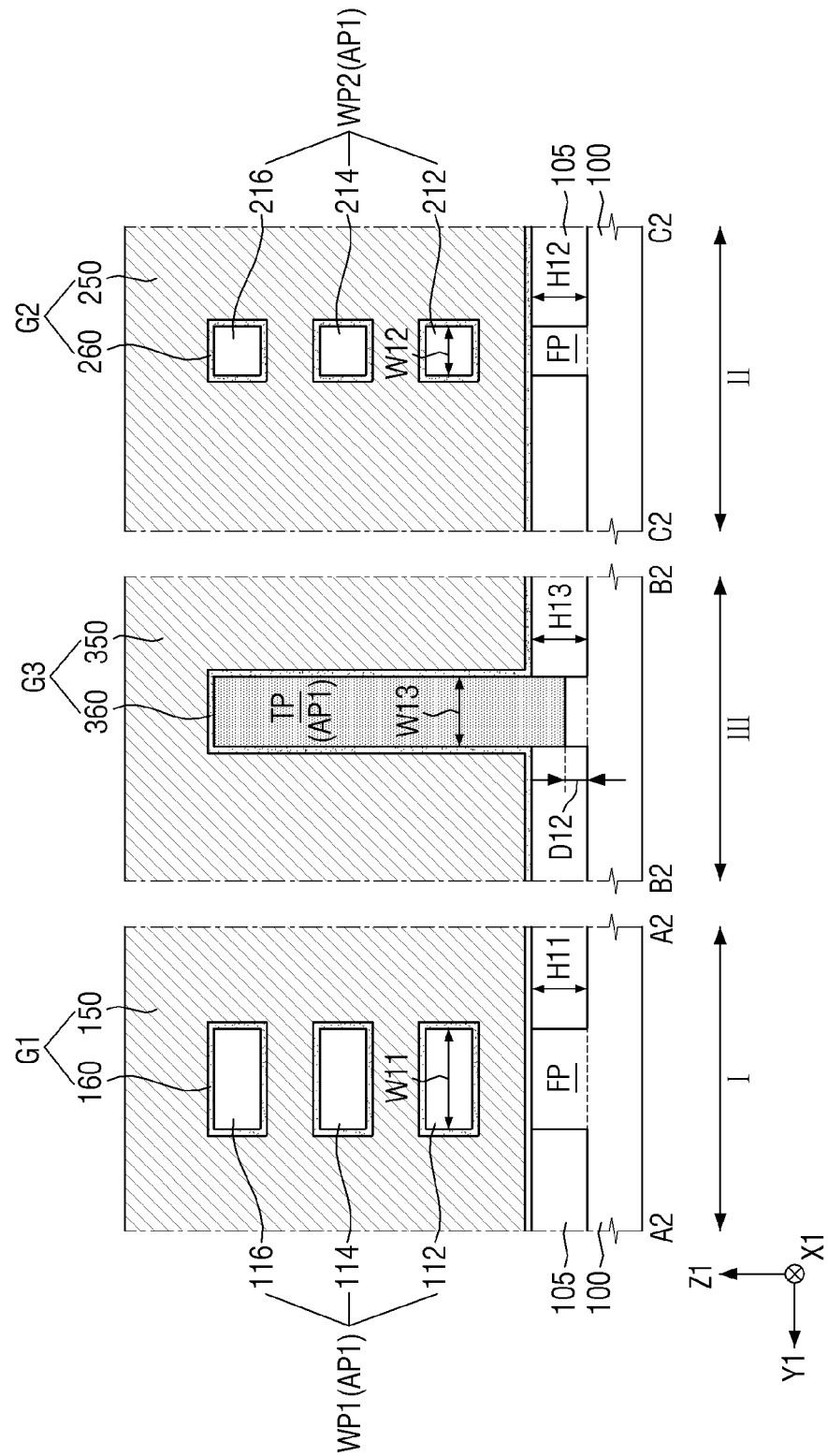
FIGS. 14 to 17 are various cross-sectional views for explaining the semiconductor device according to some example embodiments.
Figure 15:
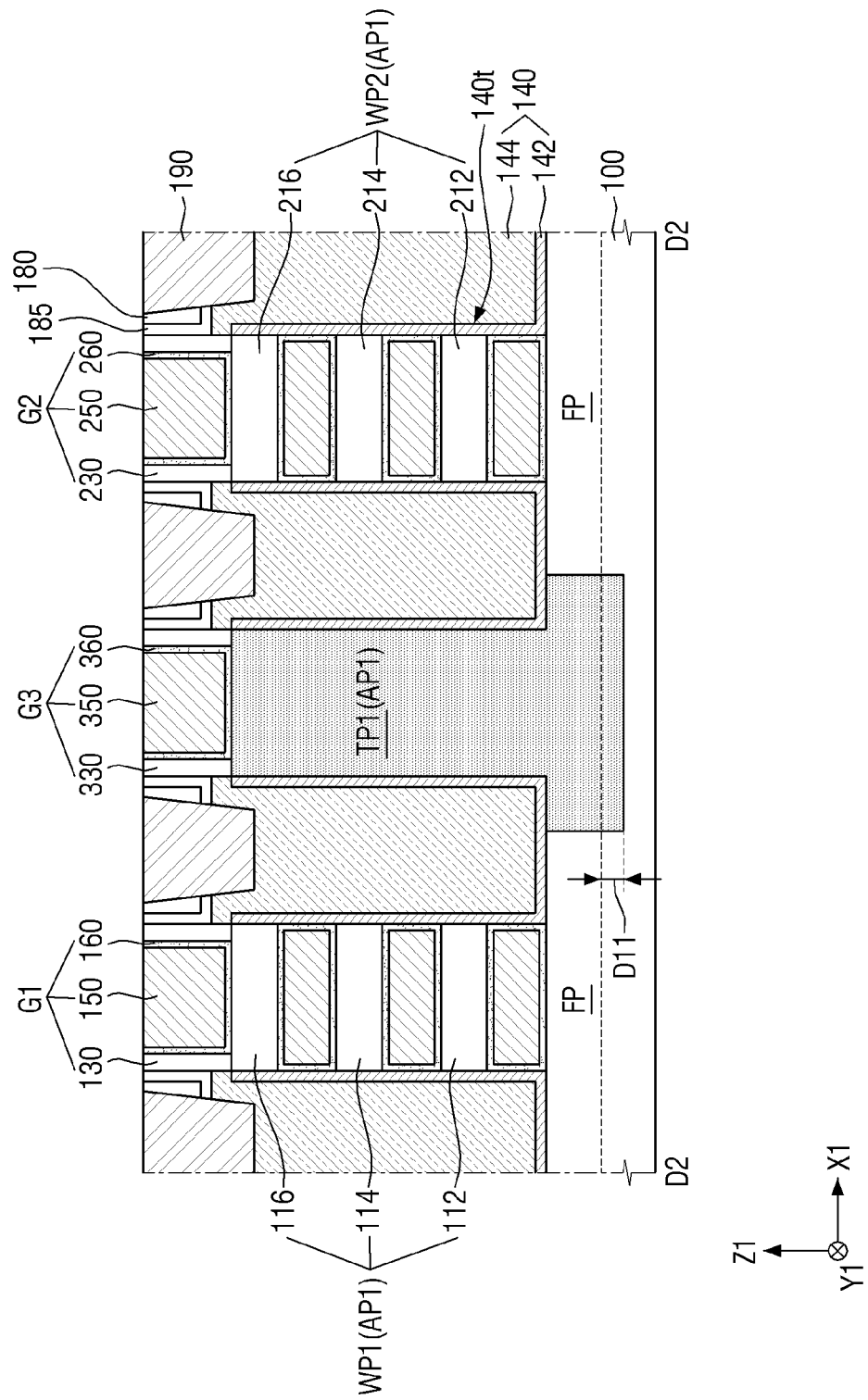
Figure 16:
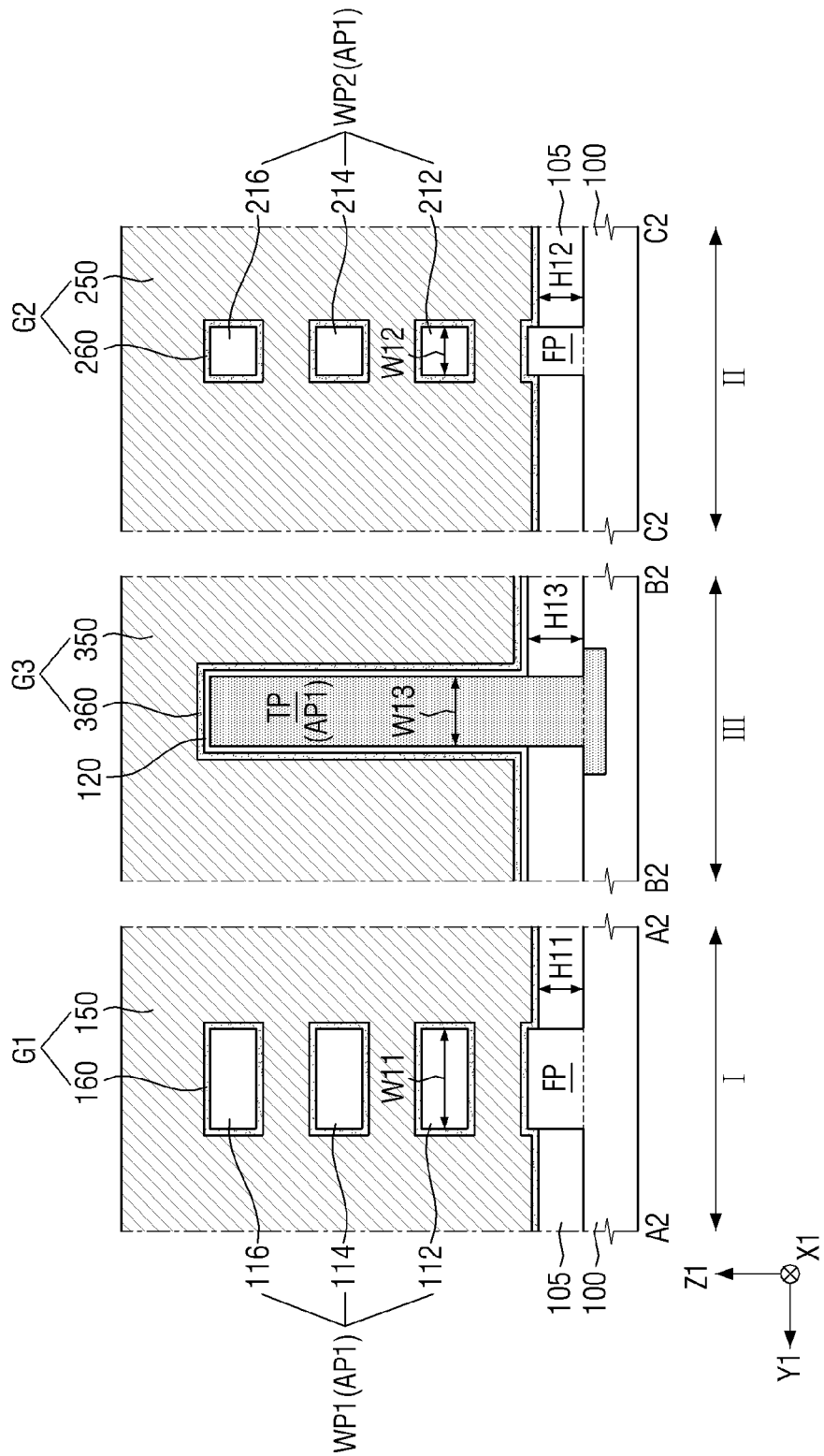
Figure 17:
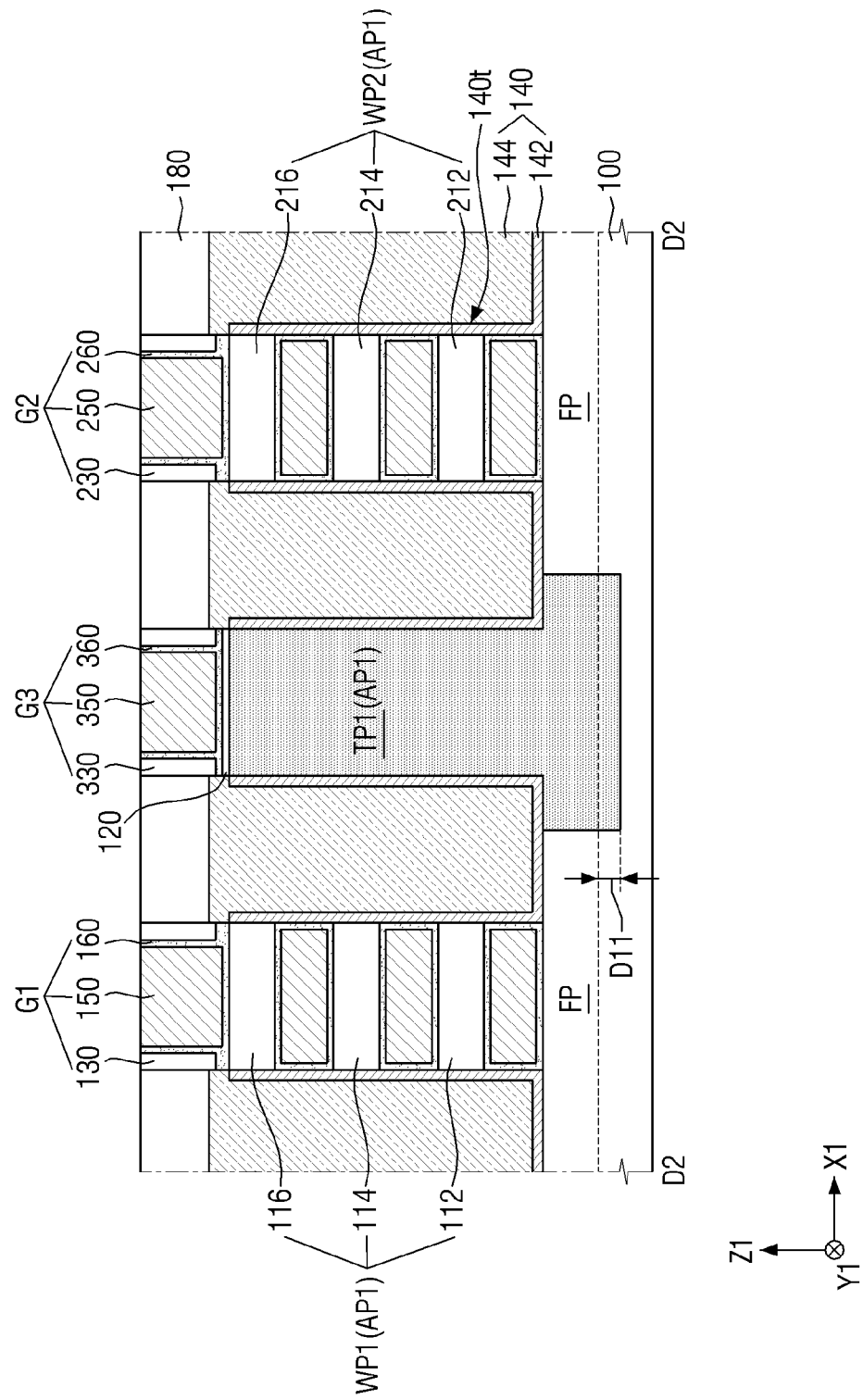

FIGS. 14 to 17 are various cross-sectional views for explaining the semiconductor device according to some example embodiments. For convenience of explanation, repeated parts of contents explained above using FIGS. 1 to 13 will be briefly explained or omitted. For reference, FIGS. 14 and 16 are other cross-sectional views taken along A2-A2, B2-B2 and C2-C2 of FIG. 11, and FIGS. 15 and 17 are other cross-sectional views taken along D2-D2 of FIG. 11.

Referring to FIGS. 11 and 14, in the semiconductor device according to some example embodiments, the lower surface of the transition pattern TP1 is formed to be higher than the upper surface of the substrate 100.

For example, the lower surface of the transition pattern TP1 may be formed at a second depth D12 upward from the upper surface of the substrate 100. Although the lower surface of the transition pattern TP1 is shown as only being formed to be lower than the upper surface of the field insulating film 105, this is merely an example. For example, the lower surface of the transition pattern TP1, of course, may be placed on the same plane as or to be higher than the upper surface of the field insulating film 105.

Referring to FIGS. 11 and 15, the semiconductor device according to some example embodiments further includes a source/drain contact 190. Since the source/drain contact 190 is similar to that explained above using FIG. 5, detailed explanation will not be provided below.

In some example embodiments, an etching blocking film 185 may be further formed. Since the etching blocking film 185 is similar to that explained above using FIG. 5, detailed explanation thereof will not be provided below.

Referring to FIGS. 11, 16 and 17, the semiconductor device according to some example embodiments further includes a first protective film 120. Since the first protective film 120 is similar to that explained above using FIGS. 1 to 3B, detailed explanation thereof will not be provided below.

In some example embodiments, the height of the field insulating film 105 may be higher in the third region III than in the first region I and the second region II. For example, the height H13 of the upper surface of the field insulating film 105 of the third region III may be higher than the height H11 of the upper surface of the field insulating film 105 of the first region I and the height H12 of the upper surface of the field insulating film 105 of the second region II, on the basis of the upper surface of the substrate 100. Although not shown, the field insulating film 105 may have a step between the first gate structure G1 and the third gate structure G3, and between the second gate structure G2 and the third gate structure G3.

Figure 18:
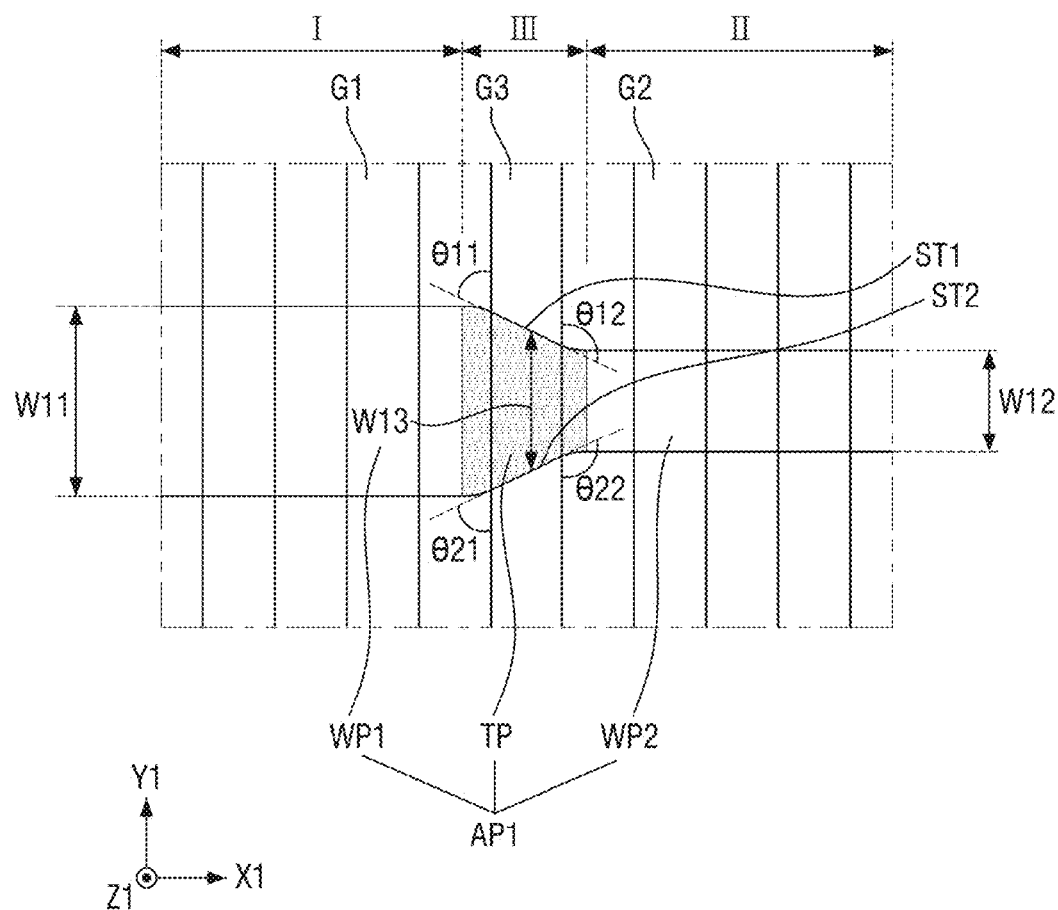
FIGS. 18 and 19 are various layout views for explaining a semiconductor device according to some example embodiments.
Figure 19:
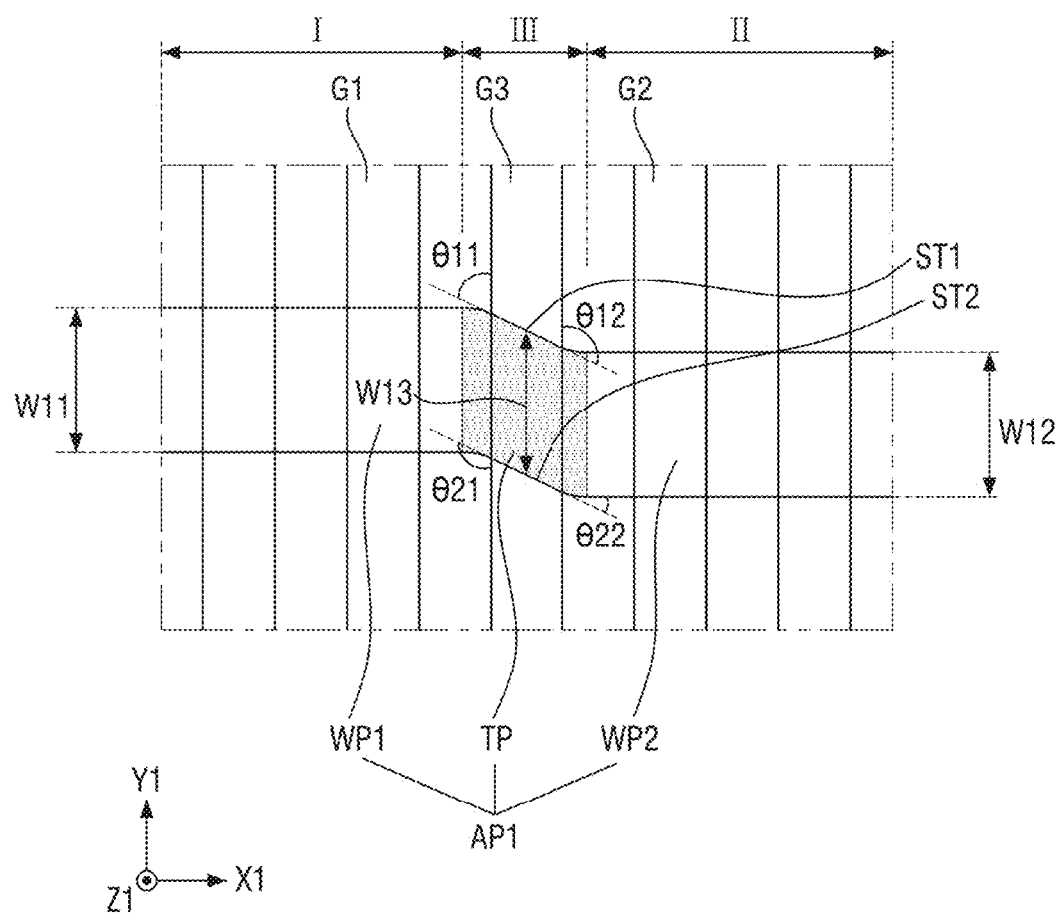

FIGS. 18 and 19 are various layout views for explaining a semiconductor device according to some example embodiments. For convenience of explanation, repeated parts of contents explained above using FIGS. 11 to 13 will be briefly explained or omitted.

Referring to FIG. 18, in the semiconductor device according to some example embodiments, the transition pattern TP1 further includes a second inclined surface ST2. Since the second inclined surface ST2 is similar to that explained above using FIG. 6, detailed explanation thereof will not be provided below.

Referring to FIG. 19, the second inclined surface ST2 forms an obtuse angle with one side face of the third gate structure G3 and forms an acute angle with the other side face of the third gate structure G3. Since the second inclined surface ST2 is similar to that explained above using FIG. 7, detailed explanation thereof will not be provided below.

Figure 20:
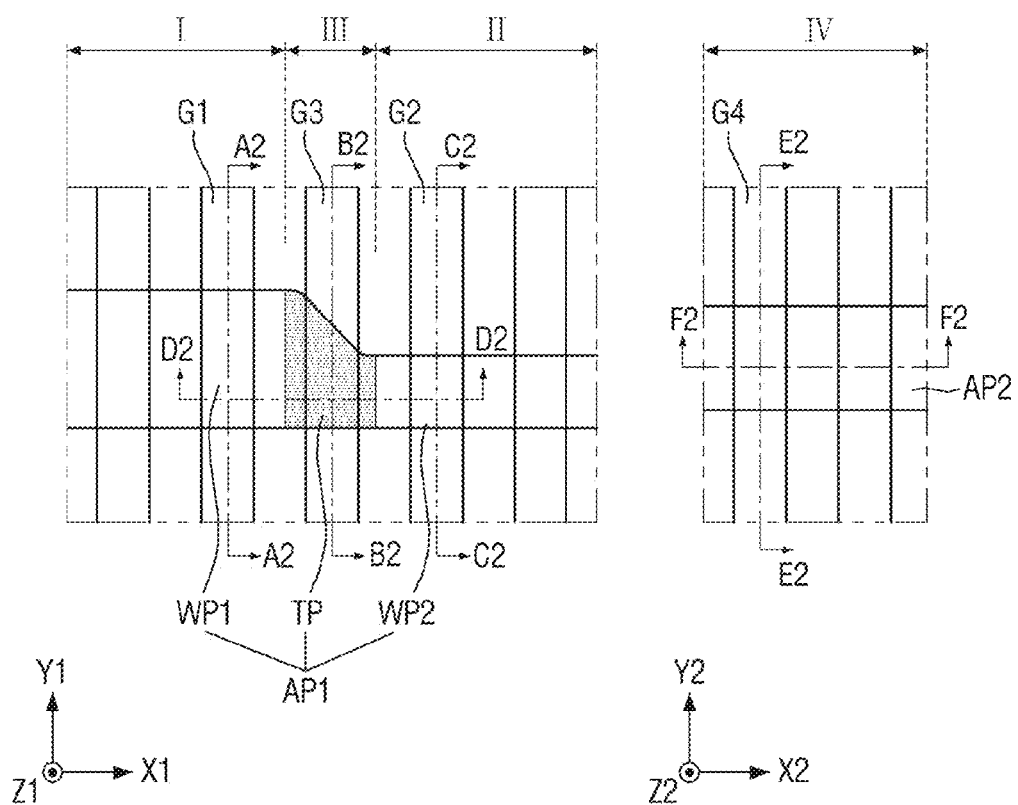
FIG. 20 is a layout view for explaining the semiconductor device according to some example embodiments.
Figure 21:
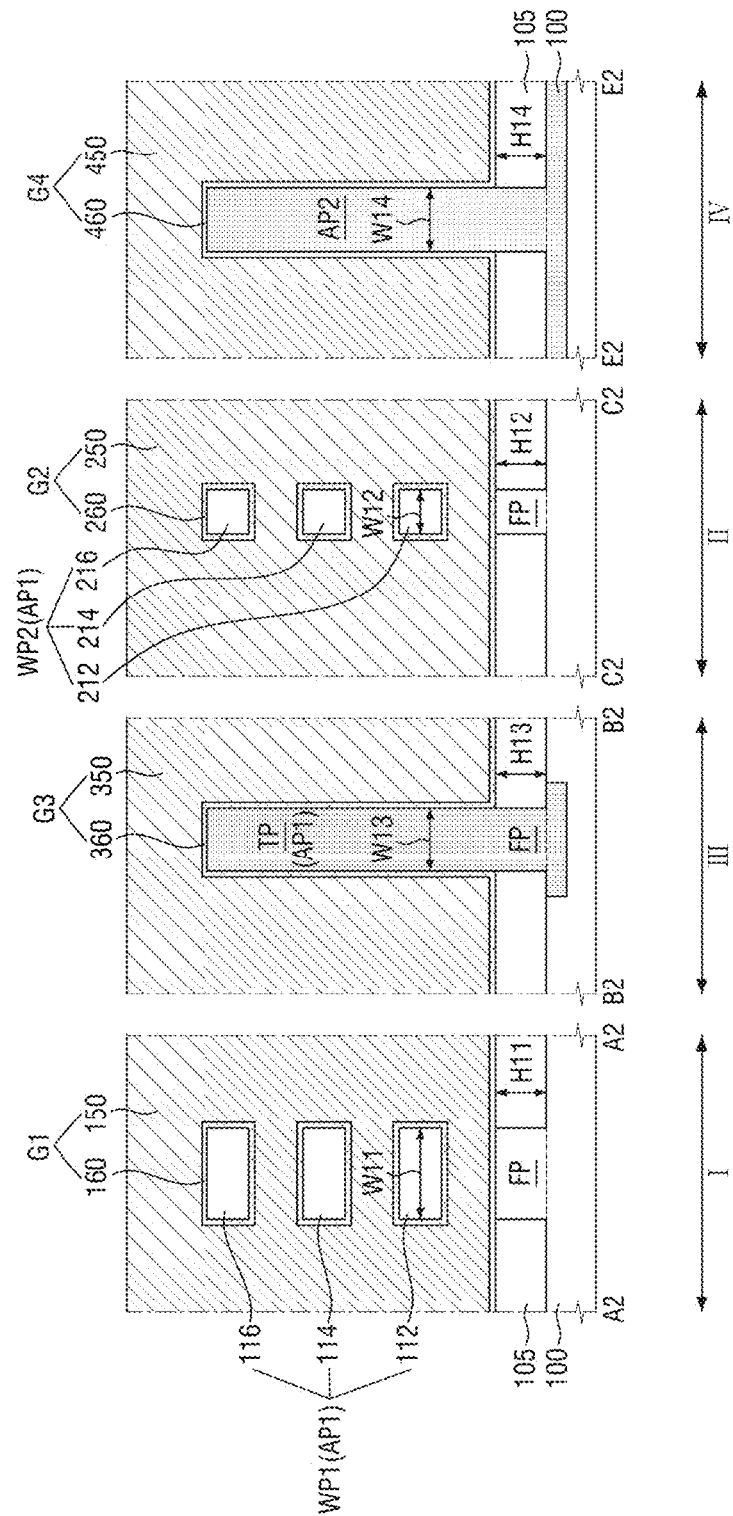
FIG. 21 is a cross-sectional view taken along A2-A2, B2-B2, C2-C2 and E2-E2 of FIG. 20.
Figure 22:
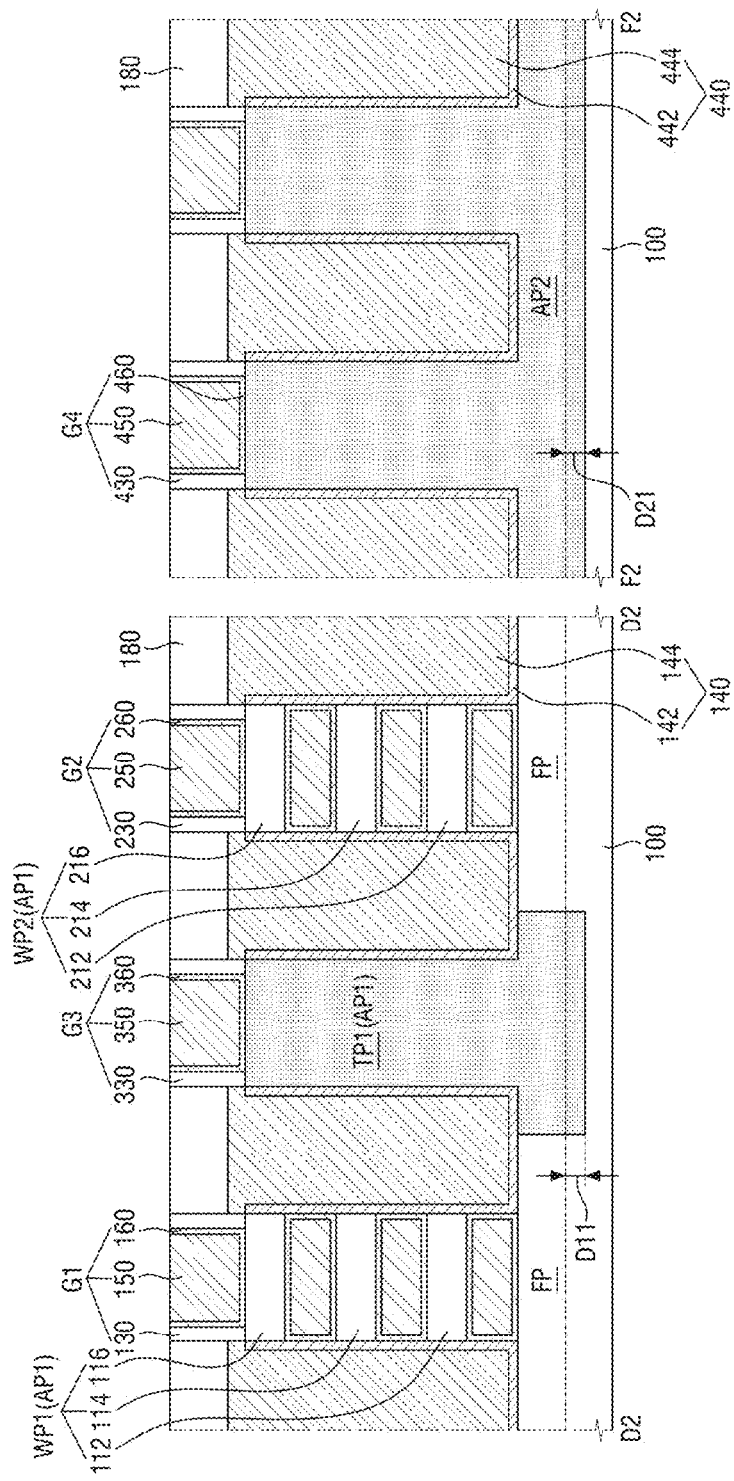
FIG. 22 is a cross-sectional view taken along D2-D2 and F2-F2 of FIG. 20.

FIG. 20 is a layout view for explaining the semiconductor device according to some example embodiments. FIG. 21 is a cross-sectional view taken along A2-A2, B2-B2, C2-C2 and E2-E2 of FIG. 20. FIG. 22 is a cross-sectional view taken along D2-D2 and F2-F2 of FIG. 20. For convenience of explanation, repeated parts of contents explained above using FIGS. 1 to 19 will be briefly explained or omitted.

Referring to FIGS. 20 to 22, in the semiconductor device according to some example embodiments, the substrate 100 further includes a fourth region IV. Since the fourth region IV is similar to that explained above using FIGS. 8 to 10, detailed explanation thereof will not be provided below.

A second active pattern AP2, a fourth gate structure G4 and a second epitaxial pattern 440 may be formed on the fourth region IV of the substrate 100. Since the second active pattern AP2, the fourth gate structure G4, and the second epitaxial pattern 440 are similar to those explained above using FIGS. 8 to 10, detailed explanation thereof will not be provided below.

In some example embodiments, the second active pattern AP2 may be a single material layer that protrudes from the upper surface of the substrate 100 and extends in the fourth direction X2. The second active pattern AP2 may be a single material layer having an overall fin-type pattern shape. In some example embodiments, the fourth gate structure G4 may surround the three sides of the second active pattern AP2 which is a single material layer.

In some example embodiments, the second active pattern AP2 may be formed at the same level as the transition pattern TP1. For example, the transition pattern TP1 and the second active pattern AP2 may all include a third semiconductor material.

In some example embodiments, the second active pattern AP2 may include a second base and a second fin. The second base of the second active pattern AP2 may cover the upper surface of the substrate 100. For example, the second base of the second active pattern AP2 may be interposed between the substrate 100 and the field insulating film 105. The second fin of the second active pattern AP2 may protrude from the upper surface of the second base and extend in the fourth direction X2.

In some example embodiments, the lower surface of the second active pattern AP2 may be formed at a third depth D21 downward from the upper surface of the first to third regions I, II and III. In some example embodiments, the first depth D11 of the transition pattern TP1 may be the same as the third depth D21 of the second active pattern AP2.

In order to fabricate a semiconductor device including a wire pattern, an active film (for example, 512, 514, and 516 of FIG. 25 to be explained later) and a sacrificial film (for example, 502 of FIG. 25 to be explained later) having an etching selectivity for the active film may be used. For example, a sacrificial film including silicon germanium (SiGe) to have an etching selectivity for the active film including silicon (Si) may be used. However, when the semiconductor device to be fabricated is a PMOS transistor, an epitaxial pattern (for example, the first epitaxial pattern 140) may also include silicon germanium (SiGe). As a result, the epitaxial pattern may be damaged in the process of removing the sacrificial film, which causes decreases in the performance, reliability, and yield of the semiconductor device.

To prevent or reduce this problem, the first epitaxial pattern 140 may include a protective epitaxial layer (e.g., the first epitaxial layer 142). However, even in such cases, in some regions (e.g., a region in which the active film has an inclination with the side face of the gate structure (e.g., the third region III)), there is a problem that the thickness of the protective epitaxial layer becomes thin or the protective epitaxial layer is not formed.

However, the semiconductor device according to some example embodiments may include a transition pattern TP1 to prevent or reduce damage to the first epitaxial pattern 140. As an example, since the sacrificial patterns 500 interposed between the third semiconductor patterns 312, 314 and 316 remain in the transition pattern TP1, it is possible to prevent damage to the first epitaxial pattern 140 adjacent to the transition pattern TP1, even in the process of removing the sacrificial patterns 500 of the first region I and the second region II. As another example, since the transition pattern TP1 includes a single material layer having etching selectivity different from the sacrificial patterns 500, it is possible to prevent damage to the first epitaxial pattern 140 adjacent to the transition pattern TP1, even in the process of removing the sacrificial patterns 500 of the first region I and the second region II.

As a result, even though the transition pattern TP1 has the first inclined surface ST1 having an inclination with the side face of the third gate structure G3, because damage to the first epitaxial pattern 140 adjacent to the transition pattern TP1 is prevented, a semiconductor device having improved performance, reliability and yield can be provided.

Figure 23:
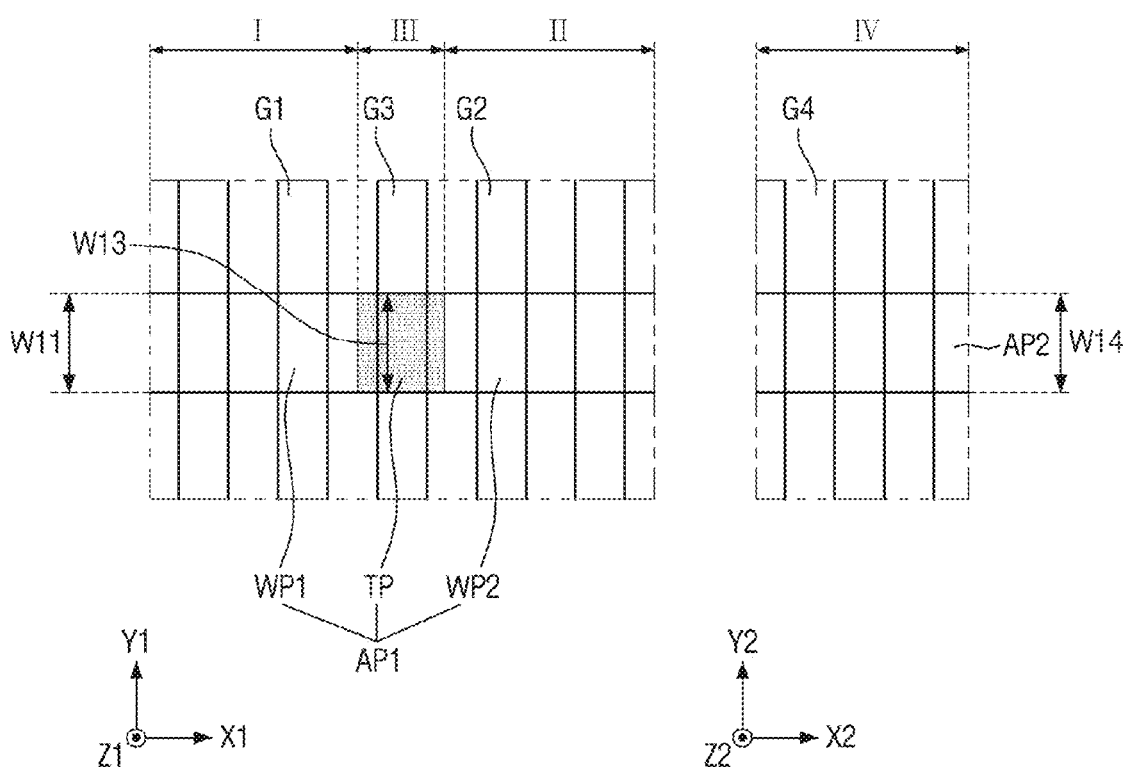
FIG. 23 is a layout view for explaining the semiconductor device according to some example embodiments.

FIG. 23 is a layout view for explaining the semiconductor device according to some example embodiments. For convenience of explanation, repeated parts of contents explained above using FIGS. 1 to 22 will be briefly explained or omitted.

Referring to FIG. 23, in the semiconductor device according to some example embodiments, both side surfaces of the transition pattern TP1 are orthogonal to the third gate structure G3 from a planar viewpoint.

For example, both side surfaces of the transition pattern TP1 may extend in the first direction X1.

In some example embodiments, the first width W11 of the first wire pattern WP1, the second width W12 of the second wire pattern WP2, and the third width W13 of the transition pattern TP1 may be identical to each other.

The semiconductor device according to some example embodiments may include a first active pattern AP1 in which wire patterns (e.g., a first wire pattern WP1 and a second wire pattern WP2) and a fin-type pattern (e.g., a transition pattern TP1) are mixed in a narrow region (e.g., a second gate pitch 2CPP (2 contacted poly pitch)). This makes it possible to provide a semiconductor device with improved design diversity.

Hereinafter, a method for fabricating a semiconductor device according to some example embodiments will be explained referring to FIGS. 8 to 10 and 24 to 38.

FIGS. 24 to 38 are intermediate step diagrams for explaining the method for fabricating the semiconductor device according to some example embodiments. For convenience of explanation, repeated parts of contents explained above using FIGS. 1 to 23 will be briefly explained or omitted.

Figure 24:
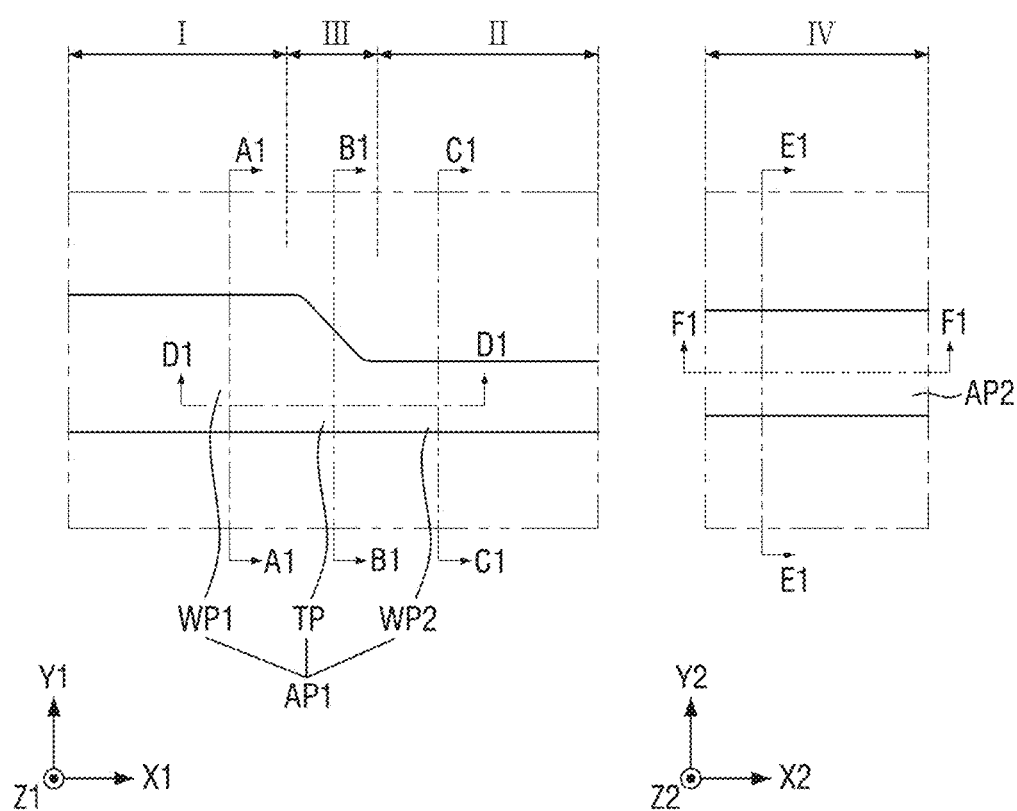
FIGS. 24 to 38 are intermediate step diagrams for explaining the method for fabricating the semiconductor device according to some example embodiments.
Figure 25:
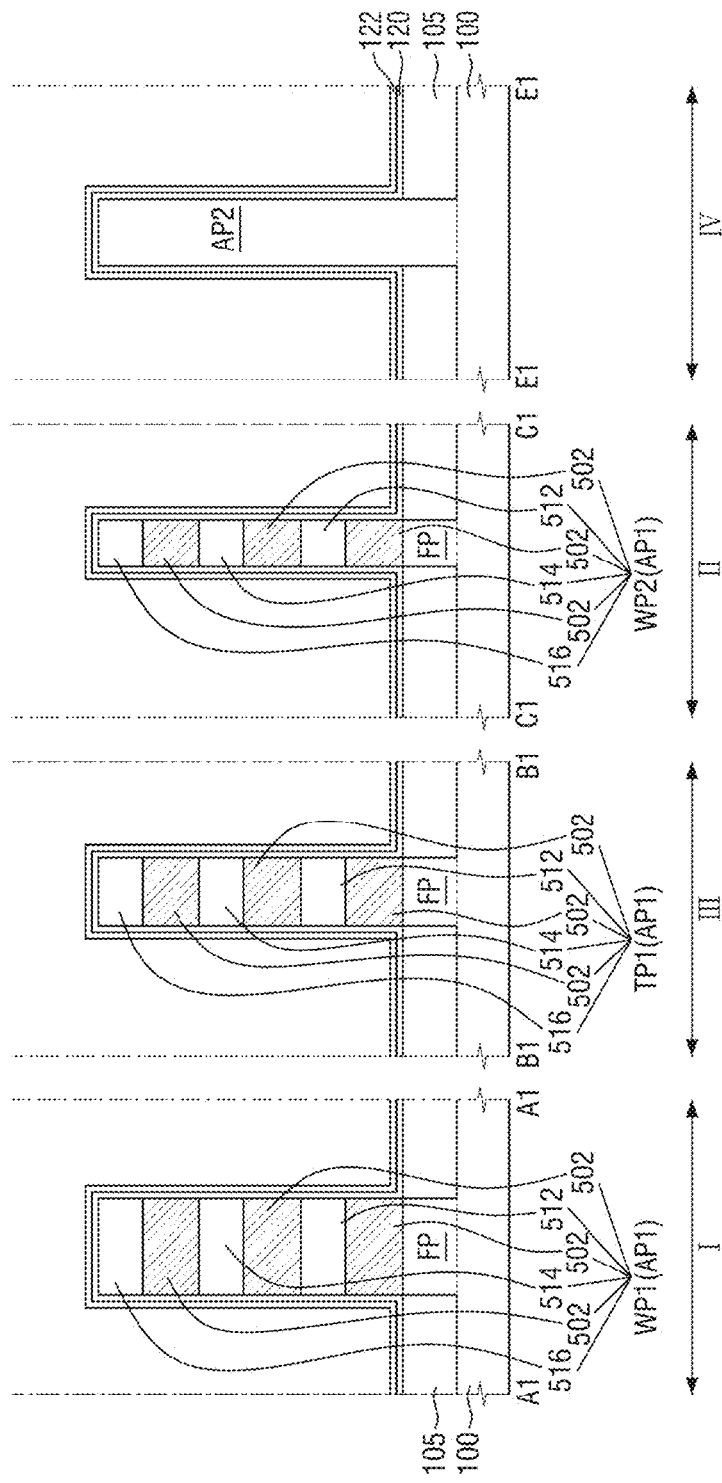
Figure 26:
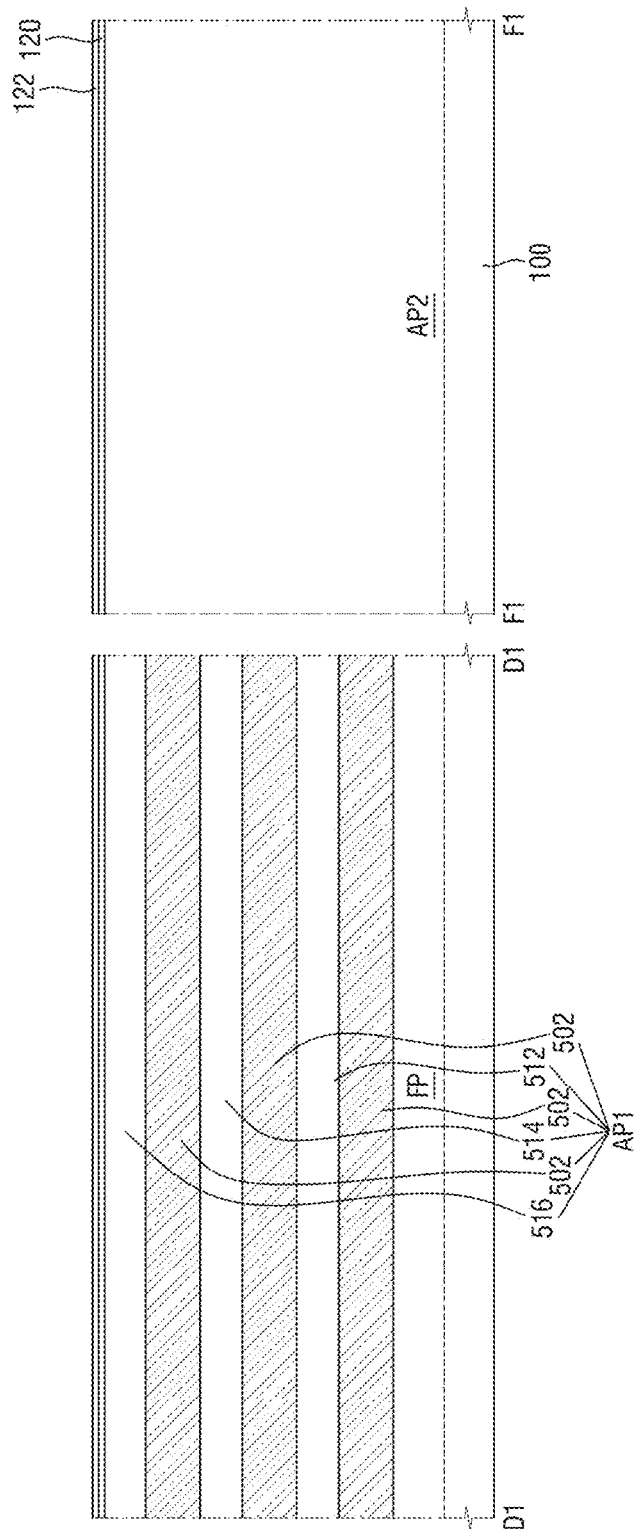

Referring to FIGS. 24 to 26, a first active pattern AP1 and a second active pattern AP2 are formed on the substrate 100.

The first active pattern AP1 may be formed on the substrate 100 of the first to third regions I, II and III. The first active pattern AP1 may protrude from the upper surface of the substrate 100 and extend in the first direction X1.

The first active pattern AP1 may include sacrificial films 502 and active films 512, 514 and 516 that are sequentially alternately stacked on the substrate 100. The sacrificial films 502 may have an etching selectivity for the active films 512, 514 and 516. For example, the active films 512, 514 and 516 may include a first semiconductor material, and the sacrificial film 502 may include a second semiconductor material different from the first semiconductor material. In some example embodiments, the first semiconductor material may include silicon (Si) and the second semiconductor material may include silicon germanium (SiGe).

The second active pattern AP2 may be formed on the substrate 100 of the fourth region IV. The second active pattern AP2 may protrude from the upper surface of the substrate 100 and extend in the fourth direction X2. The second active pattern AP2 may be formed by etching a part of the substrate 100, or may be an epitaxial layer that is grown from the substrate 100.

Subsequently, a field insulating film 105 is formed on the substrate 100. The field insulating film 105 may be formed to cover a part of the side surfaces of the first active pattern AP1 and a part of the side surfaces of the second active pattern AP2.

Subsequently, the first protective film 120 and the second protective film 122 are sequentially formed on the first active pattern AP1, the second active pattern AP2, and the field insulating film 105. The first protective film 120 and the second protective film 122 may be formed along the upper surface of the field insulating film 105, the side surfaces and the upper surface of the first active pattern AP1, and the side surfaces and the upper surface of the second active pattern AP2 in a conformal manner.

The first protective film 120 may include, for example, but is not limited to, at least one of silicon oxide, silicon oxynitride, silicon nitride, or a high dielectric constant material having a higher dielectric constant than silicon oxide.

The second protective film 122 may protect the first protective film 120 in a subsequent process step. The second protective film 122 may include, for example, but is not limited to, silicon oxide.

Figure 27:
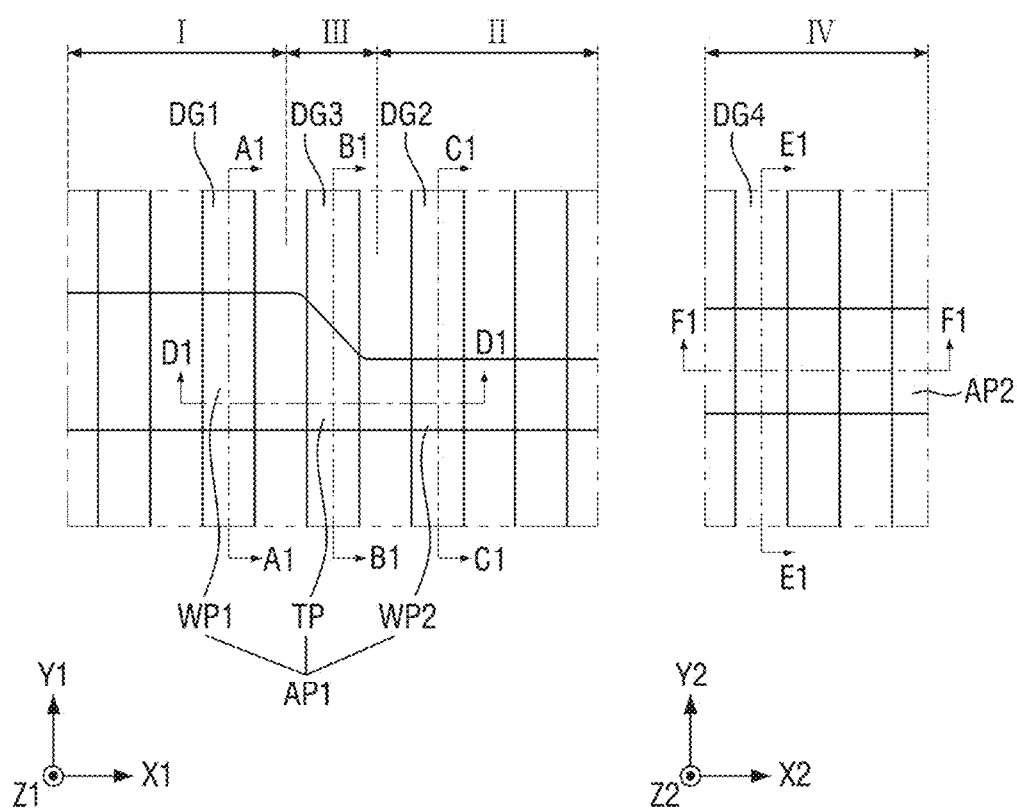
Figure 28:
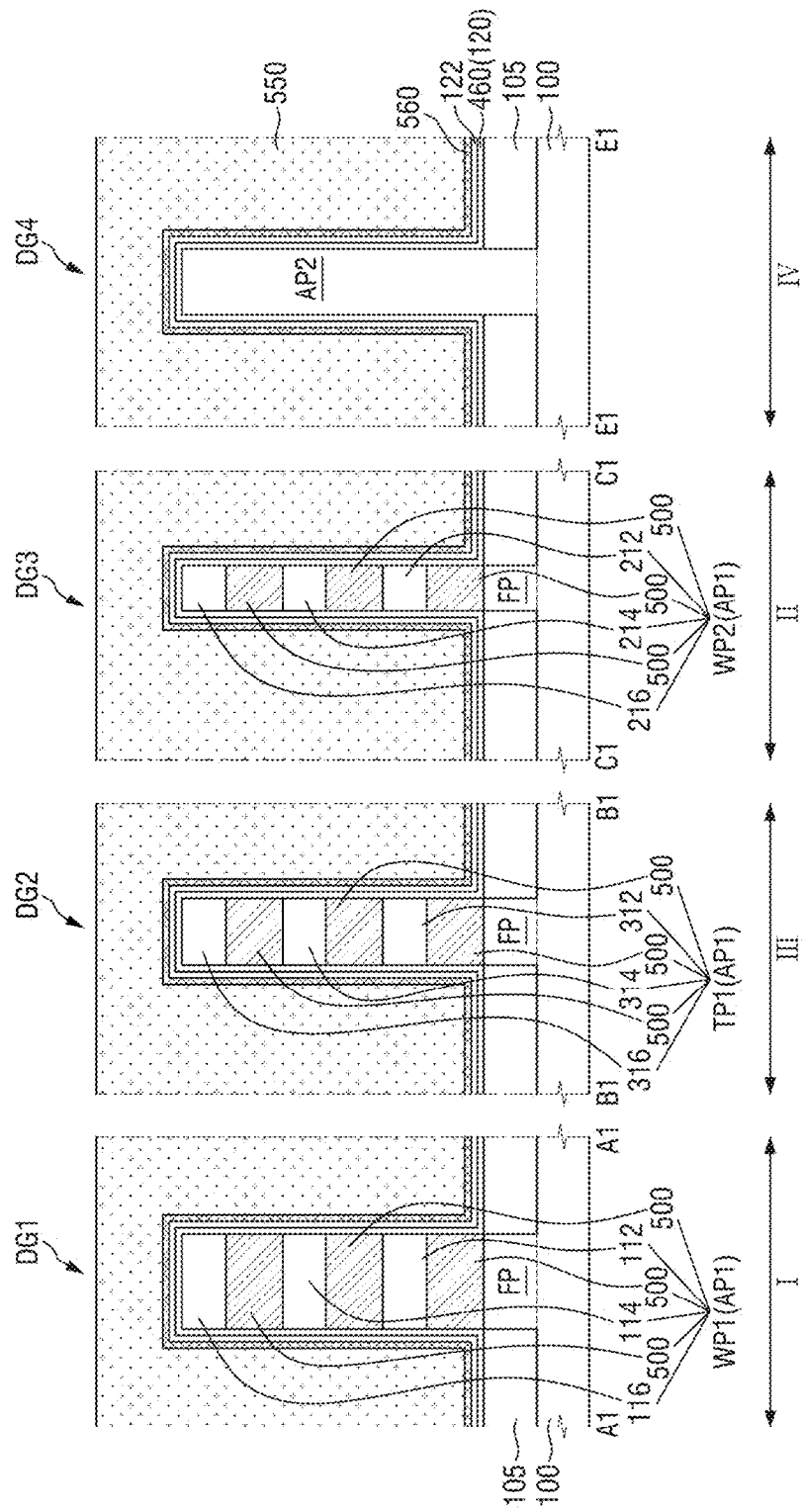
Figure 29:
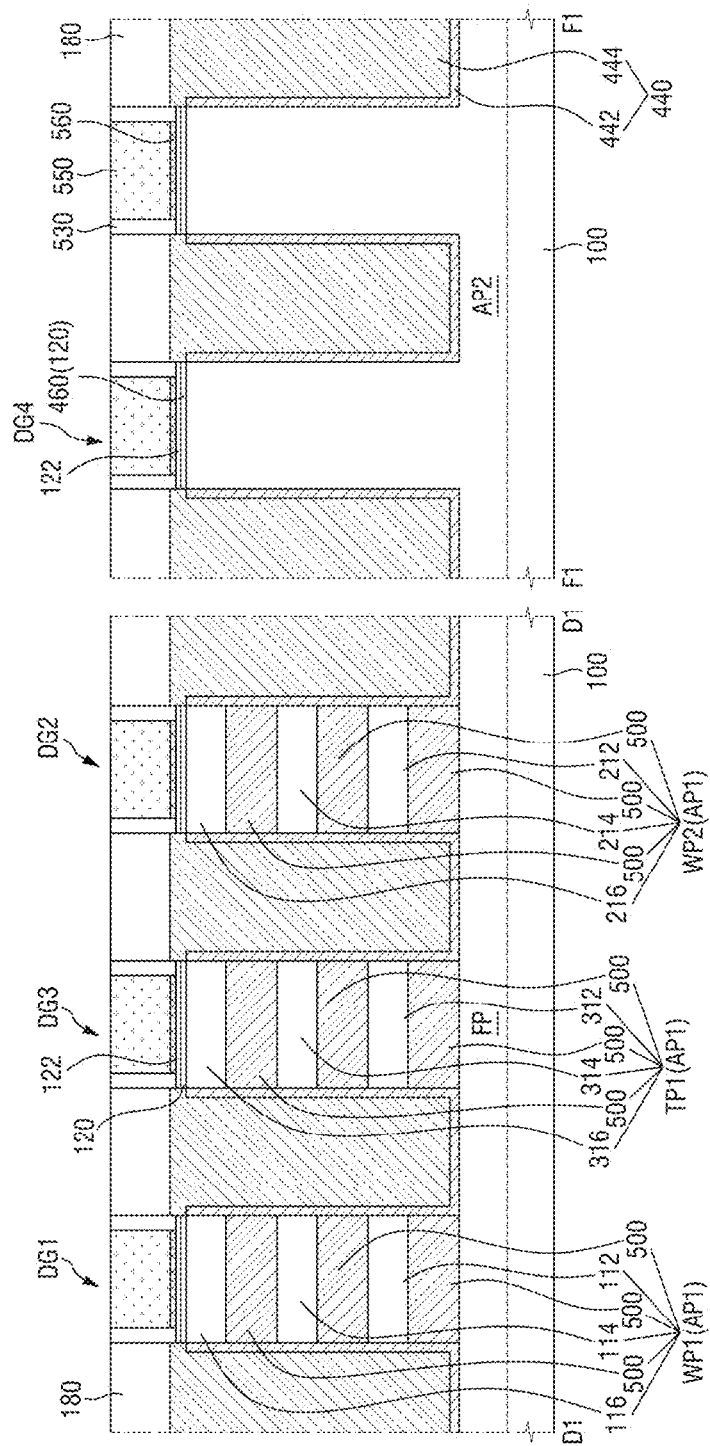

Referring to FIGS. 27 to 29, first to third dummy gate structures DG1, DG2 and DG3, a fourth dummy gate structure DG4, a first epitaxial pattern 140, a second epitaxial pattern DG1 440 and an interlayer insulating film 180 are formed.

The first to third dummy gate structures DG1, DG2 and DG3 may be formed on the substrate 100 and the field insulating film 105 of the first to third regions I, II and III. The first to third dummy gate structures DG1, DG2 and DG3 are spaced apart from each other and may intersect the first active pattern AP1. In some example embodiments, the first dummy gate structure DG1 may be placed on the first region I, the second dummy gate structure DG2 may be placed on the second region II, and the third dummy gate structure DG3 may be placed on the third region III.

The fourth dummy gate structure DG4 may be formed on the substrate 100 of the second region II. The fourth dummy gate structure DG4 may intersect the second active pattern AP2.

Subsequently, the first active pattern AP1 and the second active pattern AP2 are patterned, using the first to third dummy gate structures DG1, DG2 and DG3 and the fourth dummy gate structure DG4.

Accordingly, the first active pattern AP1 including the first wire pattern WP1, the second wire pattern WP2, and the transition pattern TP1 may be formed. The first wire pattern WP1 may include sacrificial patterns 500 and first semiconductor patterns 112, 114 and 116 that are stacked alternately. The second wire pattern WP2 may include sacrificial patterns 500 and second semiconductor patterns 212, 214 and 216 that are stacked alternately. The transition pattern TP1 may include sacrificial patterns 500 and third semiconductor patterns 312, 314 and 316 that are stacked alternately.

Subsequently, the first epitaxial pattern 140 is formed in the patterned first active pattern AP1. Therefore, the first epitaxial pattern 140 may be formed on the side surfaces of each of the first to third gate structures G1, G2 and G3. Also, a second epitaxial pattern 440 is formed in the patterned second active pattern AP2. Therefore, the second epitaxial pattern 440 may be formed on the side surfaces of the fourth gate structure G4.

Subsequently, an interlayer insulating film 180 is formed on the substrate 100 and the field insulating film 105. The interlayer insulating film 180 may be formed to fill the space on the first to third dummy gate structures DG1, DG2 and DG3, the fourth dummy gate structure DG4, the first epitaxial pattern 140, and the second epitaxial pattern 440.

Figure 30:
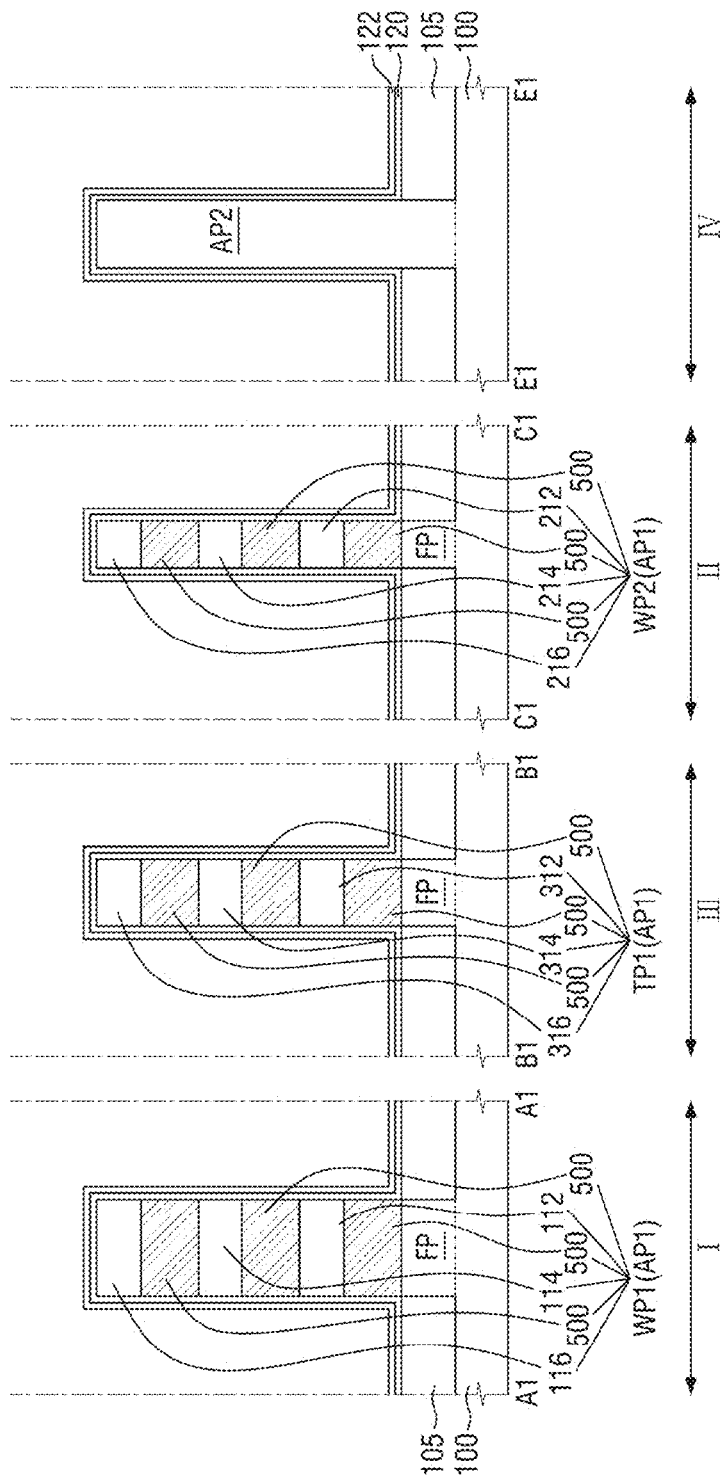
Figure 31:
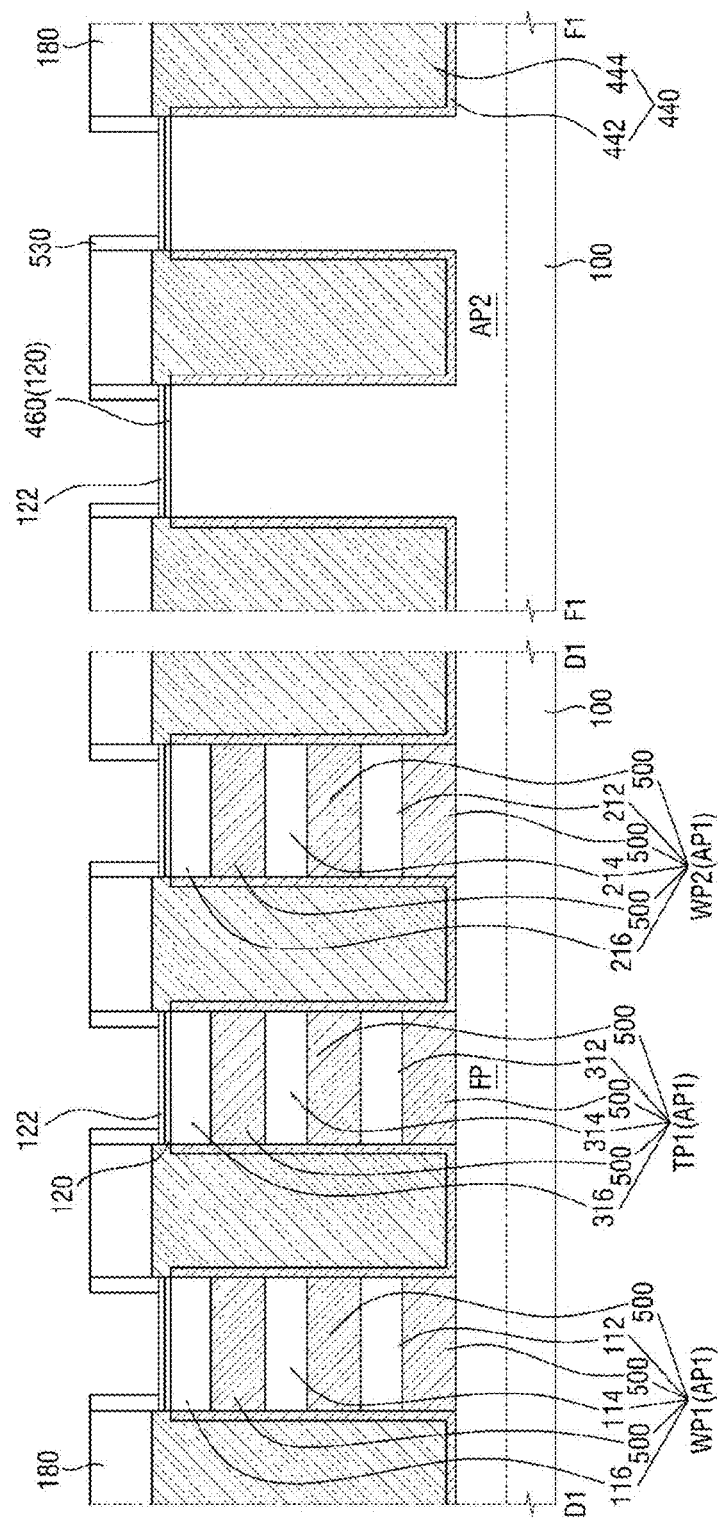

Referring to FIGS. 30 and 31, the first to third dummy gate structures DG1, DG2 and DG3 and the fourth dummy gate structure DG4 are removed.

Accordingly, the second protective film 122 may be exposed from the trench defined by the first to third gate spacers 130, 230 and 330.

Figure 32:
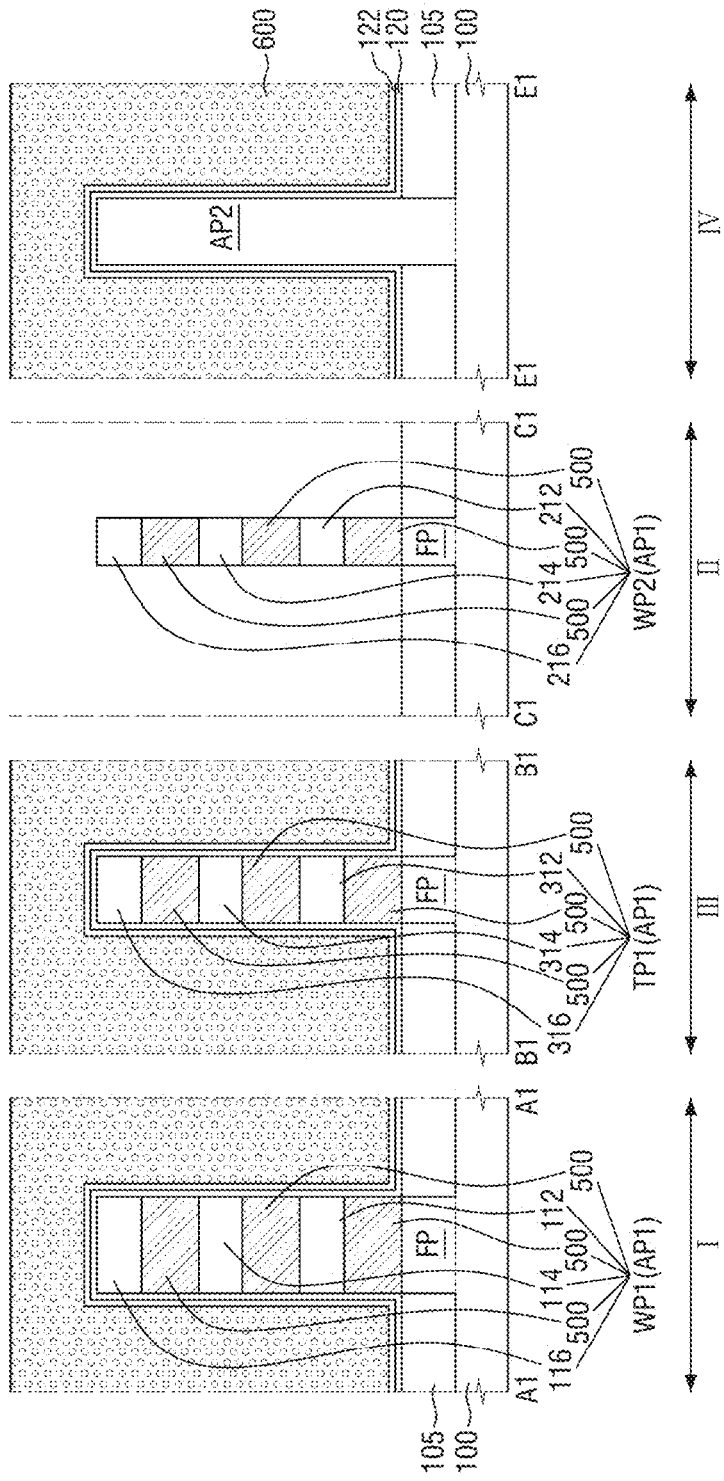

Referring to FIG. 32, the second wire pattern WP2 of the second region II is exposed.

For example, a first mask pattern 600 that covers the first region I, the third region III, and the fourth region IV and exposes the second region II may be formed. The first mask pattern 600 may include, but is not limited to, for example, a photoresist. Subsequently, the first protective film 120 and the second protective film 122 of the second region II may be removed by utilizing the first mask pattern 600. As a result, the sacrificial patterns 500 and the second semiconductor patterns 212, 214 and 216 of the second region II may be exposed.

Figure 33:
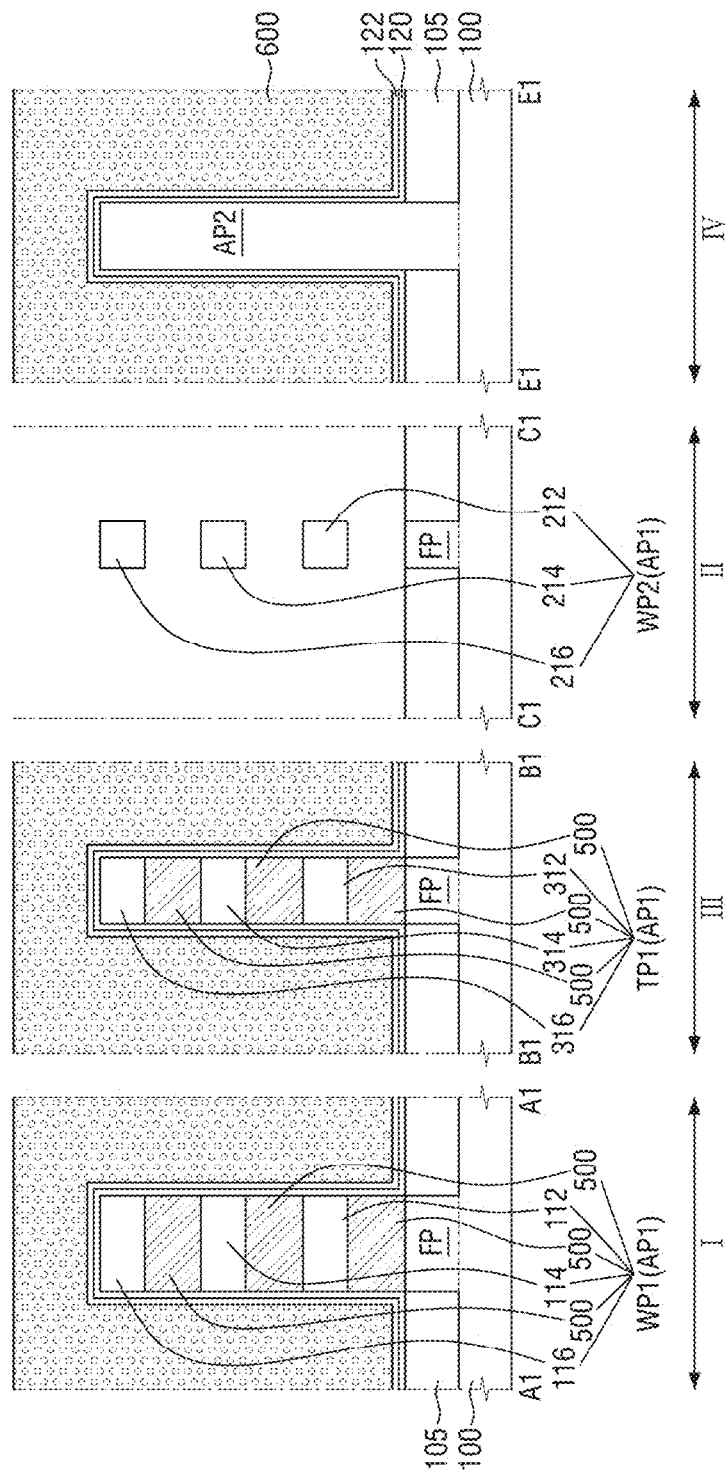

Referring to FIG. 33, the sacrificial patterns 500 of the second region II are selectively removed.

As explained above, since the sacrificial patterns 500 may have an etching selectivity for the second semiconductor patterns 212, 214 and 216, the sacrificial patterns 500 may be selectively removed. Accordingly, the second semiconductor patterns 212, 214 and 216 that are separated from each other in the second region II and extend in the first direction X1 may be formed. After the sacrificial patterns 500 of the second region II are removed, the first mask pattern 600 may be removed.

In the method for fabricating the semiconductor device according to some example embodiments, the sacrificial patterns 500 of the transition pattern TP1 may be protected while the sacrificial patterns 500 of the second region II are removed. Accordingly, even though the transition pattern TP1 includes the first inclined surface ST1, because damage to the first epitaxial pattern 140 adjacent to the transition pattern TP1 is prevented, a semiconductor device having improved performance, reliability and yield may be provided.

Figure 34:
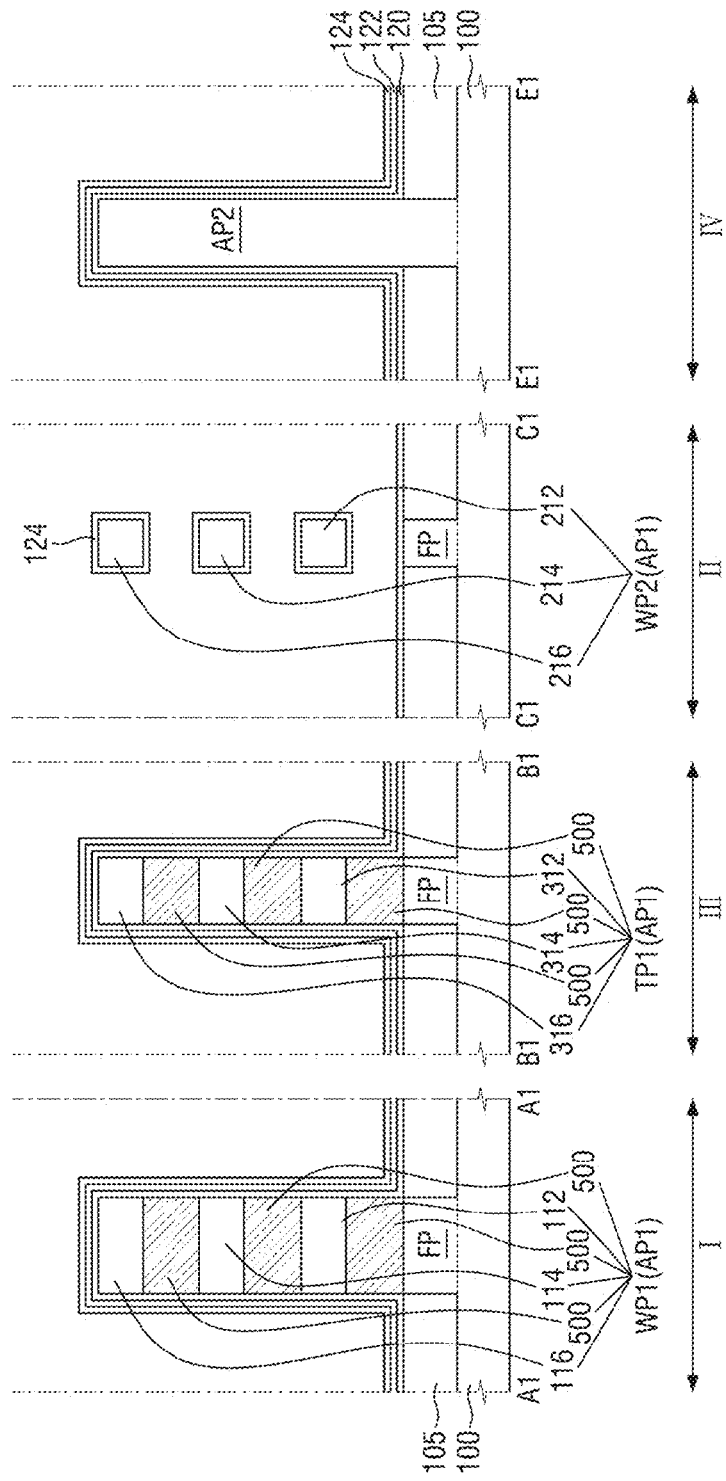

Referring to FIG. 34, a third protective film 124 is formed on the second region II.

The third protective film 124 may be formed along the upper surface of the field insulating film 105 and the periphery of the second semiconductor patterns 212, 214 and 216 in a conformal manner.

The third protective film 124 may protect the second semiconductor patterns 212, 214 and 216 in the subsequent process. The third protective film 124 may include, for example, but is not limited to, silicon oxide.

In some example embodiments, the third protective film 124 may be formed on the first to fourth regions I, II, III and IV. For example, the third protective film 124 may be formed on the second protective film 122.

Figure 35:
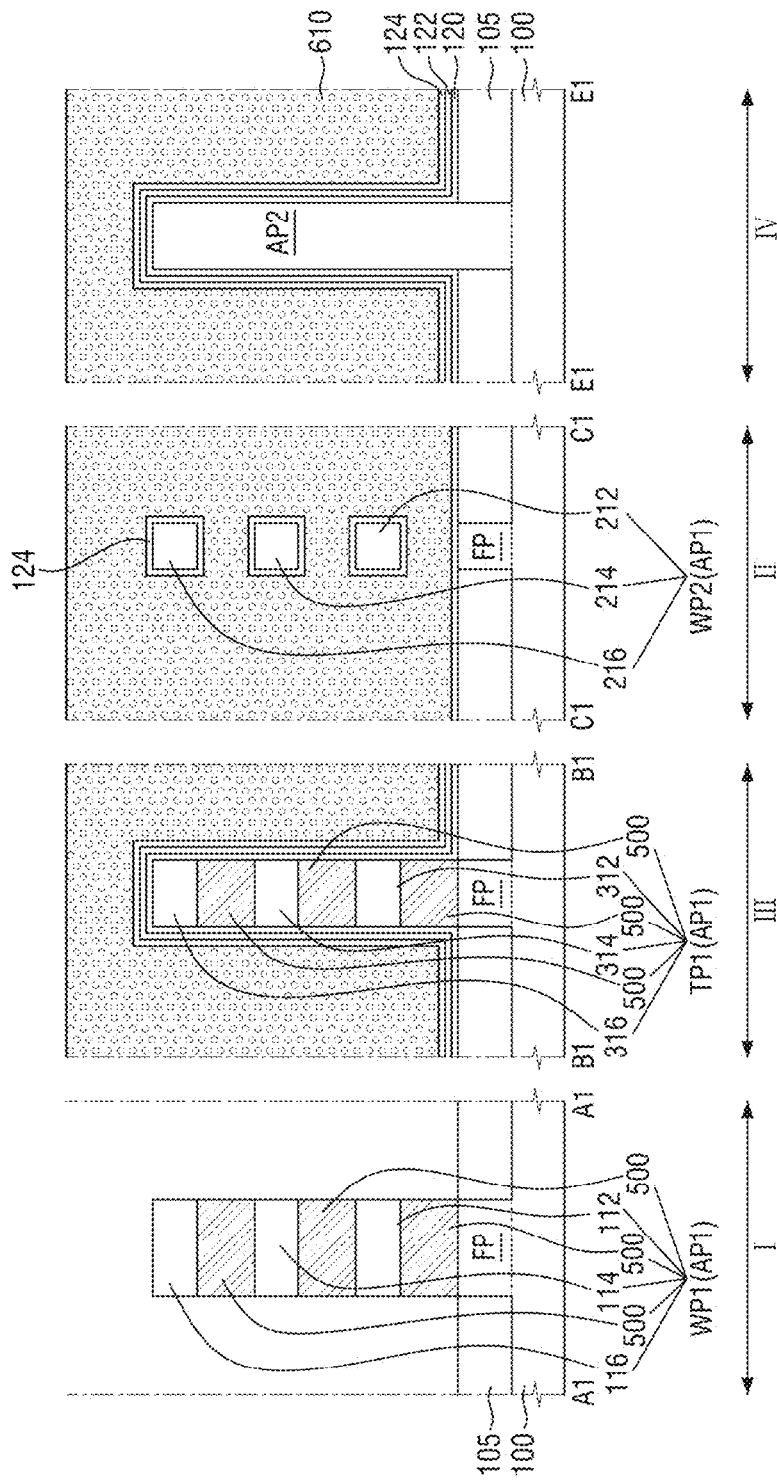

Referring to FIG. 35, the first wire pattern WP1 of the first region I is exposed.

For example, a second mask pattern 610 that covers the second region II, the third region III, and the fourth region IV and exposes the first region I may be formed. The second mask pattern 610 may include, but is not limited to, for example, a photoresist. Subsequently, the first protective film 120, the second protective film 122, and the third protective film 124 of the first region I may be removed, using the second mask pattern 610. Accordingly, the sacrificial patterns 500 and the first semiconductor patterns 112, 114 and 116 of the first region I may be exposed.

Figure 36:
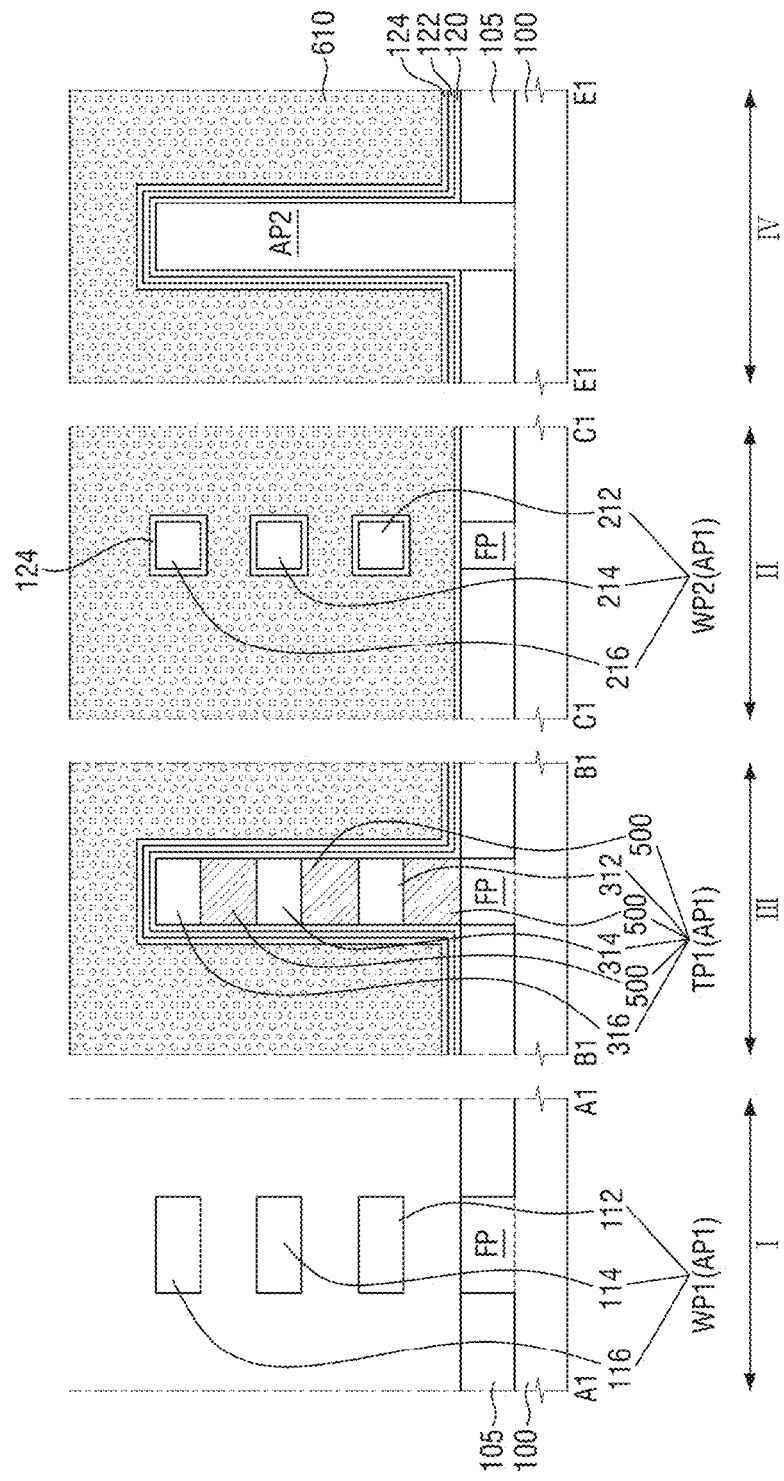

Referring to FIG. 36, the sacrificial patterns 500 of the first region I are selectively removed.

As explained above, since the sacrificial patterns 500 may have an etching selectivity for the first semiconductor patterns 112, 114 and 116, the sacrificial patterns 500 may be selectively removed. Accordingly, first semiconductor patterns 112, 114 and 116 that are separated from each other in the first region I and extend in the first direction X1 may be formed. After the sacrificial patterns 500 of the first region I are removed, the second mask pattern 610 may be removed.

In the method for fabricating the semiconductor device according to some example embodiments, the sacrificial patterns 500 of the transition pattern TP1 may be protected while the sacrificial patterns 500 of the first region I are removed. Accordingly, even though the transition pattern TP1 has the first inclined surface ST1, because damage to the first epitaxial pattern 140 adjacent to the transition pattern TP1 is prevented, a semiconductor device having improved performance, reliability and yield may be provided.

Figure 37:
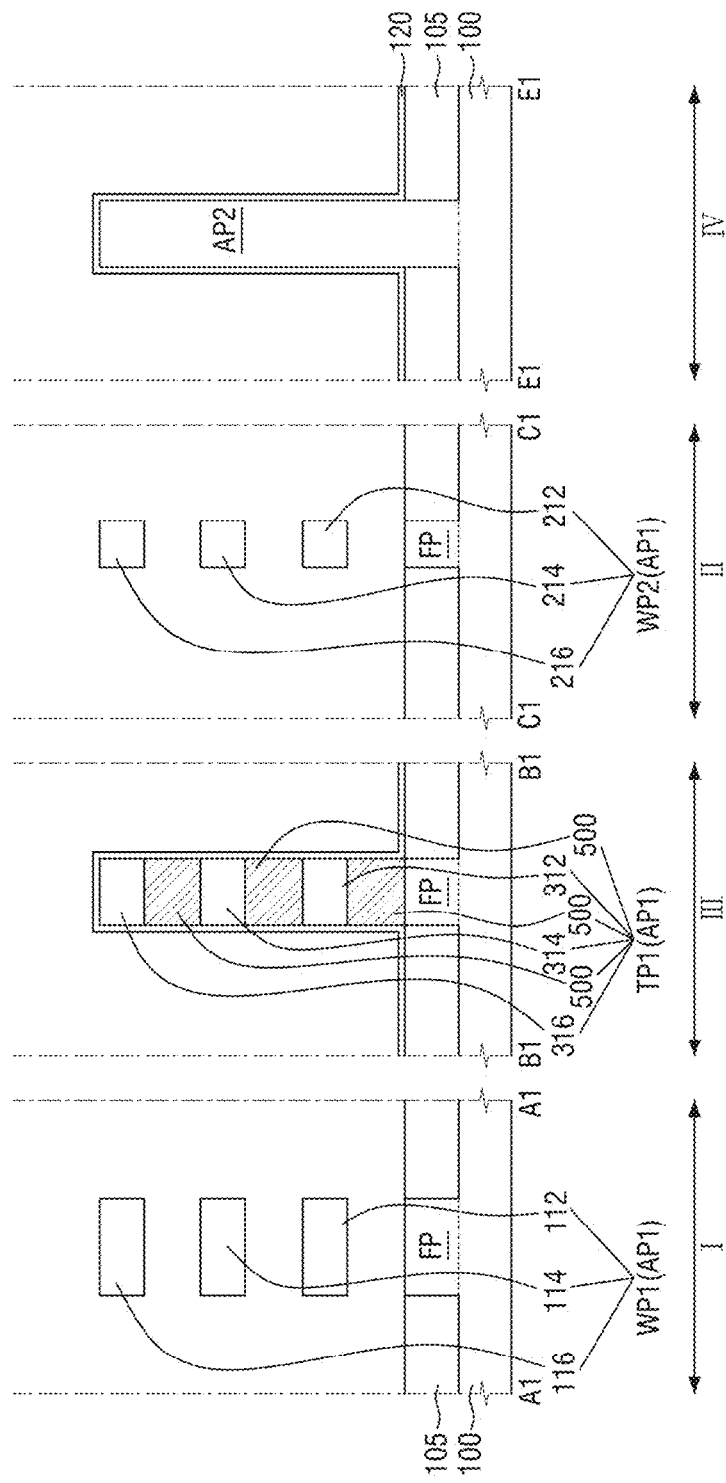
Figure 38:
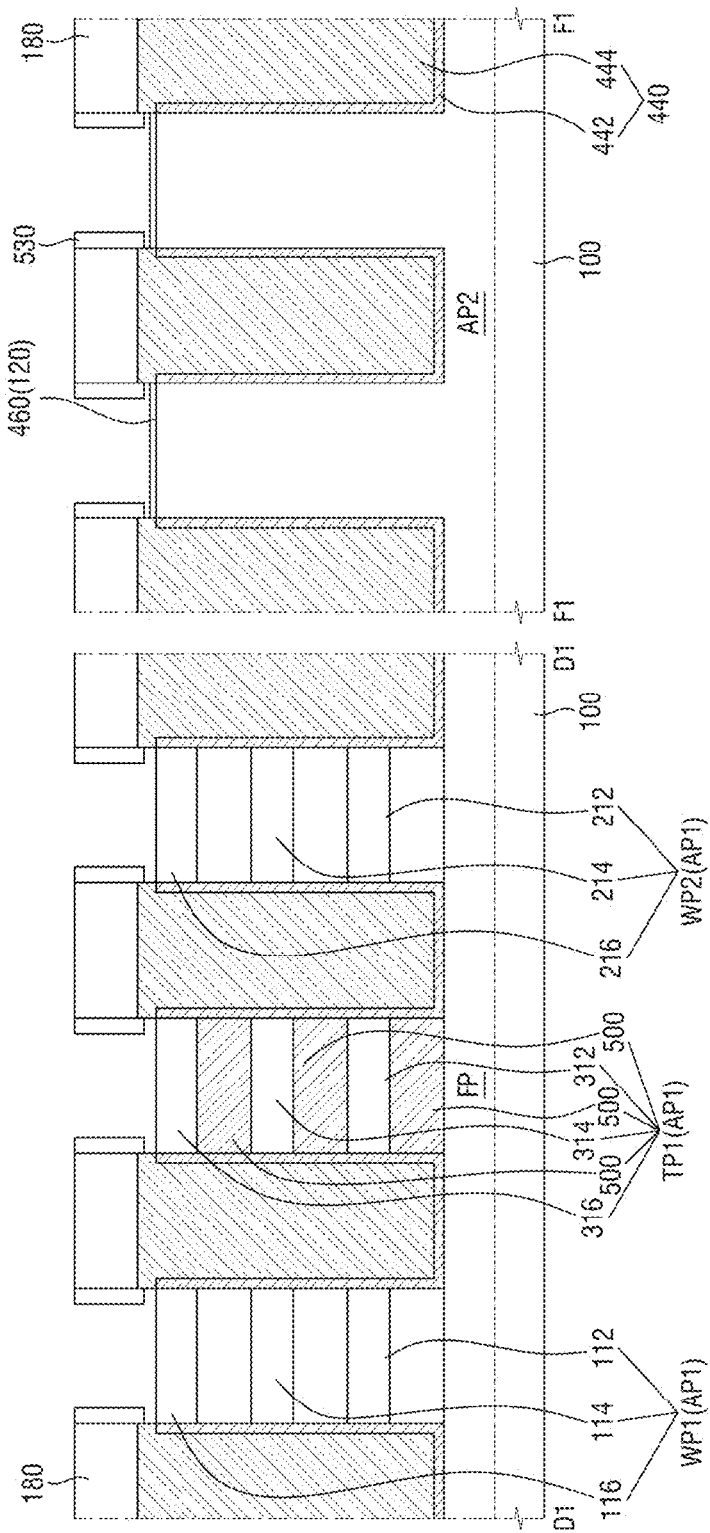

Referring to FIGS. 37 and 38, the second protective film 122 and the third protective film 124 are removed.

As a result, the first wire pattern WP1 and the second wire pattern WP2 may be exposed.

In some example embodiments, the first protective film 120 may not be removed. For example, the first protective film 120 may extend along both sides and upper surface of the transition pattern TP1 and both side surfaces and upper surface of the second active pattern AP2 in a conformal manner. However, the inventive concepts are not limited thereto, and the first protective film 120 may be removed together with the second protective film 122 and the third protective film 124.

In some example embodiments, the first protective film 120 on the second active pattern AP2 may form a fourth gate dielectric film 460.

Subsequently, referring to FIGS. 8 to 10, the first to third gate structures G1, G2 and G3 and the fourth gate structure G4 are formed.

The first to third gate structures G1, G2 and G3 may be formed on the substrate 100 of the first to third regions I, II and III, and the fourth gate structure G4 may be formed on the substrate 100 of the fourth region IV. For example, the first to third gate structures G1, G2 and G3 may replace the first to third dummy gate structures DG1, DG2 and DG3, and the fourth gate structure G4 may replace the fourth dummy gate structure DG4.

Hereinafter, a method for fabricating a semiconductor device according to some example embodiments will be explained referring to FIGS. 20 to 22 and 39 to 46.

FIGS. 39 to 46 are intermediate step diagrams for explaining a method for fabricating a semiconductor device according to some example embodiments. For convenience of explanation, repeated parts of contents explained above using FIGS. 1 to 38 will be briefly explained or omitted.

Figure 40:
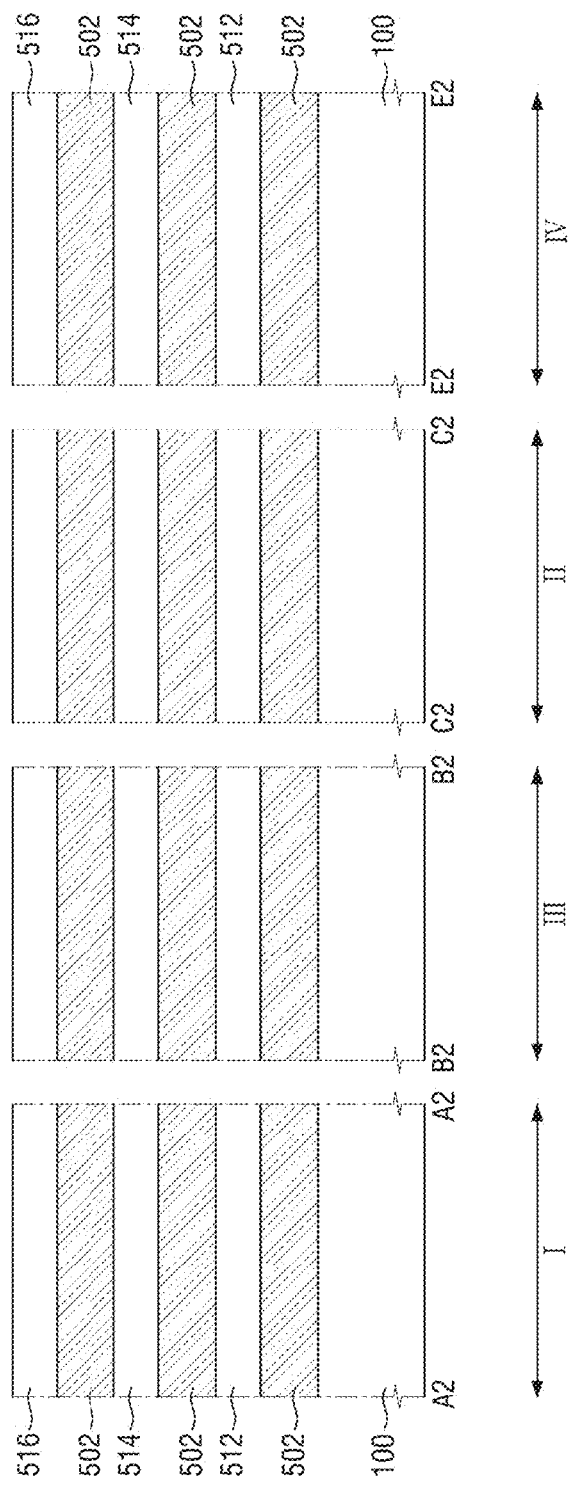

Referring to FIGS. 39 and 40, sacrificial films 502 and active films 512, 514 and 516 alternately stacked are formed on the substrate 100.

The sacrificial films 502 and the active films 512, 514 and 516 may be formed over the first to fourth regions I, II, III and IV. The sacrificial films 502 may have an etching selectivity for the active films 512, 514 and 516. For example, the active films 512, 514 and 516 may include a first semiconductor material, and the sacrificial films 502 may include a second semiconductor material different from the first semiconductor material. In some example embodiments, the first semiconductor material may include silicon (Si), and the second semiconductor material may include silicon germanium (SiGe).

Figure 41:
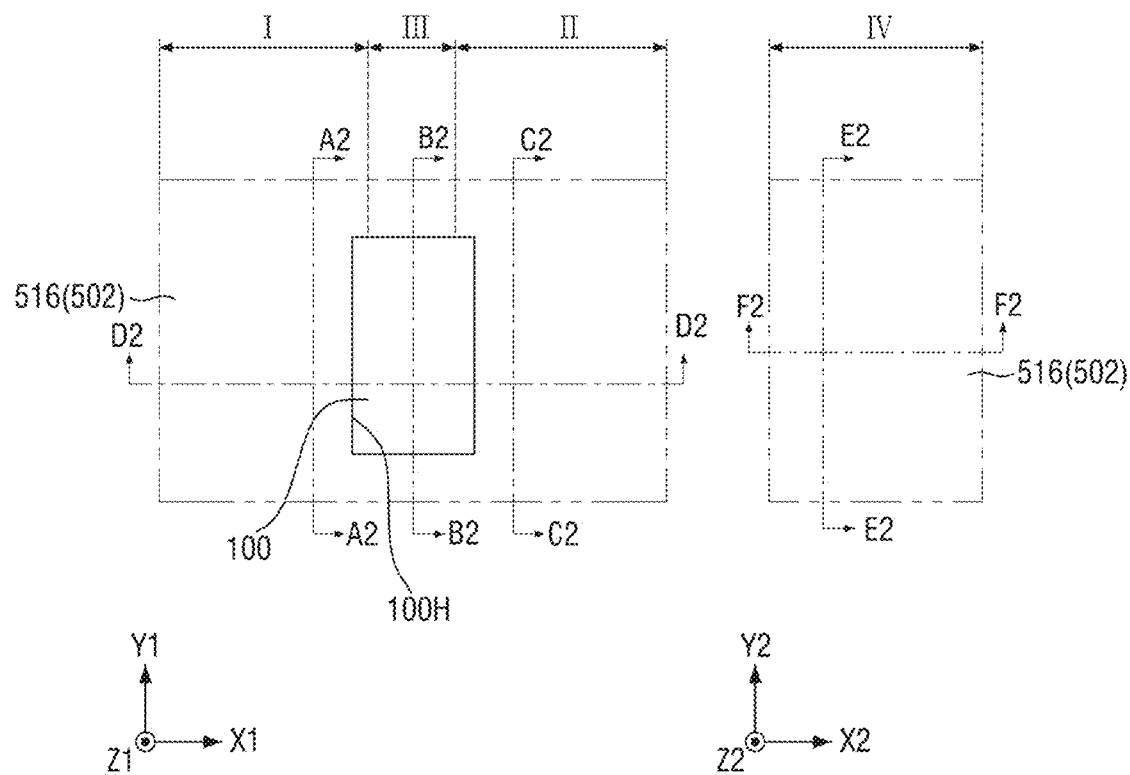
Figure 42:
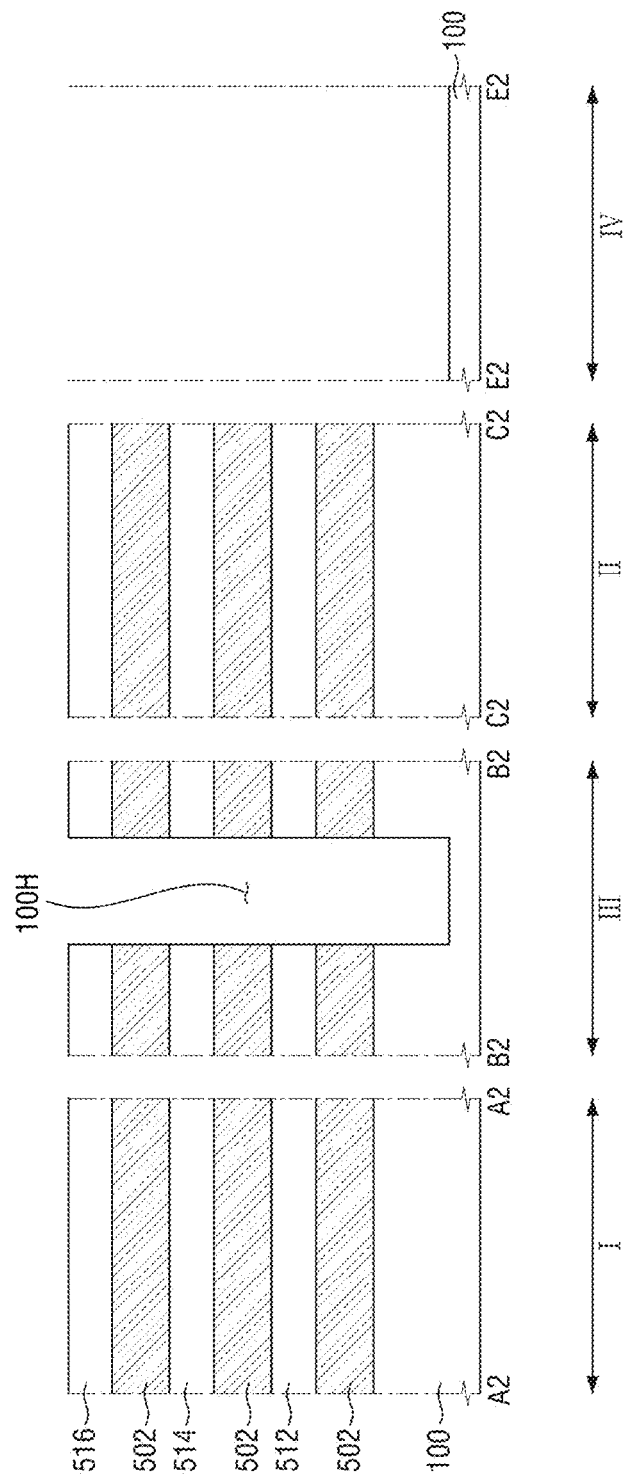

Referring to FIGS. 41 and 42, a transition trench 100H is formed in the third region III.

The transition trench 100H may be formed in the sacrificial films 502 and the active films 512, 514 and 516 of the third region III. In some example embodiments, the width of the transition trench 100H in the first direction X1 may be formed to be greater than the width of the third gate structure G3 formed in subsequent process steps. In some example embodiments, the width of the transition trench 100H in the second direction Y1 may be formed to be greater than the width (e.g., the third width W13) of the transition pattern TP1 formed in subsequent process steps. In some example embodiments, the lower surface of the transition trench 100H may be formed to be lower than the upper surface of the substrate 100.

In some example embodiments, the transition trench 100H may be performed together with a recess process of the fourth region IV. The sacrificial films 502 and the active films 512, 514 and 516 of the fourth region IV may be removed by the recess process.

In some example embodiments, the upper surface of the substrate 100 may be lowered by the recess process. For example, the upper surface of the substrate 100 of the fourth region IV may be placed on the same plane as the lower surface of the transition trench 100H.

Figure 43:
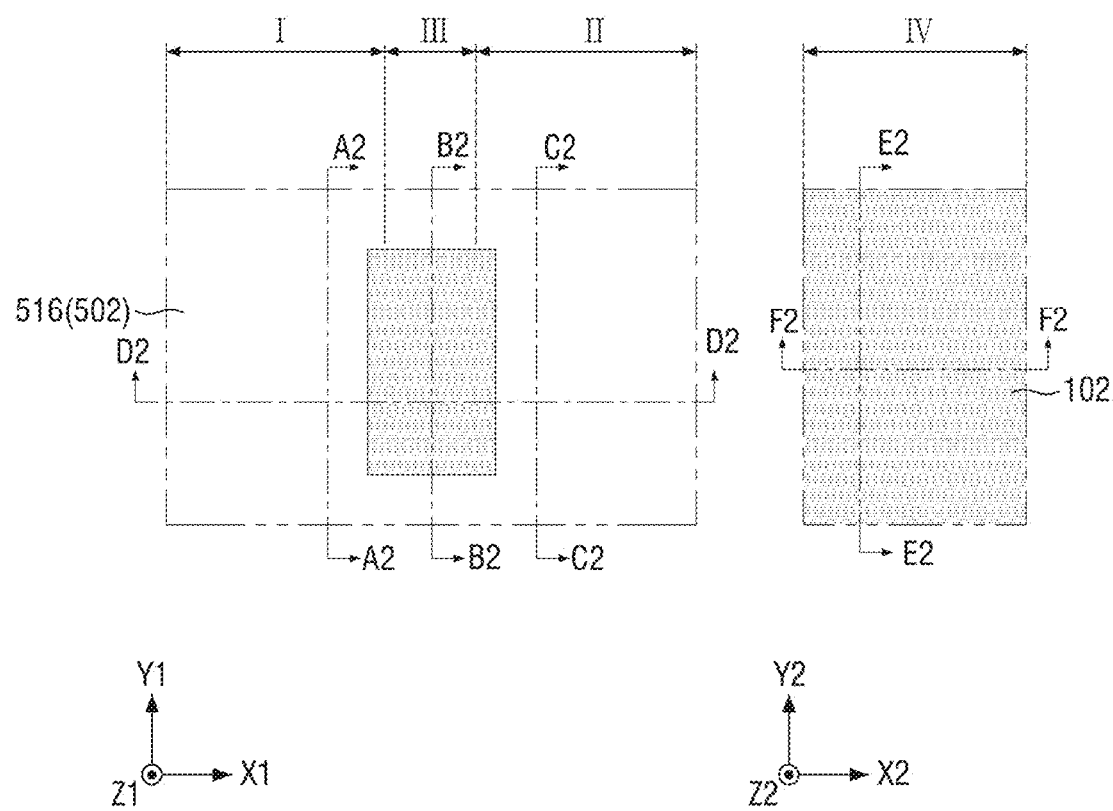
Figure 44:
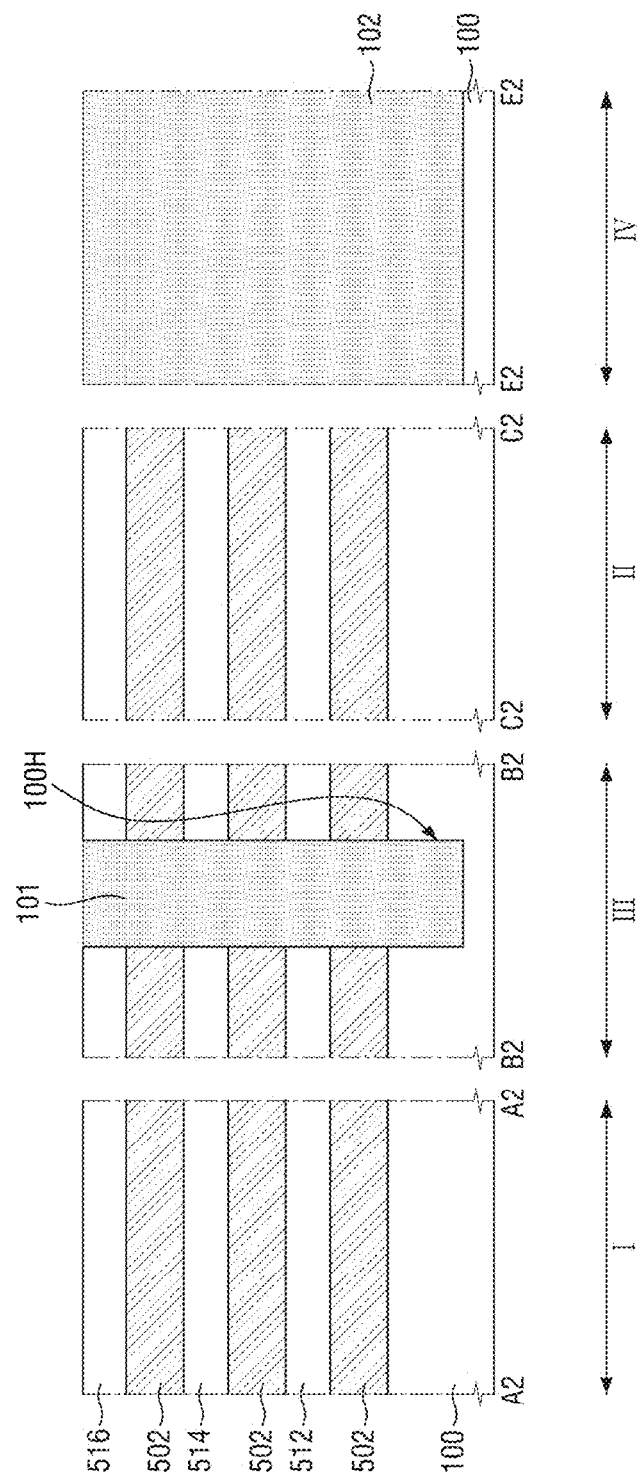
Figure 45:
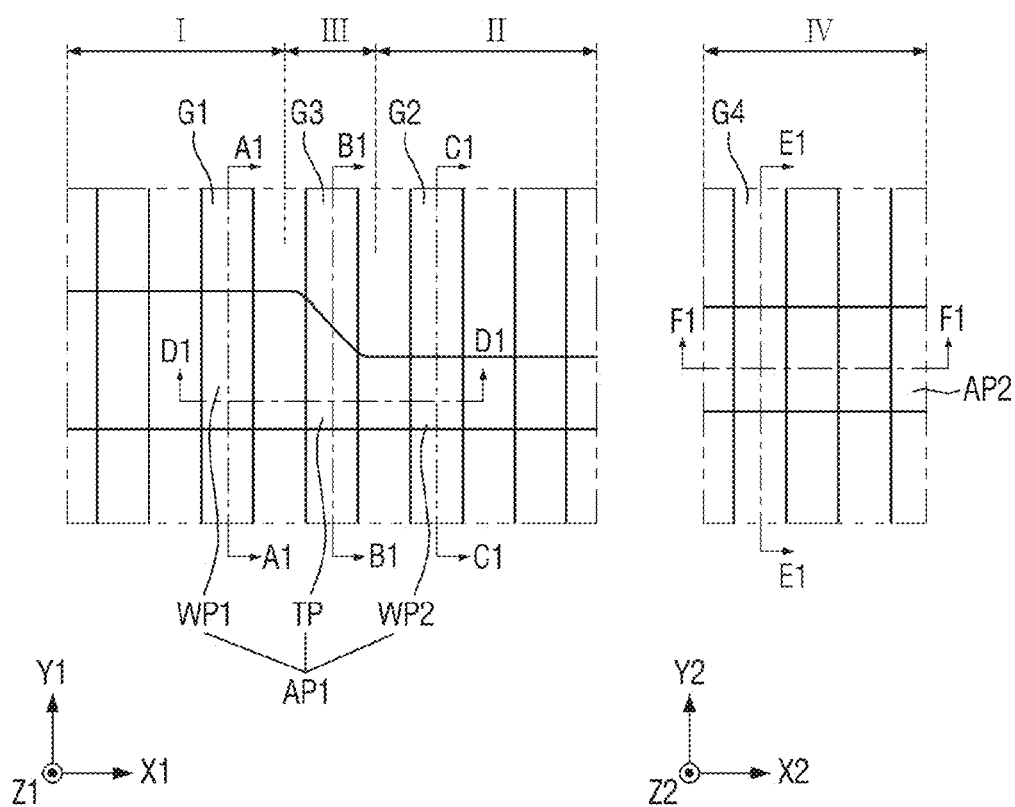
Figure 46:
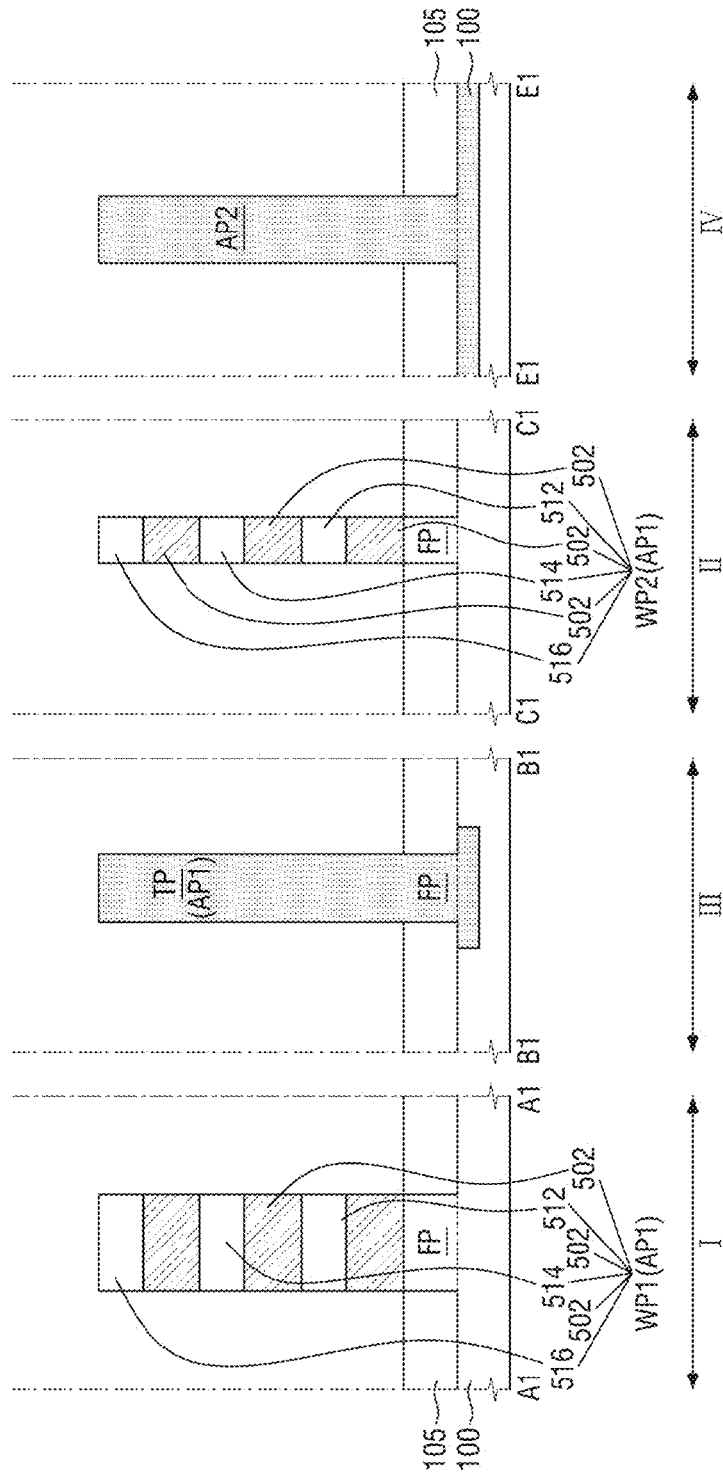

Referring to FIGS. 43 and 44, a first semiconductor film 101 is formed in the transition trench 100H.

The first semiconductor film 101 may be a single material layer. For example, the first semiconductor film 101 may be a single material layer that fills the transition trench 100H. In some example embodiments, the first semiconductor film 101 may be formed by an epitaxial growth method from the substrate 100, the sacrificial films 502 and the active films 512, 514 and 516 of the third region III.

The first semiconductor film 101 may include a material different from the sacrificial films 502. For example, the first semiconductor film 101 may include a third semiconductor material, and the sacrificial films 502 may include a second semiconductor material different from the third semiconductor material. In some example embodiments, the third semiconductor material may include silicon (Si), and the second semiconductor material may include silicon germanium (SiGe). Accordingly, the sacrificial patterns 500 may have an etching selectivity for the transition pattern TP1.

In some example embodiments, the first semiconductor film 101 may be formed together with the second semiconductor film 102. The second semiconductor film 102 may be a single material layer. For example, the second semiconductor film 102 may be a single material layer formed on the substrate 100 of the fourth region IV. In some example embodiments, the second semiconductor film 102 may be formed from the substrate 100 of the fourth region IV by an epitaxial growth method. The second semiconductor film 102 may include, for example, the third semiconductor material.

Subsequently, referring to FIGS. 20 to 22, the sacrificial films 502, the active films 512, 514 and 516, the first semiconductor film 101, and the second semiconductor film 102 are patterned.

Accordingly, the first active pattern AP1 including the first wire pattern WP1, the second wire pattern WP2, and the transition pattern TP1 may be formed on the first to third regions I, II and III. Also, the transition pattern TP1 may be a single material layer. For example, the transition pattern TP1 may include the third semiconductor material.

Also, a second active pattern AP2 may be formed on the fourth region IV. The second active pattern AP2 may be a single material layer. For example, the second active pattern AP2 may include the third semiconductor material.

Subsequently, the first to third gate structures G1, G2 and G3, the fourth gate structure G4, the first epitaxial pattern 140, the second epitaxial pattern 440 and the interlayer insulating film 180 are formed. Since formation of the first to third gate structures G1, G2 and G3, the fourth gate structure G4, the first epitaxial pattern 140, the second epitaxial pattern 440 and the interlayer insulating film 180 is similar to that explained above using FIGS. 8 to 10 and 24 to 38, detailed explanation thereof will not be provided below.

In the method for fabricating the semiconductor device according to some example embodiments, since the transition pattern TP1 includes a single material layer having etching selectivity different from the sacrificial patterns 500, the transition pattern TP1 may be protected, while the sacrificial patterns 500 of the first region I and the second region II are removed. Accordingly, even though the transition pattern TP1 has a first inclined surface ST1, because damage to the first epitaxial pattern 140 adjacent to the transition pattern TP1 is prevented, a semiconductor device having improved performance, reliability and yield may be provided.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate including a first region and a second region arranged along a first direction, and a third region between the first region and the second region;
   an active pattern extending in the first direction, on the substrate;
   first to third gate electrodes spaced apart from each other and each extending in a second direction intersecting the first direction, on the active pattern; and epitaxial patterns disposed between the first and third gate electrodes and between the second and the third gate electrodes, wherein the active pattern of the first region includes a plurality of first semiconductor patterns spaced apart from each other and penetrating the first gate electrode, the active pattern of the second region includes a plurality of second semiconductor patterns spaced apart from each other and penetrating the second gate electrode, the active pattern of the third region includes a transition pattern protruding from the substrate and intersecting the third gate electrode, wherein the transition pattern includes a sacrificial pattern and a third semiconductor pattern alternately stacked on the third region and including different materials from each other, and wherein the epitaxial patterns are in direct contact with the sacrificial pattern and the third semiconductor pattern.

2. The semiconductor device of claim 1, wherein the plurality of first semiconductor patterns, the plurality of second semiconductor patterns, and the third semiconductor pattern include a first semiconductor material, and the sacrificial pattern includes a second semiconductor material different from the first semiconductor material.

3. The semiconductor device of claim 2, wherein the first semiconductor material includes silicon (Si), and the second semiconductor material includes silicon germanium (SiGe).

4. The semiconductor device of claim 1, wherein the plurality of first semiconductor patterns, the plurality of second semiconductor patterns, and the third semiconductor pattern overlap each other in the first direction.

5. The semiconductor device of claim 1, wherein each of the plurality of first semiconductor patterns has a first width in the second direction, and each of the plurality of second semiconductor patterns has a second width smaller than the first width in the second direction.

6. The semiconductor device of claim 5, wherein the third semiconductor pattern has a third width in the second direction, and the third width gradually decreases from the plurality of first semiconductor patterns to the plurality of second semiconductor pattern, the third width decreasing along an intersection with the third gate electrode.

7. The semiconductor device of claim 1, further comprising:

a field insulating film covering a part of side surfaces of the active pattern, on the substrate, a height of an upper surface of the field insulating film of the third region being larger than a height of the upper surface of the field insulating film of the first region and the second region.

8. The semiconductor device of claim 1, further comprising:

a protective film interposed between the transition pattern and the third gate electrode, and not interposed between the plurality of first semiconductor patterns and the first gate electrode, and between the plurality of second semiconductor patterns and the second gate electrode.

9. The semiconductor device of claim 8, wherein the protective film extends along side surfaces and an upper surface of the transition pattern in a conformal manner.

10. A semiconductor device comprising:

a substrate including a first region and a second region arranged along a first direction, and a third region between the first region and the second region;

an active pattern extending in the first direction on the substrate; and first to third gate structures spaced apart from each other and extending in a second direction intersecting the first direction, on the active pattern;

epitaxial patterns disposed between the first and third gate structures and between the second and the third gate structures, and wherein the active pattern of the first region includes a first wire pattern spaced apart from the substrate and penetrating the first gate structure, the active pattern of the second region includes a second wire pattern spaced apart from the substrate and penetrating the second gate structure, the active pattern of the third region includes a transition pattern including an inclined surface which forms an acute angle with side surfaces of the third gate structure and protrudes from the substrate, wherein the epitaxial patterns are in direct contact with surfaces of the transition pattern facing the first direction, and the third gate structure surrounds side surfaces and an upper surface of the transition pattern.

11. The semiconductor device of claim 10, wherein the transition pattern includes a sacrificial pattern and a third wire pattern sequentially stacked on the third region and including different materials from each other.

12. The semiconductor device of claim 11, wherein the first wire pattern, the second wire pattern and the third wire pattern include a first semiconductor material, and the sacrificial pattern includes a second semiconductor material different from the first semiconductor material.

13. The semiconductor device of claim 10, wherein the transition pattern is a single material layer including a semiconductor material.

14. The semiconductor device of claim 13, wherein the first wire pattern, the second wire pattern, and the single material layer include silicon (Si).

15. A semiconductor device comprising:

a substrate including a first region and a second region arranged along a first direction, and a third region between the first region and the second region;

a first active pattern extending in the first direction on the substrate;

a field insulating film covering a part of side surfaces of the first active pattern, on the substrate;

first to third gate electrodes spaced apart from each other and extending in a second direction intersecting the first direction, on the first active pattern and the field insulating film; and epitaxial patterns between the first and third gate electrodes and between the second and the third gate electrodes, wherein the first active pattern of the first region includes a first wire pattern spaced from the substrate, penetrating the first gate electrode, and having a first width in the second direction, the first active pattern of the second region includes a second wire pattern spaced apart from the substrate, penetrating the second gate electrode, and having a second width smaller than the first width in the second direction, the first active pattern of the third region includes a transition pattern protruding from the substrate, intersecting the third gate electrode, and having a third width smaller than the first width and greater than the second width in the second direction, wherein the transition pattern includes a sacrificial pattern and a third wire pattern sequentially stacked on the third region and including different materials from each other, the epitaxial patterns are in direct contact with the sacrificial pattern and the third wire pattern, and a height of an upper surface of the field insulating film of the third region is greater than a height of an upper surface of the field insulating film of the first region and the second region.

16. The semiconductor device of claim 15, wherein the first wire pattern, the second wire pattern, and the third wire pattern are arranged at the same level.

17. The semiconductor device of claim 15, wherein the substrate further comprises a fourth region spaced apart from the first to third regions, and the semiconductor device further comprises:
a second active pattern protruding from the substrate and extending in a third direction, on the fourth region; and
a fourth gate electrode extending in a fourth direction intersecting the third direction, on the second active pattern.

18. The semiconductor device of claim 17, further comprising:
a protective film interposed between the transition pattern and the third gate electrode; and
a gate dielectric film interposed between the second active pattern and the fourth gate electrode,
the protective film and the gate dielectric film being formed at the same level.

19. The semiconductor device of claim 18, wherein the protective film extends along side surfaces and an upper surface of the transition pattern in a conformal manner, and
the gate dielectric film extends along side surfaces and an upper surface of the second active pattern in a conformal manner.

20. The semiconductor device of claim 1, wherein the first to third gate electrodes including a metal, a metal compound, or a combination thereof.

* * * * *